(12) United States Patent
Tsai et al.

(10) Patent No.: US 12,224,352 B2
(45) Date of Patent: Feb. 11, 2025

(54) TRANSISTOR INCLUDING AN ACTIVE REGION AND METHODS FOR FORMING THE SAME

(71) Applicant: Taiwan Semiconductor Manufacturing Company Limited, Hsinchu (TW)

(72) Inventors: Wu-Wei Tsai, Hsinchu (TW); Hai-Ching Chen, Hsinchu (TW); Po-Ting Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 680 days.

(21) Appl. No.: 17/479,844

(22) Filed: Sep. 20, 2021

(65) Prior Publication Data

US 2022/0344510 A1  Oct. 27, 2022

Related U.S. Application Data

(60) Provisional application No. 63/178,128, filed on Apr. 22, 2021.

(51) Int. Cl.
*H01L 29/66* (2006.01)
*H01L 29/423* (2006.01)
*H01L 29/786* (2006.01)

(52) U.S. Cl.
CPC .... *H01L 29/7869* (2013.01); *H01L 29/42356* (2013.01); *H01L 29/66969* (2013.01); *H01L 29/78648* (2013.01)

(58) Field of Classification Search
CPC ........... H01L 29/7869; H01L 29/42356; H01L 29/66969; H01L 29/78648
See application file for complete search history.

(56) References Cited

U.S. PATENT DOCUMENTS

| 6,630,687 | B1* | 10/2003 | Koyama ............. G02F 1/13454 398/132 |
| 6,639,244 | B1* | 10/2003 | Yamazaki ........... H01L 27/1255 257/70 |
| 9,419,146 | B2* | 8/2016 | Yamazaki ......... H01L 29/66969 |
| 10,381,220 | B2* | 8/2019 | Benwadih ......... H01L 21/02422 |
| 2014/0154837 | A1* | 6/2014 | Yamazaki ......... H01L 29/78618 438/104 |
| 2015/0097181 | A1* | 4/2015 | Yamazaki ......... H01L 29/78648 257/43 |

(Continued)

*Primary Examiner* — Eugene Lee
(74) *Attorney, Agent, or Firm* — The Marbury Law Group, PLLC

(57) ABSTRACT

A thin film transistor includes a stack of an active layer, a gate dielectric, and a gate electrode in a forward or in a reverse order. The active layer includes a compound semiconductor material containing oxygen, at least one acceptor-type element selected from Ga and W, and at least one heavy post-transition metal element selected from In and Sn. An atomic percentage of the at least one heavy post-transition metal element at a first surface portion of the active layer that contacts the gate dielectric is higher than an atomic percentage of the at least one heavy post-transition metal element at a second surface portion of the active layer located on an opposite side of the gate dielectric. The front channel current may be increased, and the back channel leakage current may be decreased.

20 Claims, 43 Drawing Sheets

(56) References Cited

U.S. PATENT DOCUMENTS

| | | | |
|---|---|---|---|
| 2015/0221507 A1* | 8/2015 | Won | C23C 16/5096 |
| | | | 438/104 |
| 2015/0243738 A1* | 8/2015 | Shimomura | C01G 15/006 |
| | | | 252/519.1 |
| 2018/0331196 A1* | 11/2018 | Sone | H01L 29/7869 |
| 2019/0140101 A1* | 5/2019 | Im | H01L 21/02483 |
| 2021/0091233 A1* | 3/2021 | Yang | H01L 29/6675 |
| 2021/0151606 A1* | 5/2021 | Xu | H01L 21/02554 |

* cited by examiner

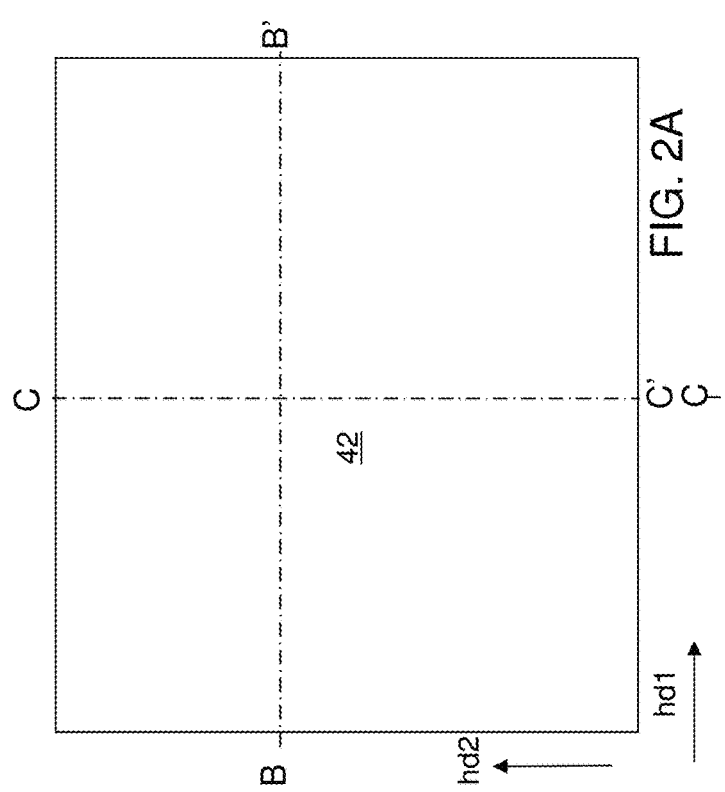
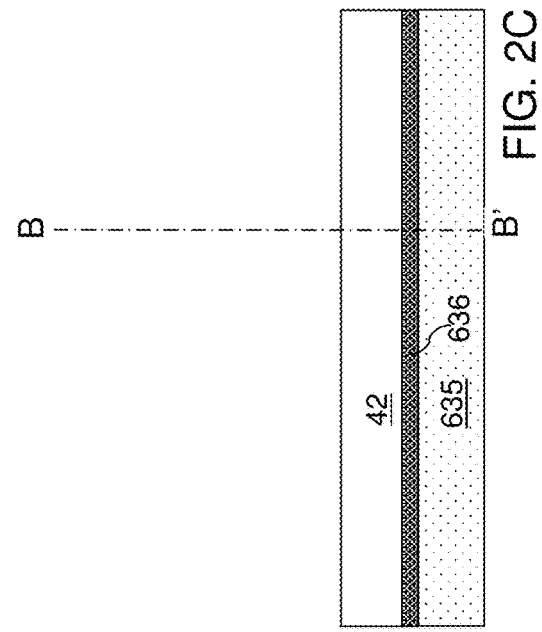
FIG. 2A
FIG. 2B
FIG. 2C

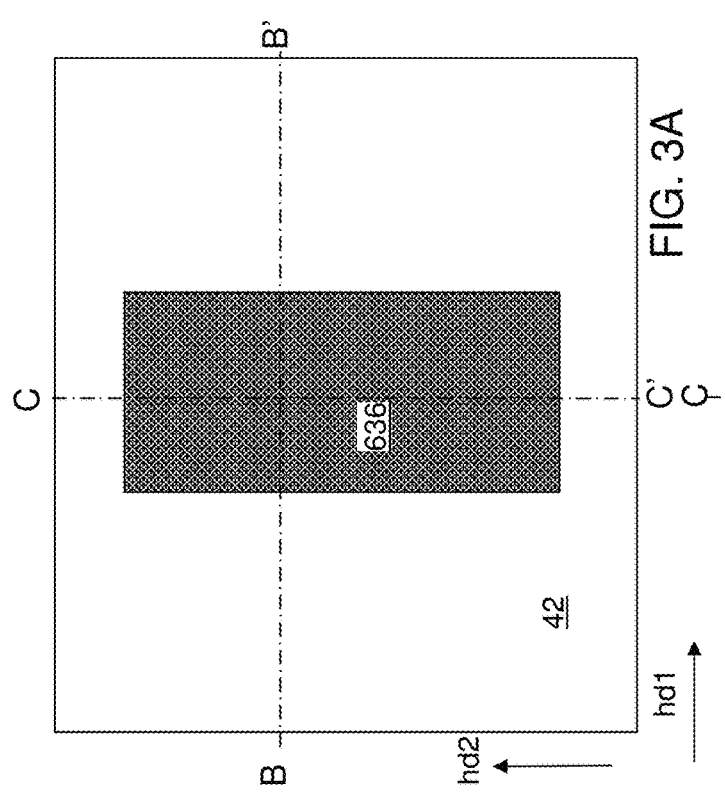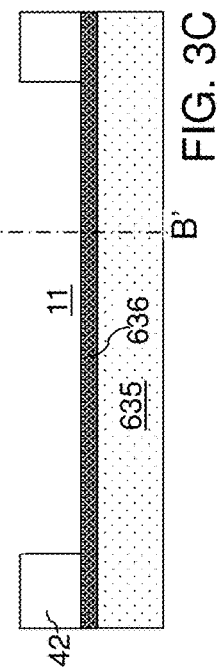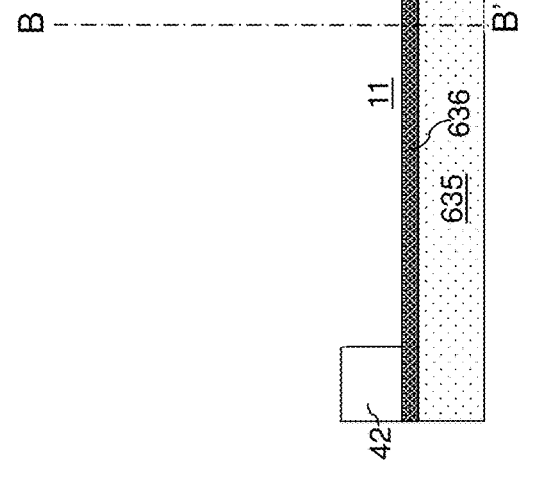

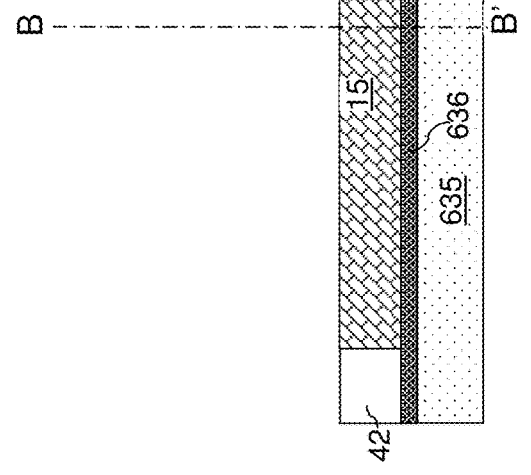
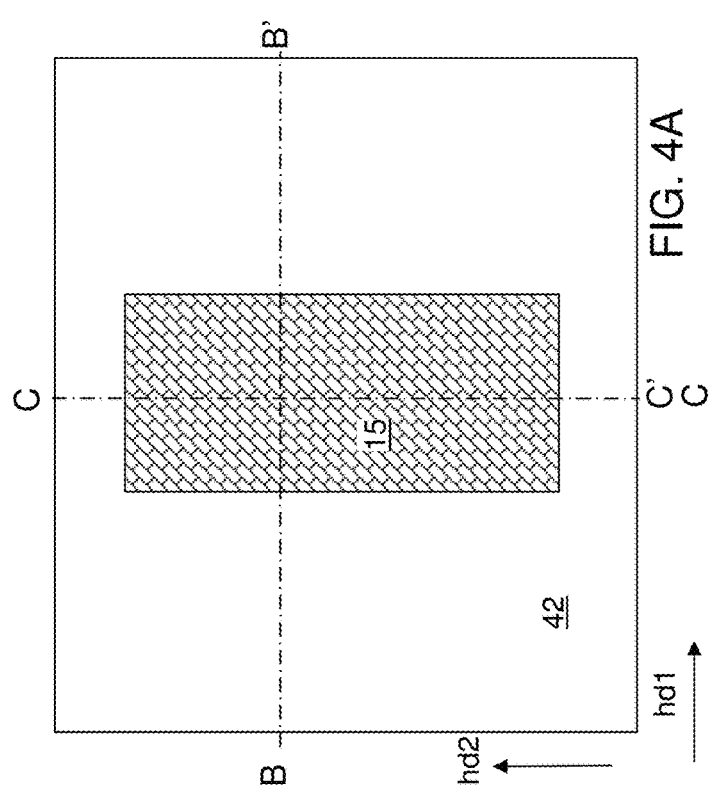
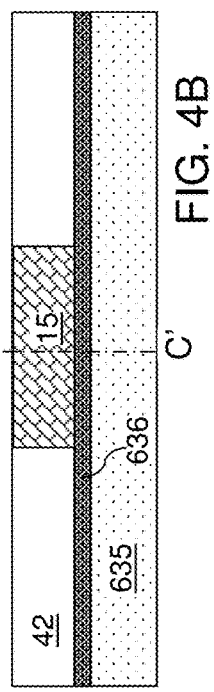

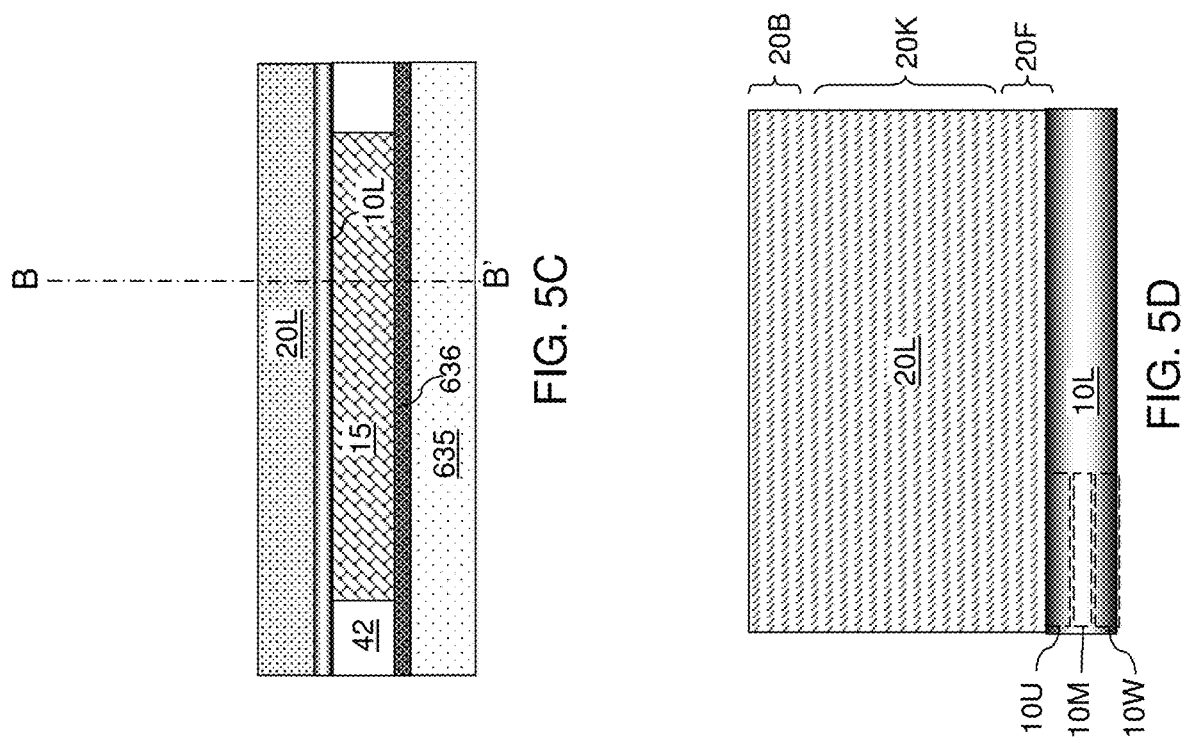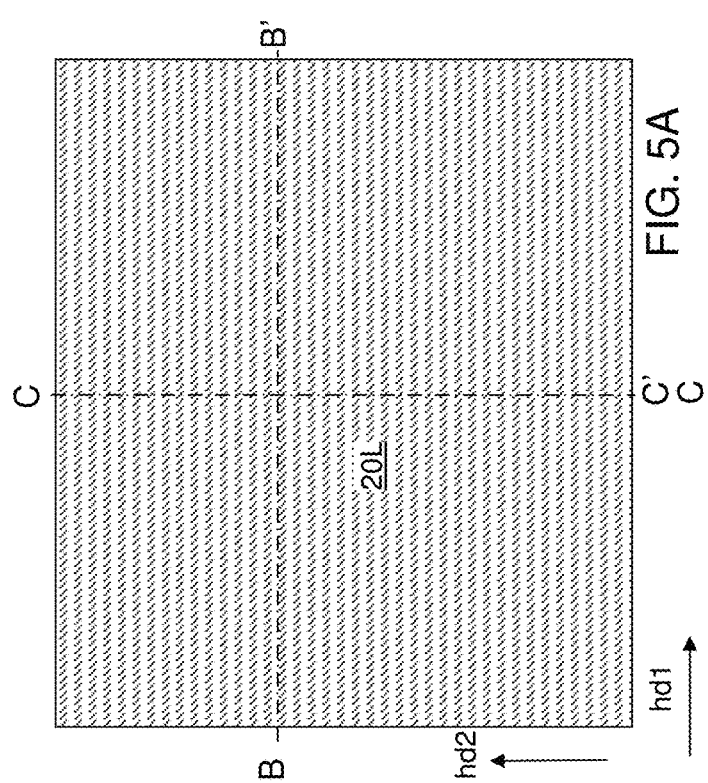

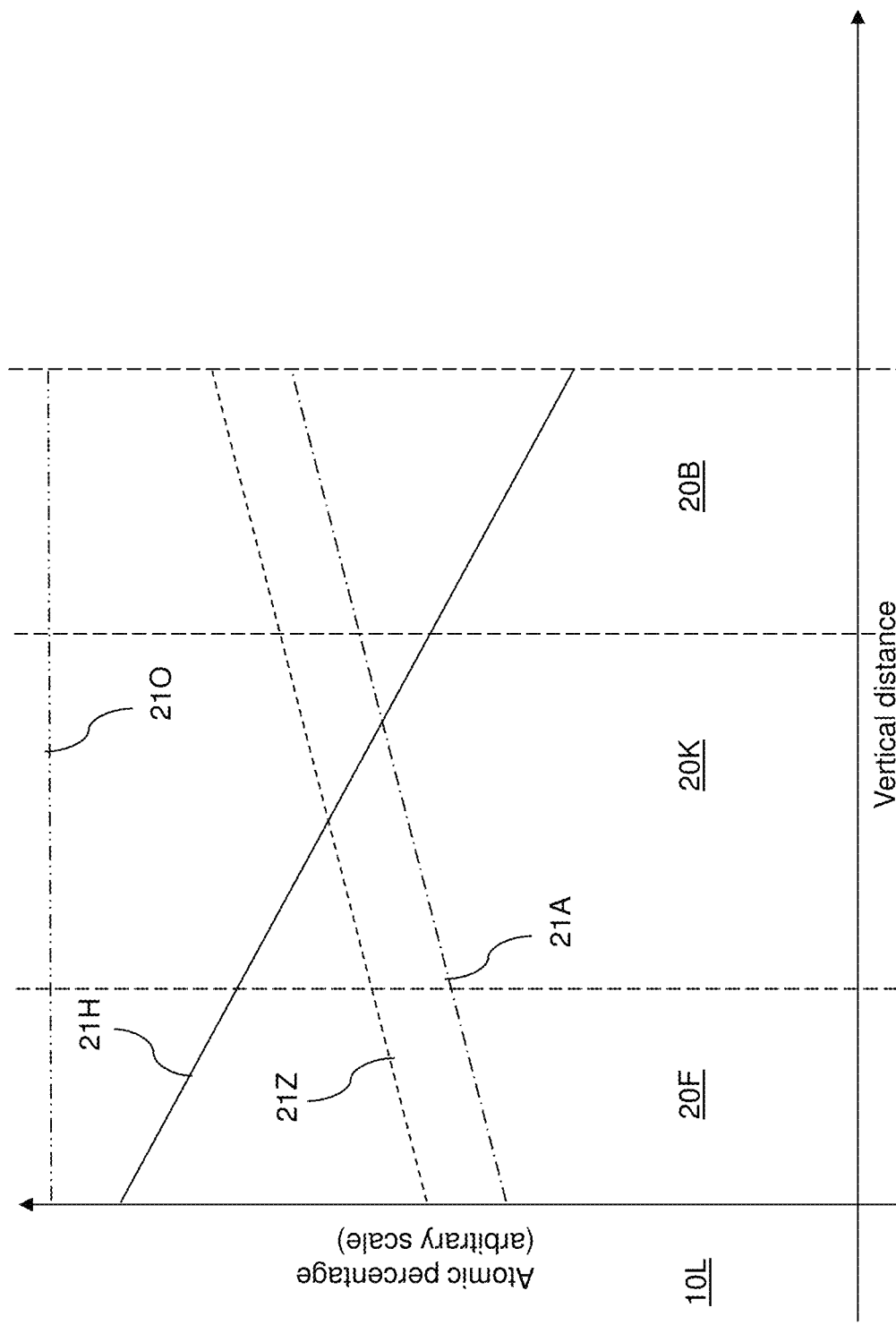

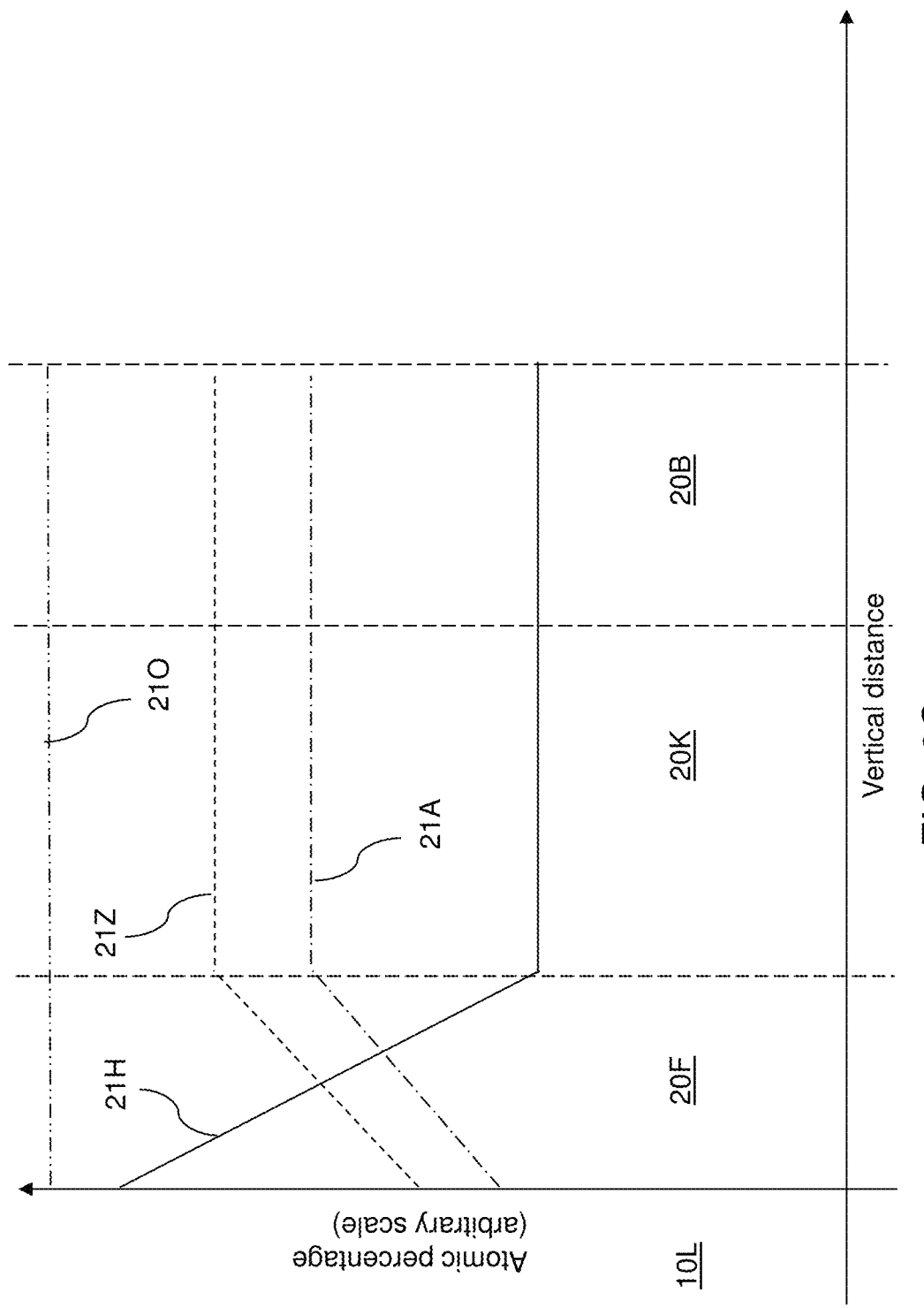

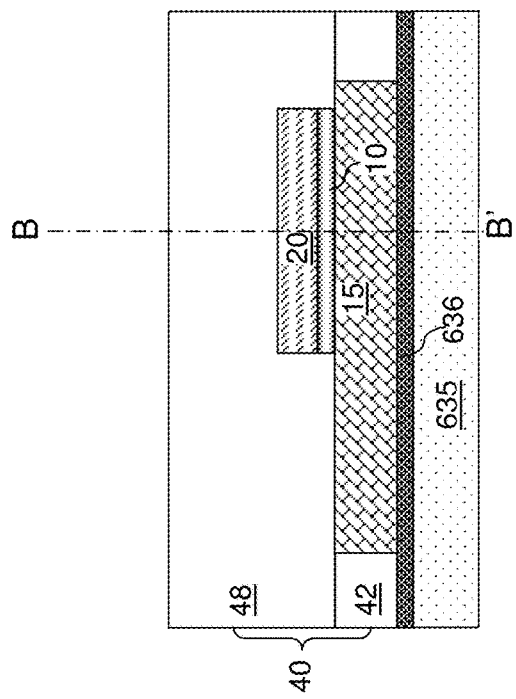
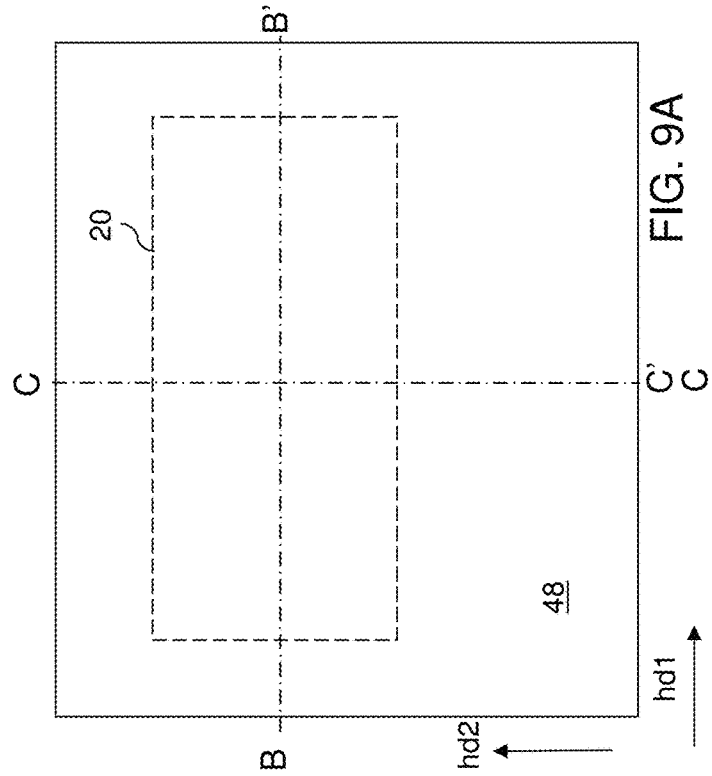
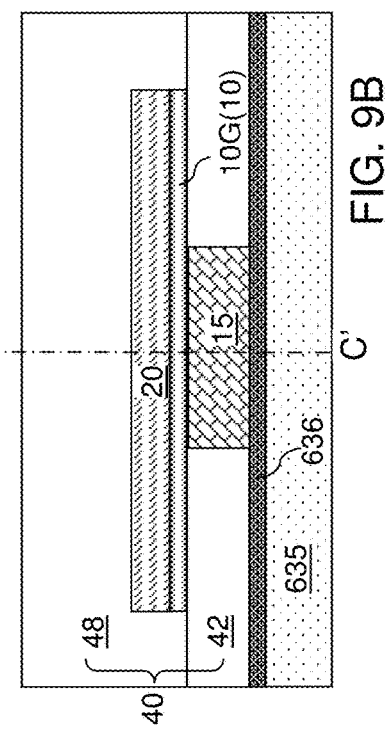
FIG. 9A
FIG. 9B
FIG. 9C

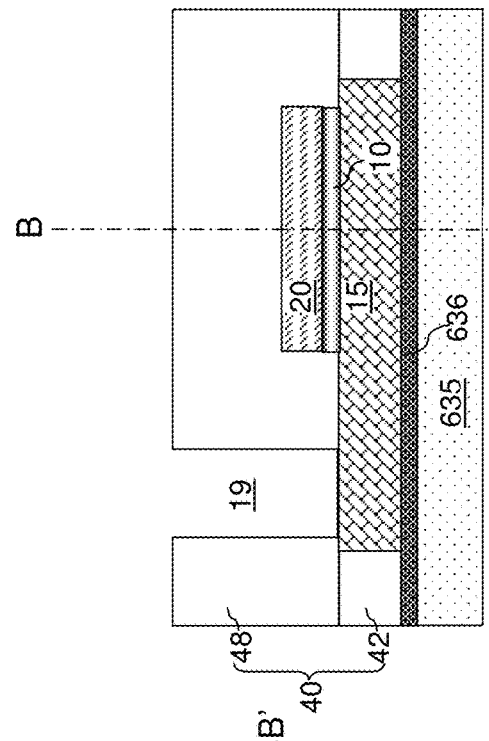
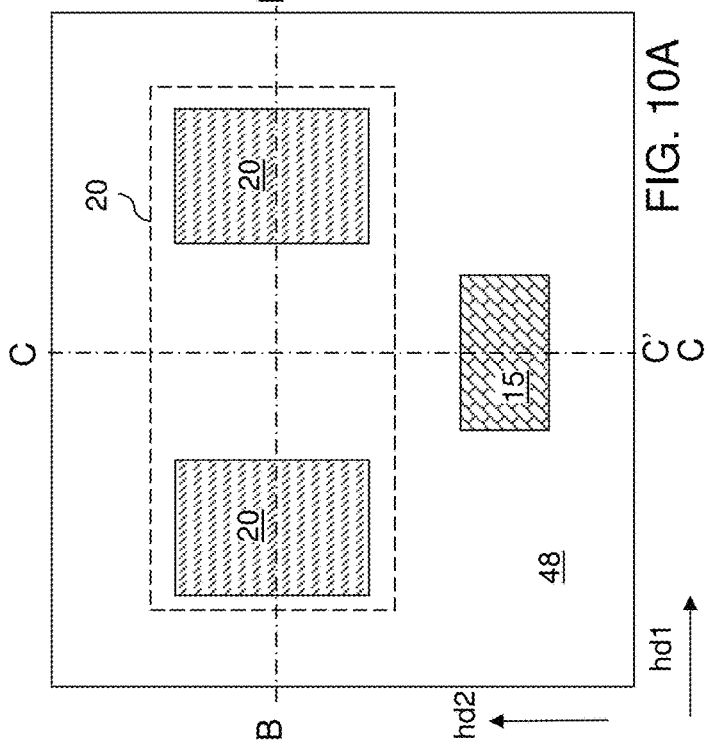
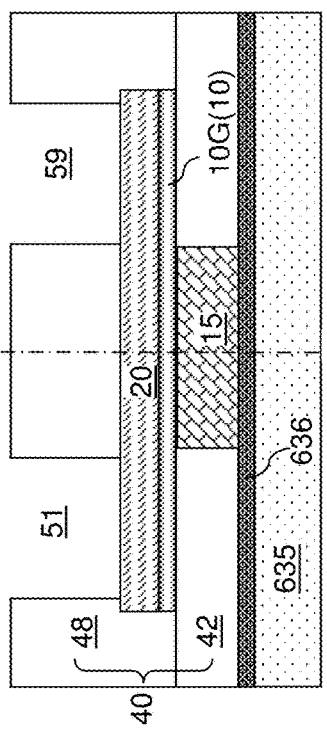
FIG. 10A
FIG. 10B
FIG. 10C

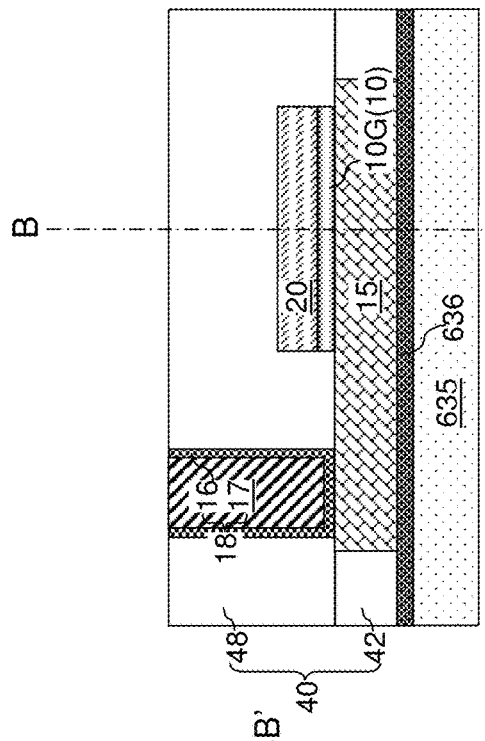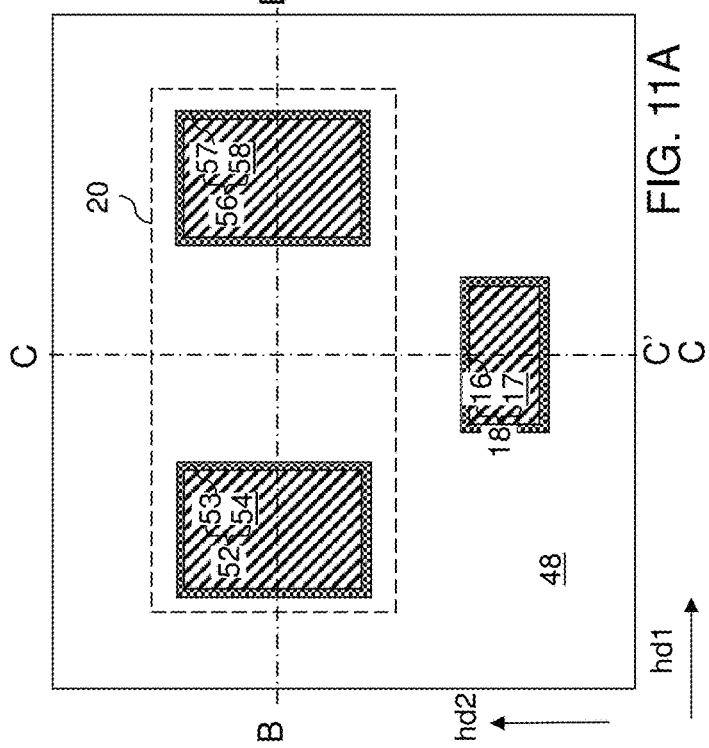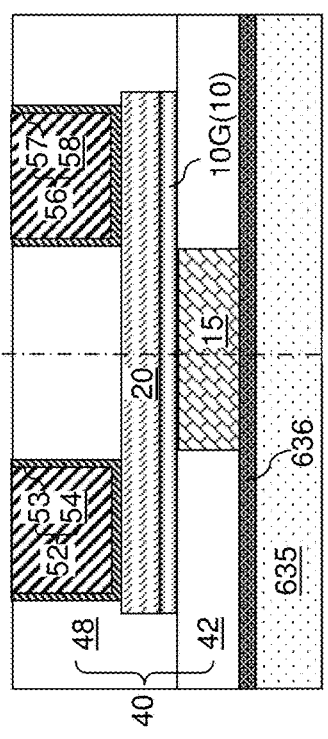

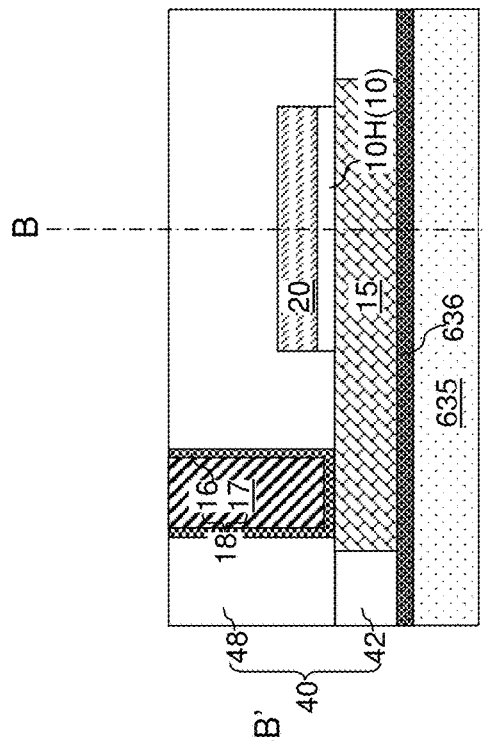
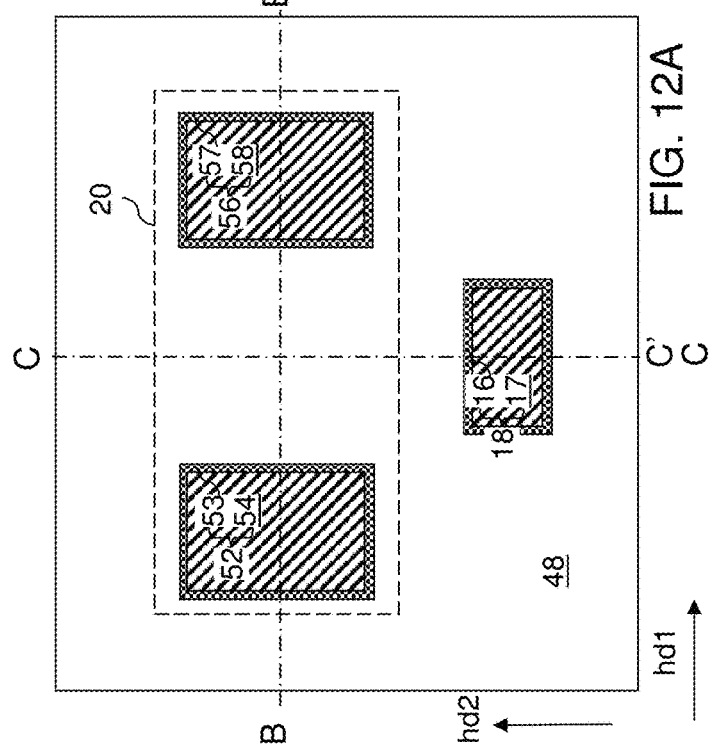
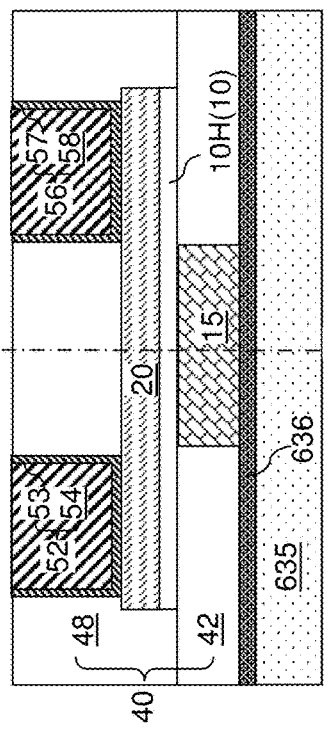
FIG. 12C
FIG. 12A
FIG. 12B

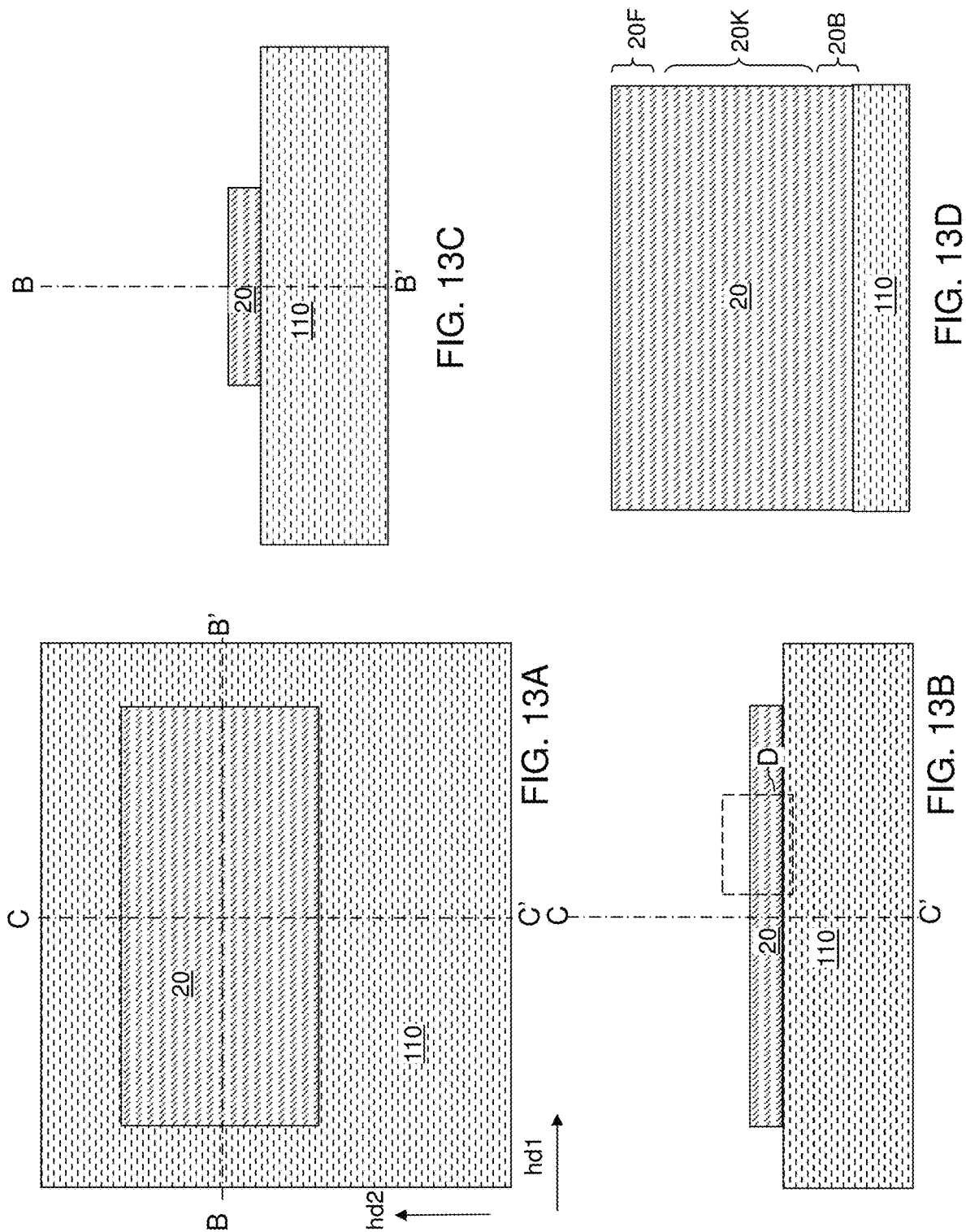

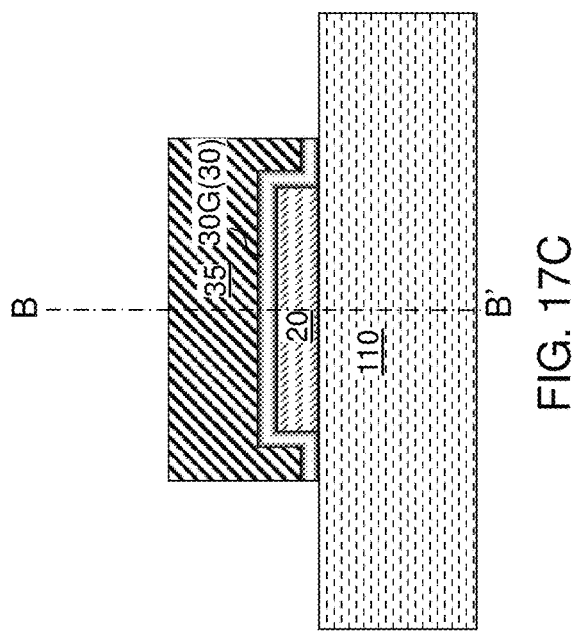
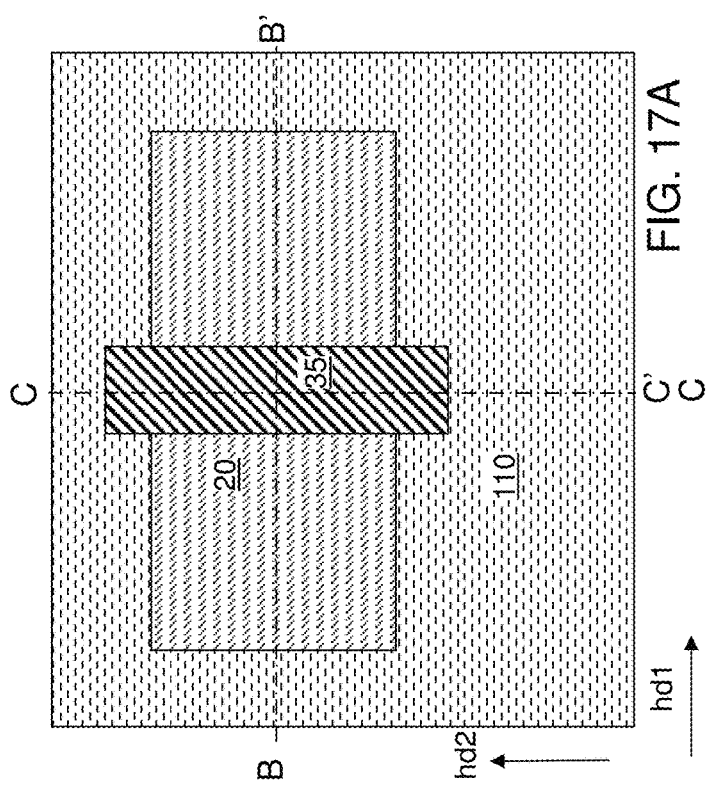
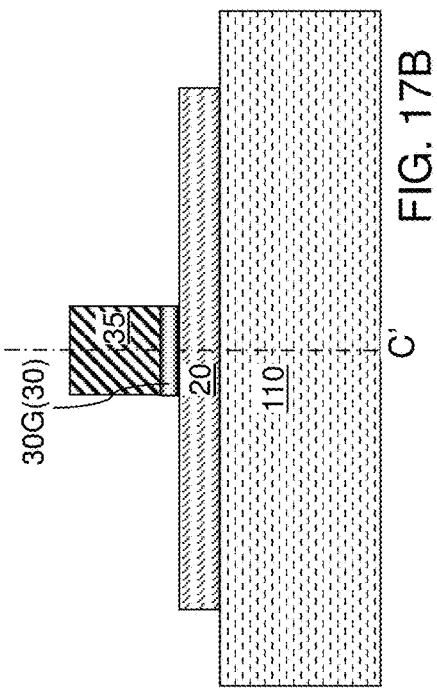
FIG. 17A
FIG. 17B
FIG. 17C

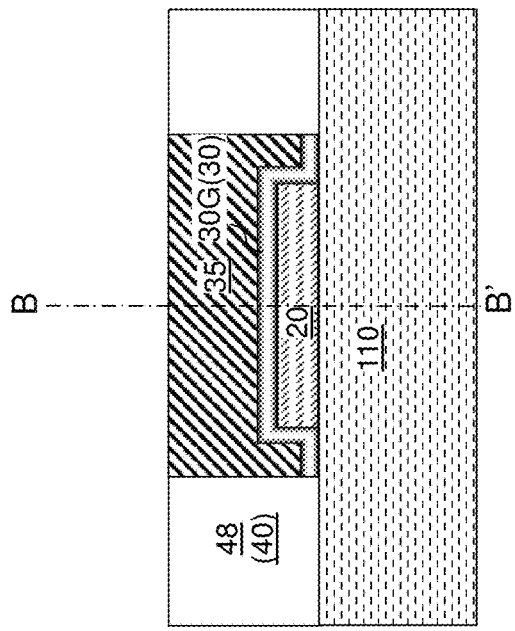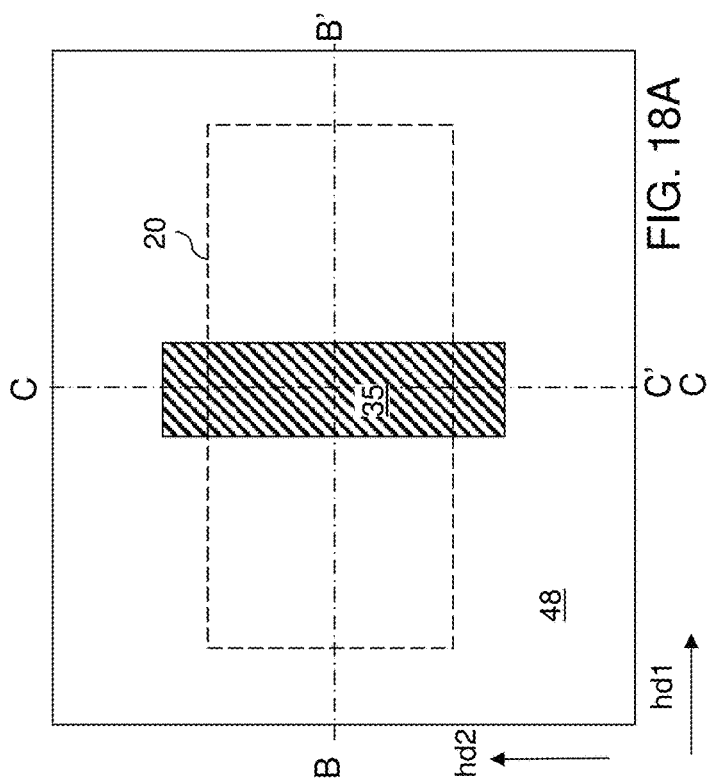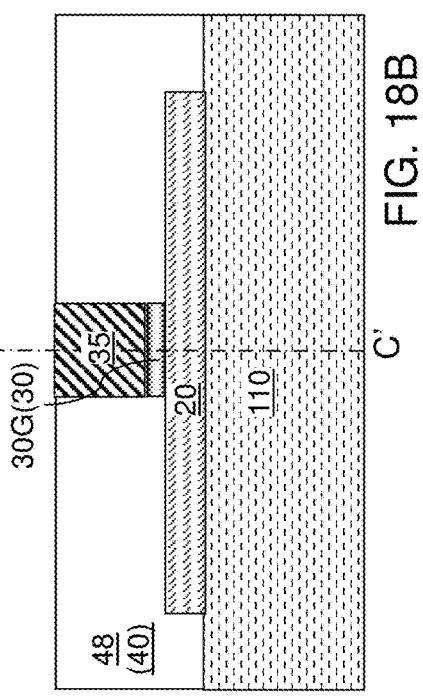

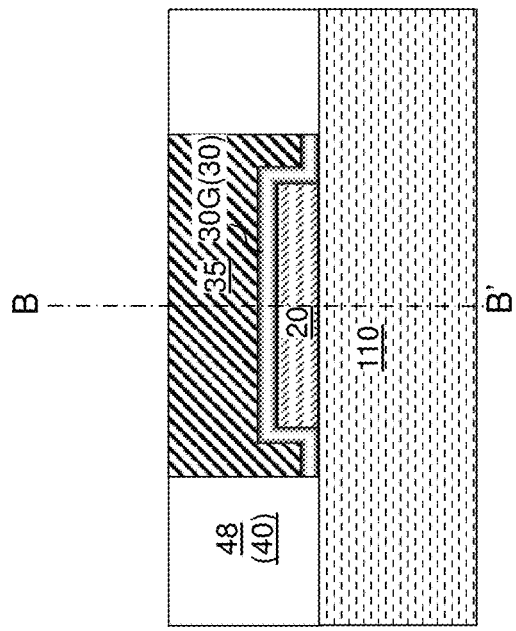
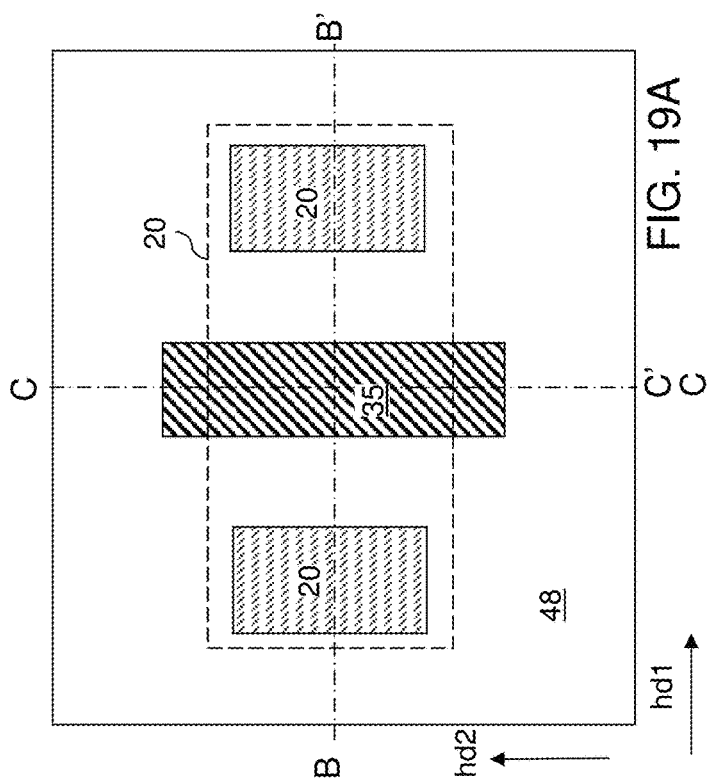
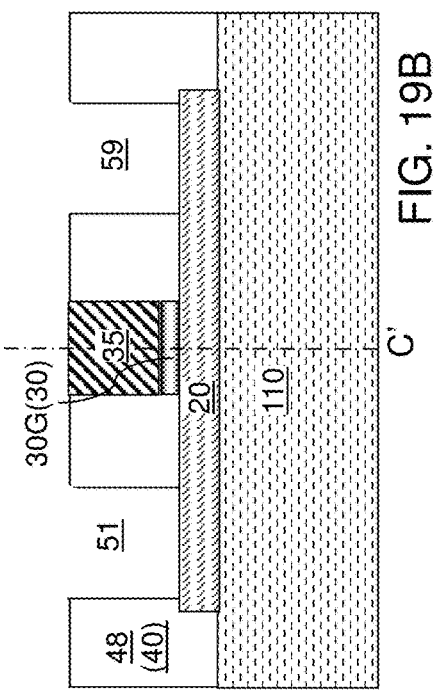
FIG. 19C
FIG. 19A
FIG. 19B

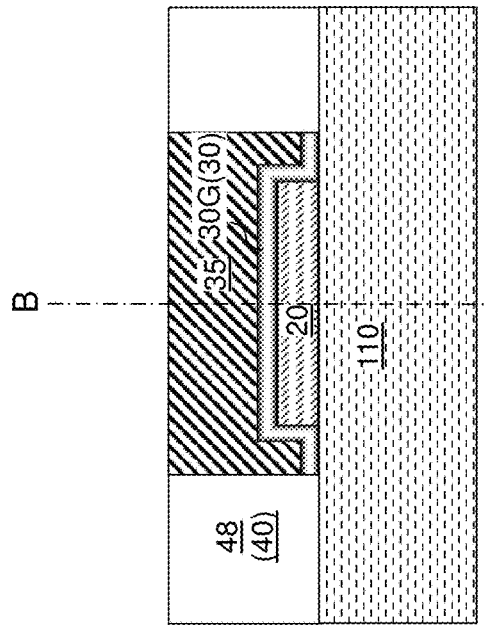
FIG. 20C
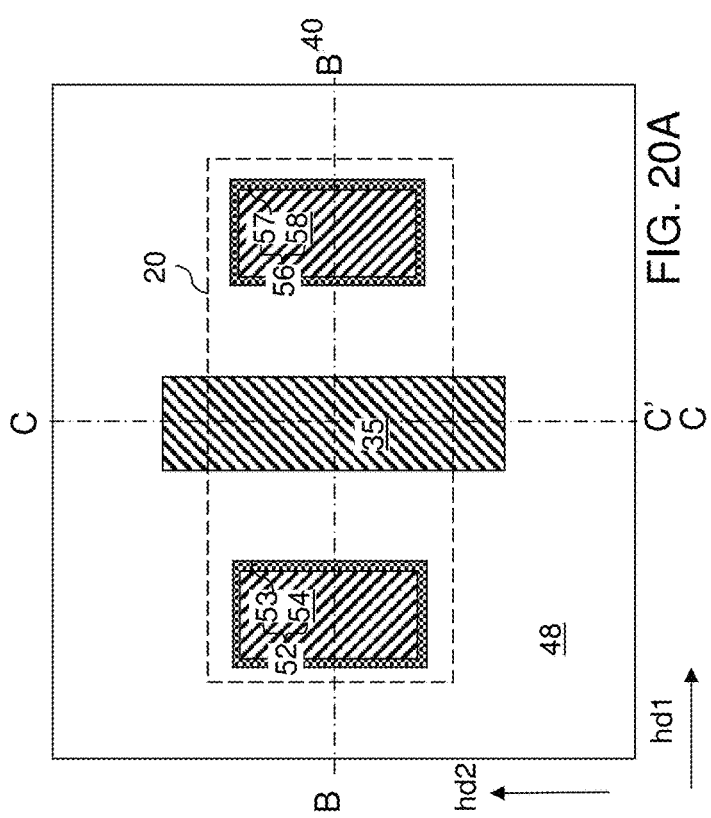
FIG. 20A
FIG. 20B

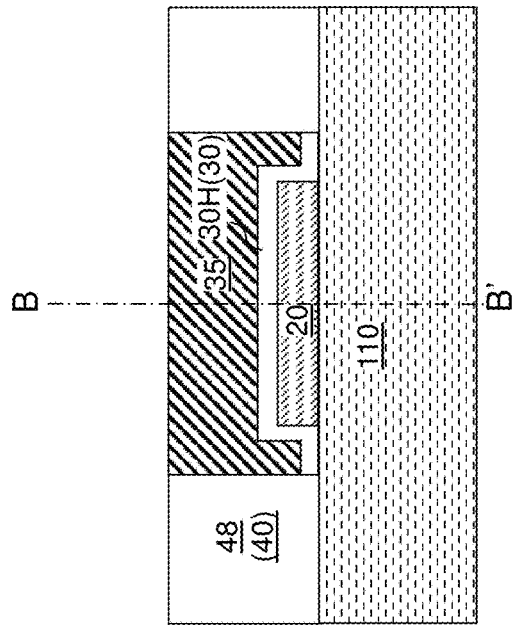
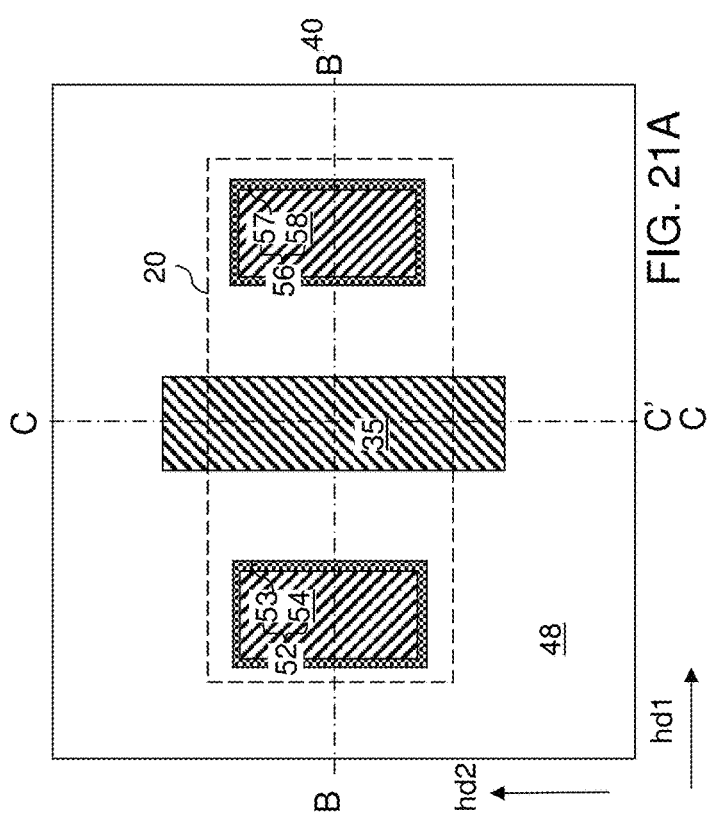
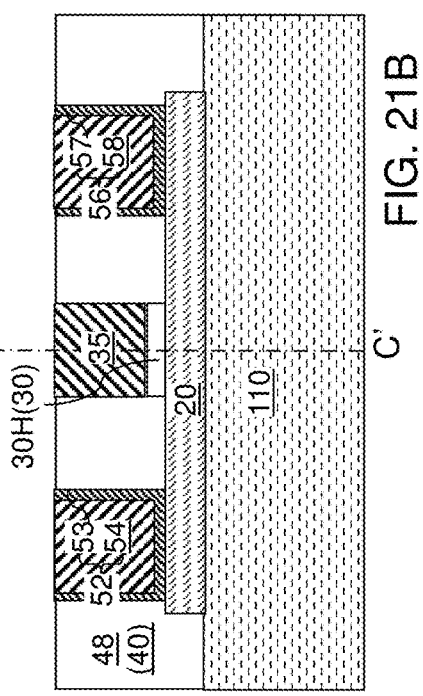
FIG. 21C
FIG. 21A
FIG. 21B

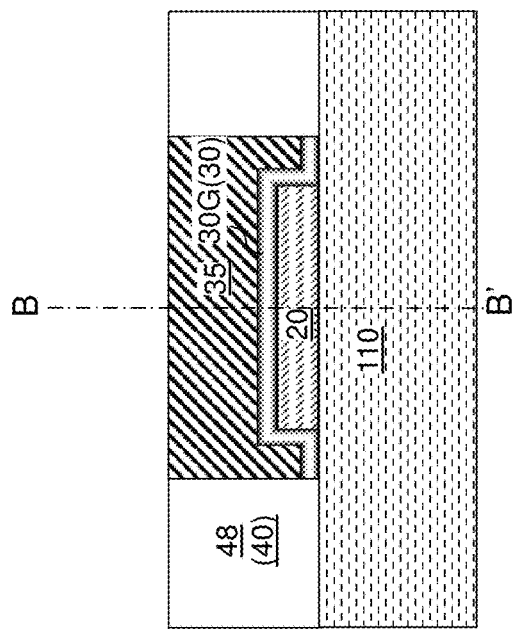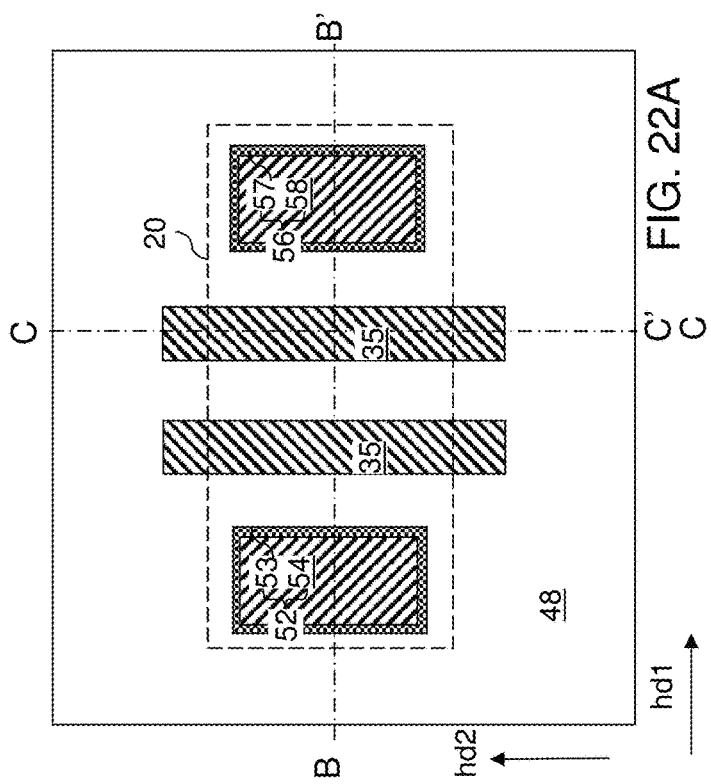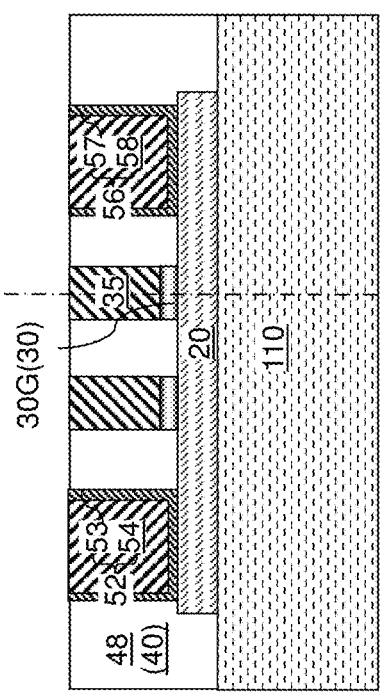

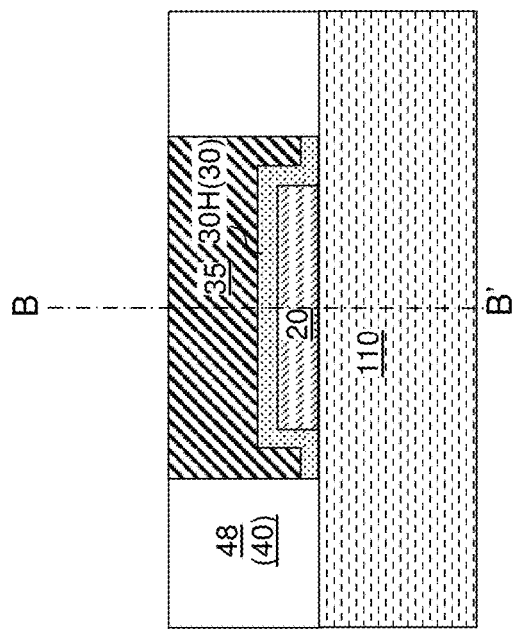
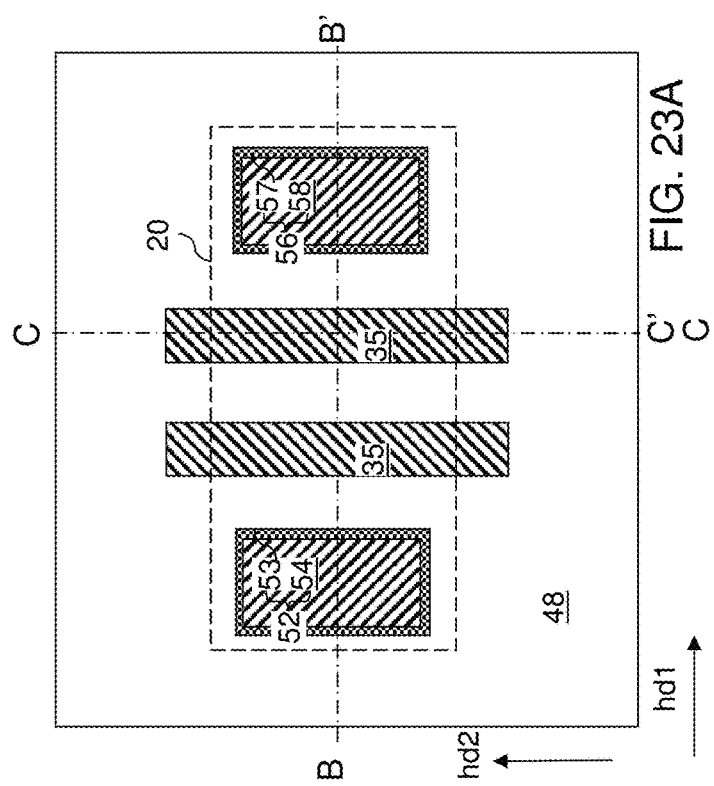
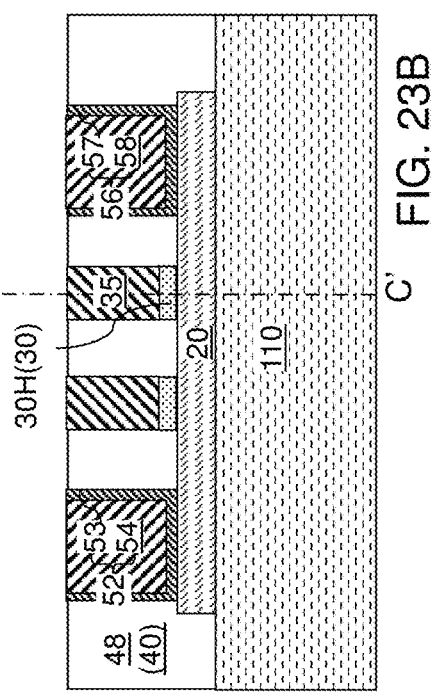
FIG. 23C
FIG. 23A
FIG. 23B

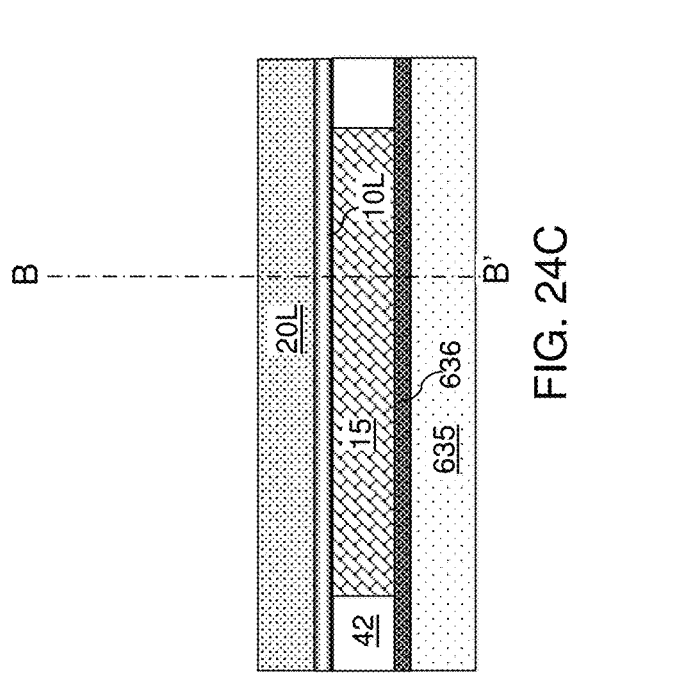
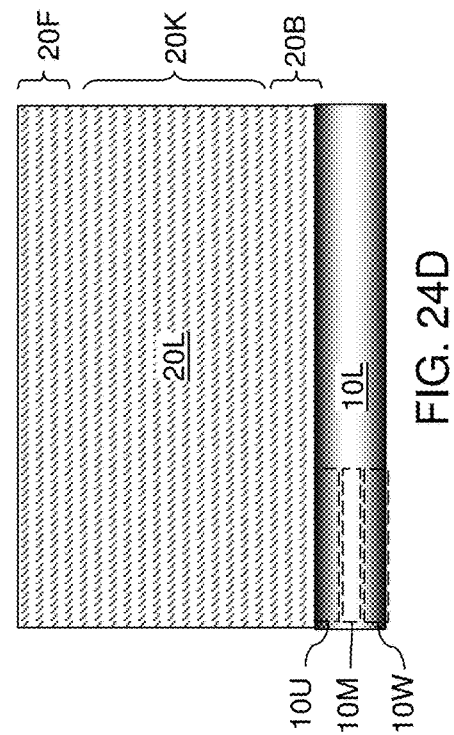
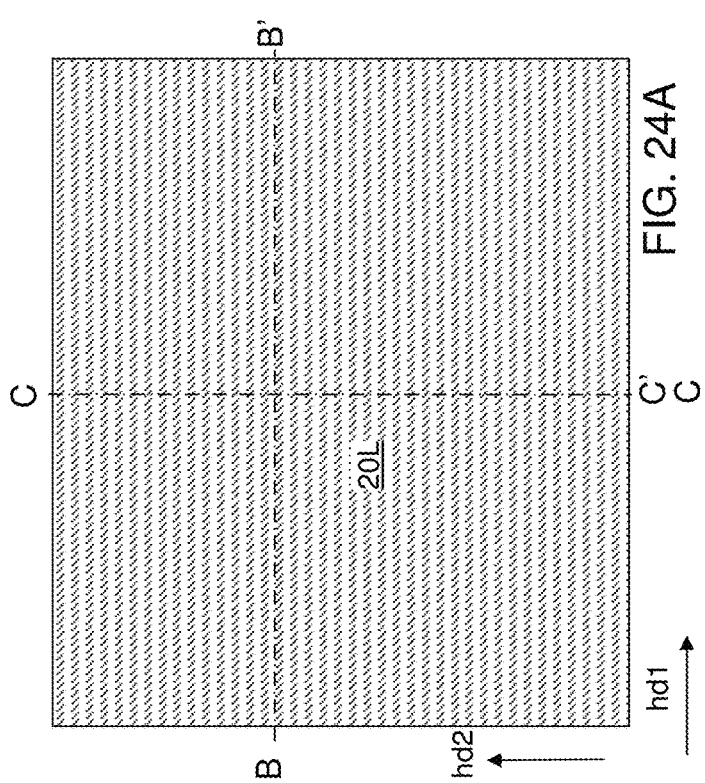
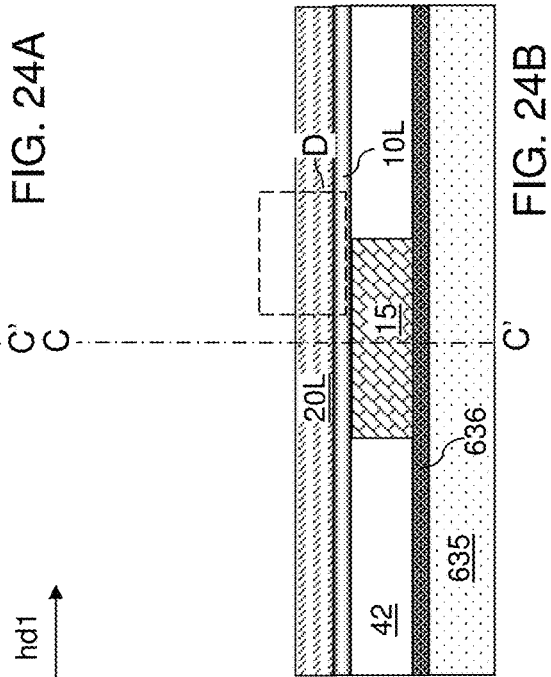

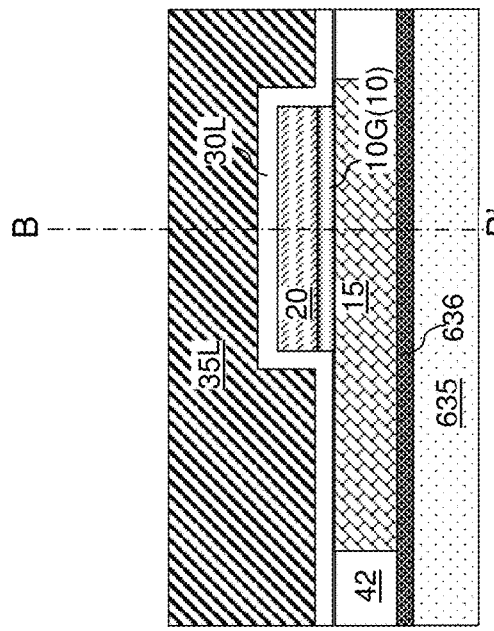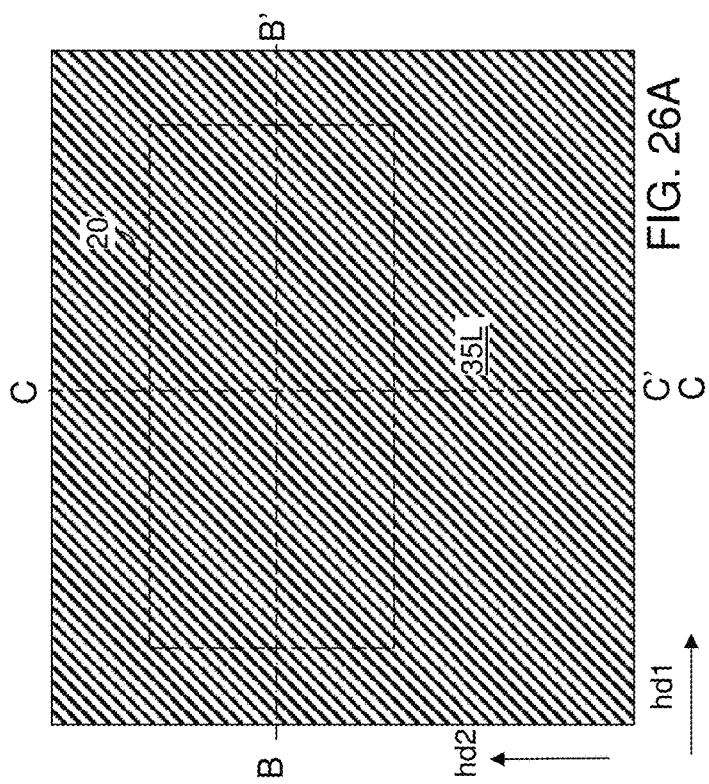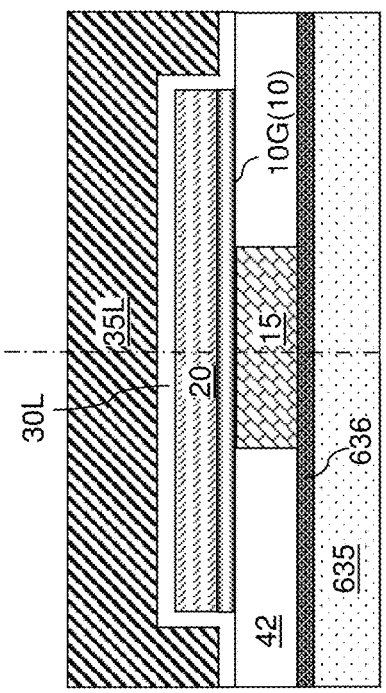

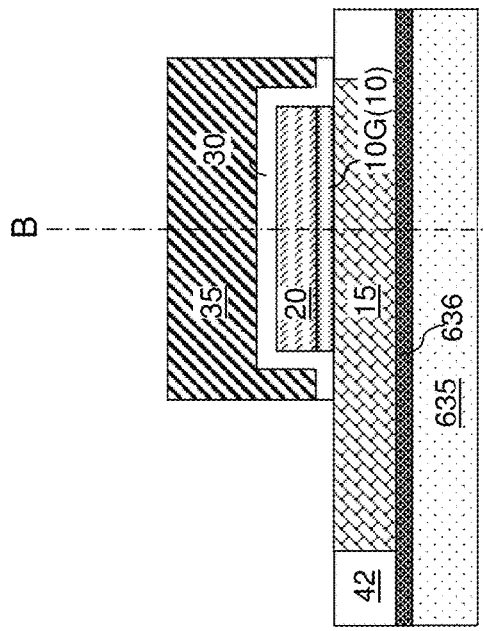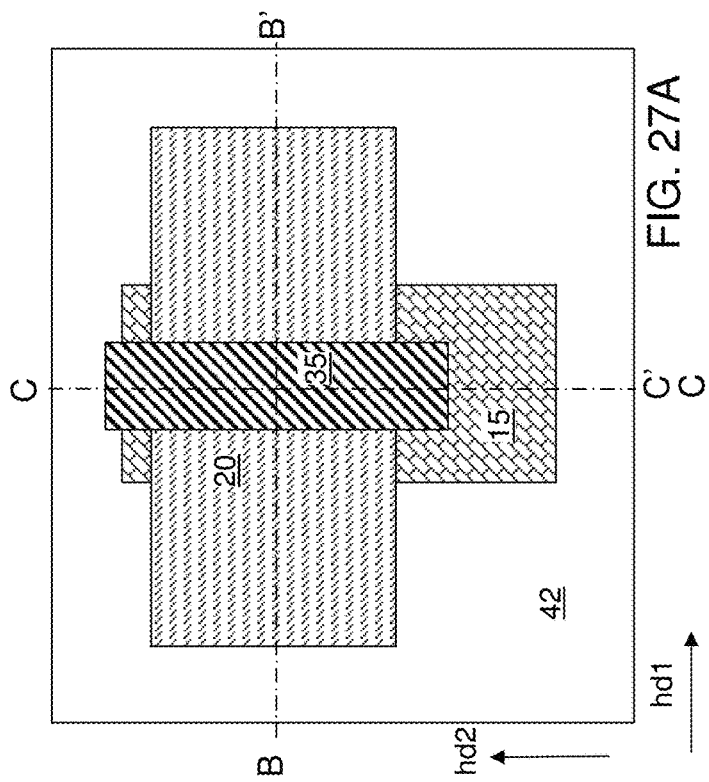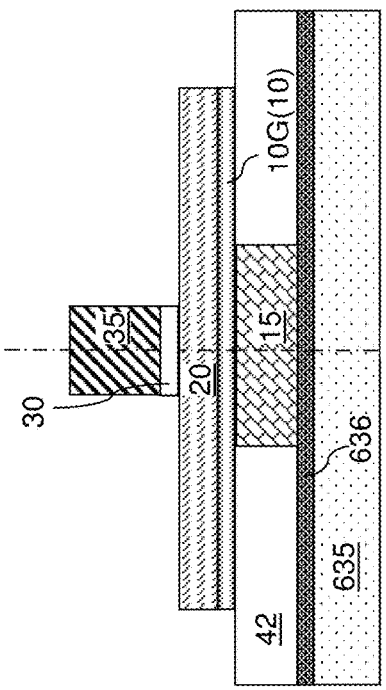

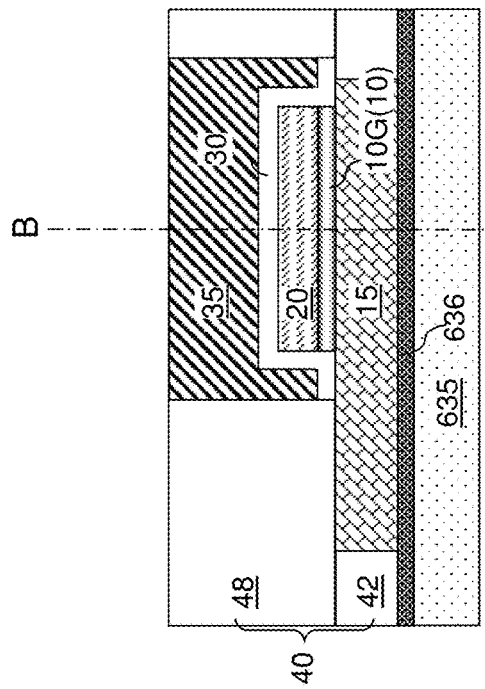
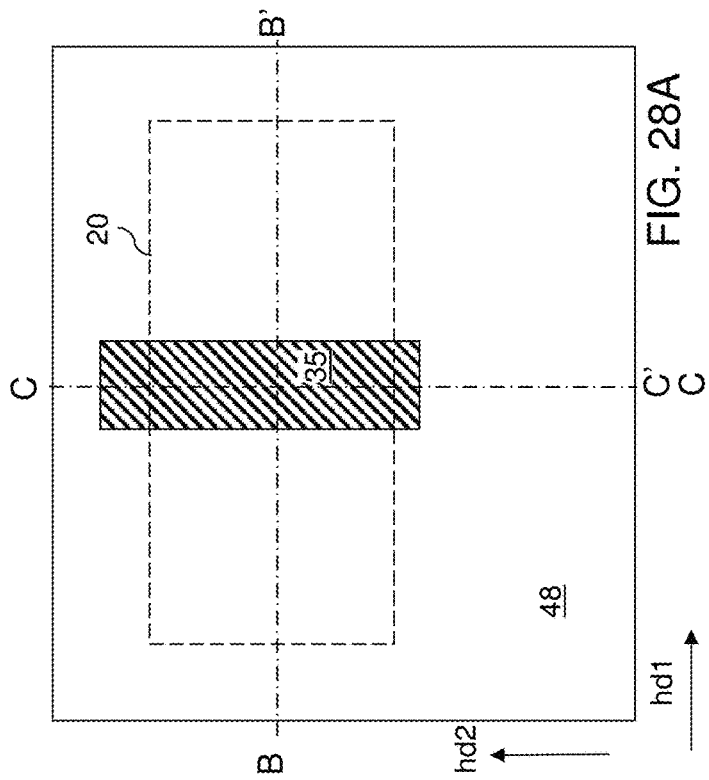
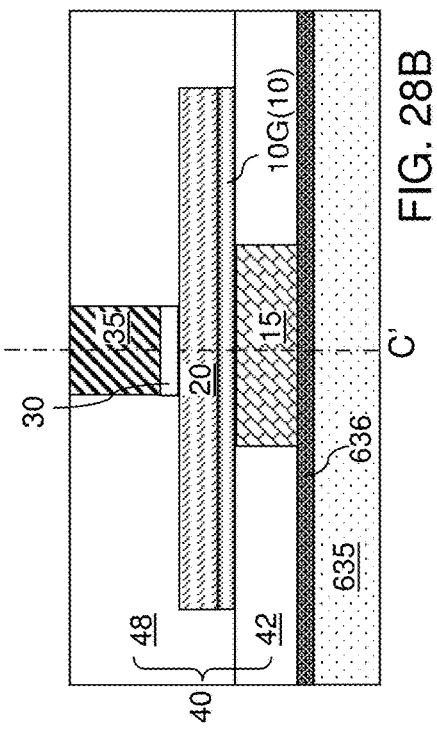
FIG. 28C
FIG. 28A
FIG. 28B

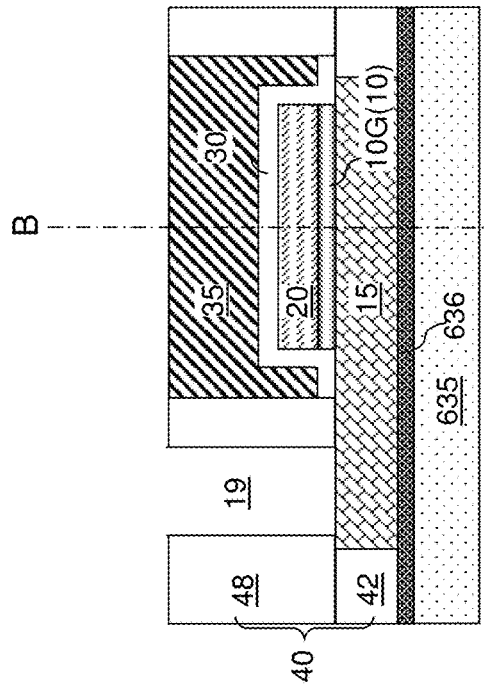
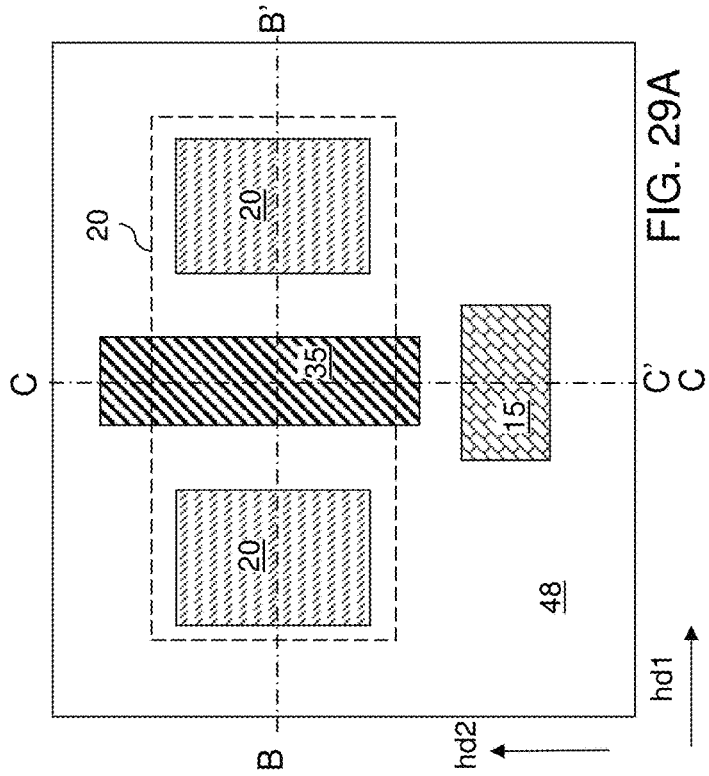
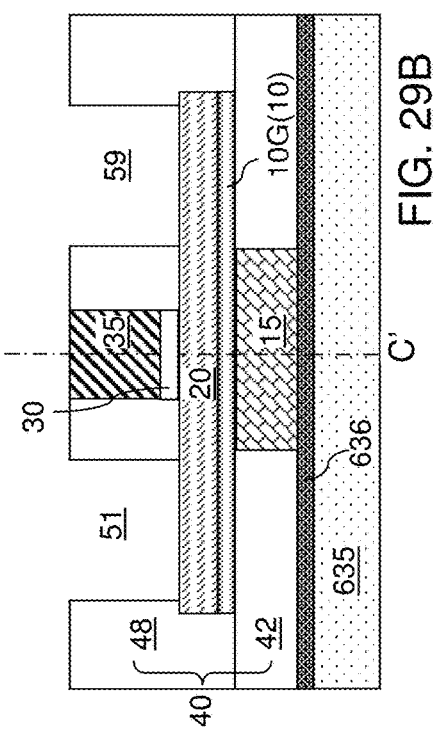
FIG. 29A
FIG. 29B
FIG. 29C

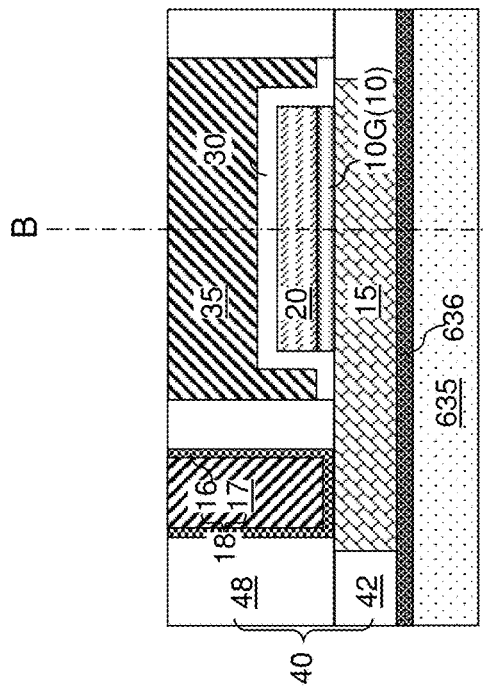
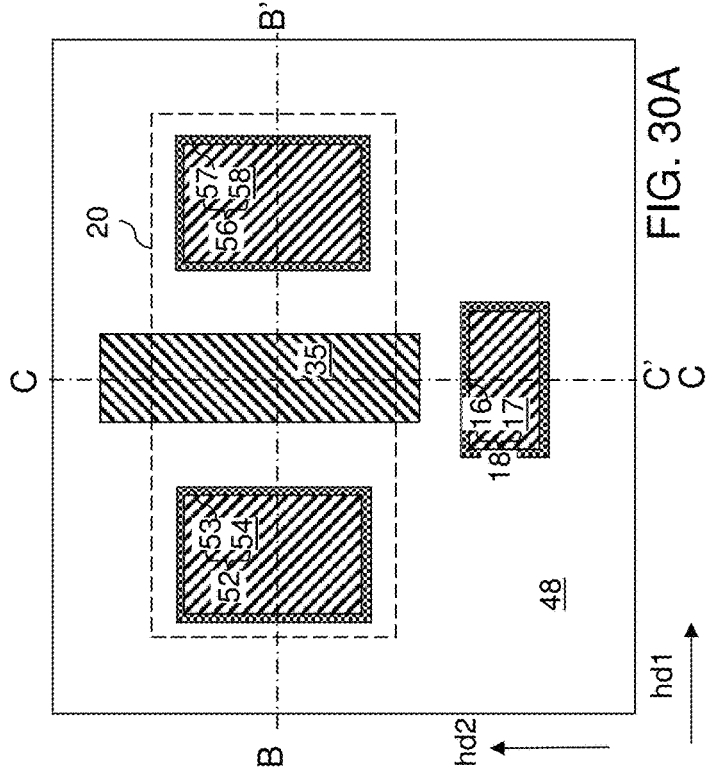
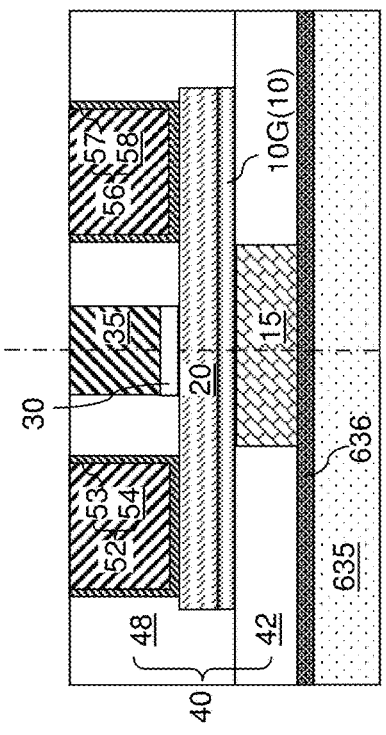
FIG. 30C
FIG. 30A
FIG. 30B

TRANSISTOR INCLUDING AN ACTIVE REGION AND METHODS FOR FORMING THE SAME

RELATED APPLICATIONS

This application claims the benefit of priority from a U.S. provisional application Ser. No. 63/178,128, entitled "A Structure of FeTFT based on Oxide Semiconductor," filed on Apr. 22, 2021, the entire contents of which are incorporated herein by reference.

BACKGROUND

Transistors made of oxide semiconductors are an attractive option for back-end-of-line (BEOL) integration since they may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of the first exemplary structure after formation of an insulating layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of a region of the first exemplary structure after formation of a recess region in the insulating layer according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of a region of the first exemplary structure after formation of a bottom gate electrode according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 5A is a top-down view of a region of the first exemplary structure after formation of a continuous bottom gate dielectric layer and a continuous active layer according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 5D is a magnified view of region D of FIG. 5B.

FIG. 6A is a first exemplary vertical atomic percentage profile of various elements within the continuous active layer within the first exemplary structure of FIGS. 5A-5C according to the first embodiment of the present disclosure.

FIG. 6C is a third exemplary vertical atomic percentage profile of various elements within the continuous active layer within the first exemplary structure of FIGS. 5A-5C according to the first embodiment of the present disclosure.

FIG. 9A is a top-down view of a region of the first exemplary structure after formation of a dielectric layer according to the first embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 10A is a top-down view of a region of the first exemplary structure after formation of a source cavity, a drain cavity, and a bottom gate contact via cavity according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a region of the first exemplary structure after formation of a source electrode, a drain electrode, and a backside electrode contact via structure according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 12A is a top-down view of a region of a second exemplary structure according to a second embodiment of the present disclosure.

FIG. 12B is a vertical cross-sectional view of the second exemplary structure along the vertical plane B-B' of FIG. 12A.

FIG. 12C is a vertical cross-sectional view of the second exemplary structure along the vertical plane C-C' of FIG. 12A.

FIG. 13A is a top-down view of a region of a third exemplary structure after formation of an active layer according to a third embodiment of the present disclosure.

FIG. 13B is a vertical cross-sectional view of the third exemplary structure along the vertical plane B-B' of FIG. 13A.

FIG. 13C is a vertical cross-sectional view of the third exemplary structure along the vertical plane C-C' of FIG. 13A.

FIG. 13D is a magnified view of region D of FIG. 13B.

FIG. 17A is a top-down view of a region of the third exemplary structure after formation of a top gate electrode and a top gate dielectric according to the third embodiment of the present disclosure.

FIG. 17B is a vertical cross-sectional view of the third exemplary structure along the vertical plane B-B' of FIG. 17A.

FIG. 17C is a vertical cross-sectional view of the third exemplary structure along the vertical plane C-C' of FIG. 17A.

FIG. 18A is a top-down view of a region of the third exemplary structure after formation of a dielectric layer according to the third embodiment of the present disclosure.

FIG. 18B is a vertical cross-sectional view of the third exemplary structure along the vertical plane B-B' of FIG. 18A.

FIG. 18C is a vertical cross-sectional view of the third exemplary structure along the vertical plane C-C' of FIG. 18A.

FIG. 19A is a top-down view of a region of the third exemplary structure after formation of a source cavity, a drain cavity, and a bottom gate contact via cavity according to the third embodiment of the present disclosure.

FIG. 19B is a vertical cross-sectional view of the third exemplary structure along the vertical plane B-B' of FIG. 19A.

FIG. 19C is a vertical cross-sectional view of the third exemplary structure along the vertical plane C-C' of FIG. 19A.

FIG. 20A is a top-down view of a region of the third exemplary structure after formation of a source electrode, a drain electrode, and a backside electrode contact via structure according to the third embodiment of the present disclosure.

FIG. 20B is a vertical cross-sectional view of the third exemplary structure along the vertical plane B-B' of FIG. 20A.

FIG. 20C is a vertical cross-sectional view of the third exemplary structure along the vertical plane C-C' of FIG. 20A.

FIG. 21A is a top-down view of a region of a fourth exemplary structure according to a fourth embodiment of the present disclosure.

FIG. 21B is a vertical cross-sectional view of the fourth exemplary structure along the vertical plane B-B' of FIG. 21A.

FIG. 21C is a vertical cross-sectional view of the fourth exemplary structure along the vertical plane C-C' of FIG. 21A.

FIG. 22A is a top-down view of a region of a fifth exemplary structure according to a fifth embodiment of the present disclosure.

FIG. 22B is a vertical cross-sectional view of the fifth exemplary structure along the vertical plane B-B' of FIG. 22A.

FIG. 22C is a vertical cross-sectional view of the fifth exemplary structure along the vertical plane C-C' of FIG. 22A.

FIG. 23A is a top-down view of a region of a sixth exemplary structure according to a sixth embodiment of the present disclosure.

FIG. 23B is a vertical cross-sectional view of the sixth exemplary structure along the vertical plane B-B' of FIG. 23A.

FIG. 23C is a vertical cross-sectional view of the sixth exemplary structure along the vertical plane C-C' of FIG. 23A.

FIG. 24A is a top-down view of a region of the seventh exemplary structure after formation of a continuous bottom gate dielectric layer and a continuous active layer according to the seventh embodiment of the present disclosure.

FIG. 24B is a vertical cross-sectional view of the seventh exemplary structure along the vertical plane B-B' of FIG. 24A.

FIG. 24C is a vertical cross-sectional view of the seventh exemplary structure along the vertical plane C-C' of FIG. 24A.

FIG. 24D is a magnified view of region D of FIG. 24B.

FIG. 26A is a top-down view of a region of the seventh exemplary structure after formation of a bottom gate dielectric, an active layer, a continuous top gate dielectric layer, and a top gate electrode material layer according to the seventh embodiment of the present disclosure.

FIG. 26B is a vertical cross-sectional view of the seventh exemplary structure along the vertical plane B-B' of FIG. 26A.

FIG. 26C is a vertical cross-sectional view of the seventh exemplary structure along the vertical plane C-C' of FIG. 26A.

FIG. 27A is a top-down view of a region of the seventh exemplary structure after formation of a top gate dielectric and a top gate electrode according to the seventh embodiment of the present disclosure.

FIG. 27B is a vertical cross-sectional view of the seventh exemplary structure along the vertical plane B-B' of FIG. 27A.

FIG. 27C is a vertical cross-sectional view of the seventh exemplary structure along the vertical plane C-C' of FIG. 27A.

FIG. 28A is a top-down view of a region of the seventh exemplary structure after formation of a dielectric layer according to the seventh embodiment of the present disclosure.

FIG. 28B is a vertical cross-sectional view of the seventh exemplary structure along the vertical plane B-B' of FIG. 28A.

FIG. 28C is a vertical cross-sectional view of the seventh exemplary structure along the vertical plane C-C' of FIG. 28A.

FIG. 29A is a top-down view of a region of the seventh exemplary structure after formation of a source cavity, a drain cavity, and a bottom gate contact via cavity according to the seventh embodiment of the present disclosure.

FIG. 29B is a vertical cross-sectional view of the seventh exemplary structure along the vertical plane B-B' of FIG. 29A.

FIG. 29C is a vertical cross-sectional view of the seventh exemplary structure along the vertical plane C-C' of FIG. 29A.

FIG. 30A is a top-down view of a region of the seventh exemplary structure after formation of a source electrode, a drain electrode, and a backside electrode contact via structure according to the seventh embodiment of the present disclosure.

FIG. 30B is a vertical cross-sectional view of the seventh exemplary structure along the vertical plane B-B' of FIG. 30A.

FIG. 30C is a vertical cross-sectional view of the seventh exemplary structure along the vertical plane C-C' of FIG. 30A.

DETAILED DESCRIPTION

Figure 1:
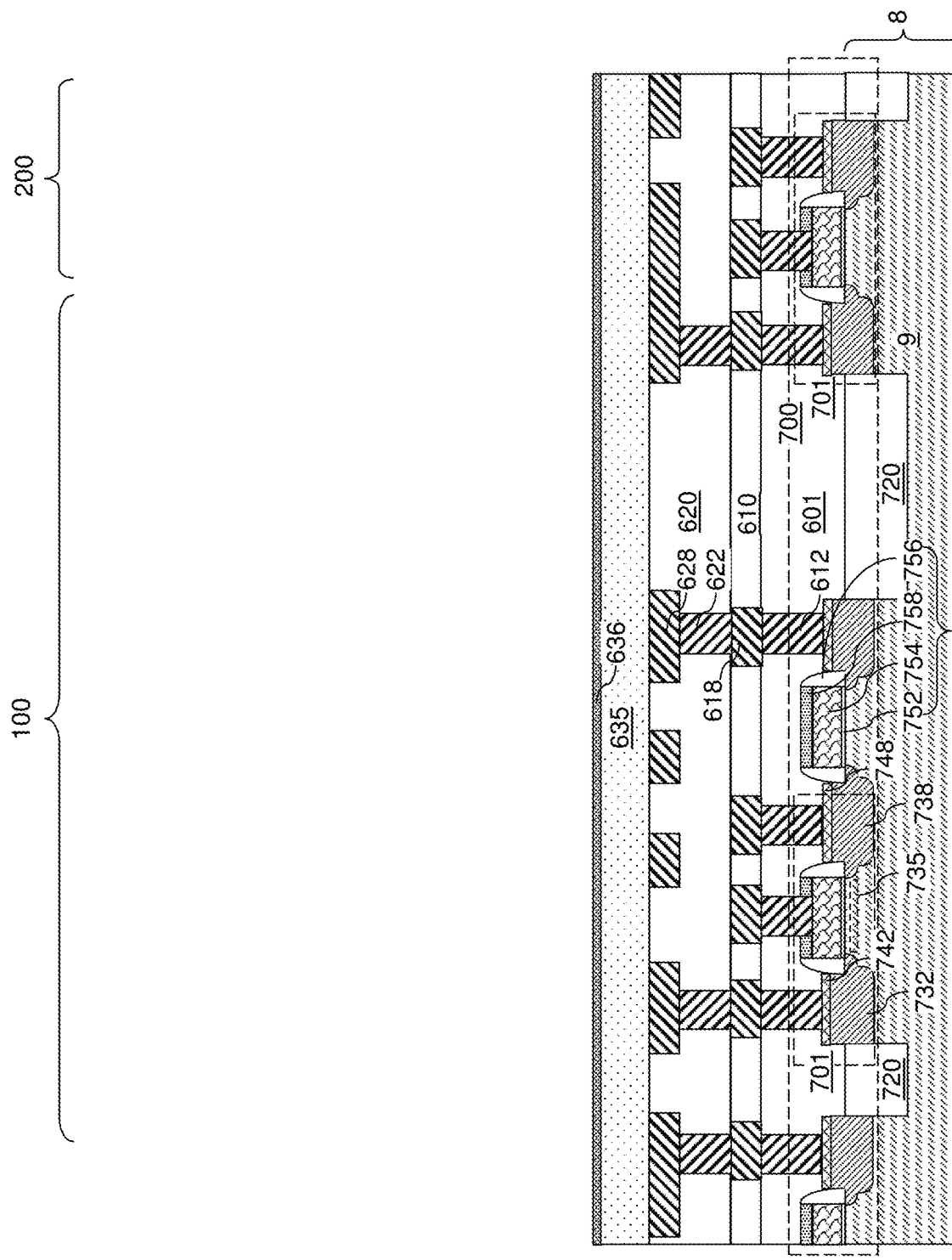
FIG. 1 is a vertical cross-sectional view of a first exemplary structure after formation of complementary metal-oxide-semiconductor (CMOS) transistors, first metal interconnect structures formed in lower-level dielectric layers, an insulating material layer, and an optional etch stop dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least one transistor such as a plurality of transistors. According to an aspect of the present disclosure, an atomic layer deposition process may be used to form an active layer having a compositionally non-homogeneous vertical atomic concentration profile within an active layer. Specifically, a front channel layer may be formed with a higher post-transition metal element percentage and with a lower acceptor-type element percentage than within a back channel layer of the active layer. The duration of precursor pulse cycles may be modified during the atomic layer deposition steps to provide the compositionally non-homogeneous vertical atomic concentration profile.

For example, if a semiconducting metal oxide material of the active layer may include an indium-containing semiconducting material, an interface between the active layer and a gate dielectric may have a higher atomic percentage of indium than the bulk semiconductor layer or the back channel layer of the active layer. The back channel layer of the active layer may have a lower atomic percentage of indium than the bulk semiconductor layer. The charge carrier concentration in the front channel layer may be increased to provide a higher on-current, while the charge carrier concentration in the back channel layer may be decreased to reduce leakage current during an off-state of the field effect transistor. The field effect transistors of the present disclosure may be formed in a bottom gate configuration or in a top gate configuration. The field effect transistors of the present disclosure may be integrated with front-end-of-line processes that are used for manufacture of CMOS-based semiconductor devices. The various aspects of embodiments of the present disclosure are described here below in detail with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material. The exemplary structure may include a memory region 100 and a logic region 200.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells may be subsequently formed at a level of a dielectric layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element may refer to an element having electrical conductivity in the range from $1.0 \times 10^{-6}$ S/cm to $1.0 \times 10^5$ S/cm. As used herein, a "semiconductor material" may refer to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from $1.0$ S/cm to $1.0 \times 10^5$ S/cm upon suitable doping with an electrical dopant.

According to an aspect of the present disclosure, the field effect transistors 701 may be subsequently electrically connected to drain electrodes and gate electrodes of access transistors including active layers to be formed above the field effect transistors 701. In one embodiment, a subset of the field effect transistors 701 may be subsequently electrically connected to at least one of the drain electrodes and the gate electrodes. For example, the field effect transistors 701 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may include bit line drivers configured to apply a bit line bias voltage to bit lines to be subsequently formed, and sense amplifiers configured to detect electrical current that flows through the bit lines during a read operation.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect structures may include device contact via structures 612 formed in the first dielectric layer 601 and contact a respective component of the CMOS circuitry 700, first metal line structures 618 formed in the first interconnect-level dielectric layer 610, first metal via structures 622 formed in a lower portion of the second interconnect-level dielectric layer 620, and second metal line structures 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric layers (601, 610, 620) are herein referred to as lower-level dielectric layers. The metal interconnect structures (612, 618, 622, 628) formed within in the lower-level dielectric layers are herein referred to as lower-level metal interconnect structures.

While the present disclosure is described using an embodiment wherein thin film transistors may be formed over the second interconnect-level dielectric layer 620, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of thin film transistors or an array of ferroelectric memory cells is collectively referred to as lower-level dielectric layers (601, 610, 620). The set of all metal interconnect structures that is formed within the lower-level dielectric layers (601, 610, 620) is herein referred to as first metal interconnect structures (612, 618, 622, 628). Generally, first metal interconnect structures (612, 618, 622, 628) formed within at least one lower-level dielectric layer (601, 610, 620) may be formed over the semiconductor material layer 9 that is located in the substrate 8.

According to an aspect of the present disclosure, a transistor, such as thin film transistors (TFTs) may be subsequently formed in a metal interconnect level that overlies that metal interconnect levels that contain the lower-level dielectric layers (601, 610, 620) and the first metal interconnect structures (612, 618, 622, 628). In one embodiment, a planar dielectric layer having a uniform thickness may be formed over the lower-level dielectric layers (601, 610, 620). The planar dielectric layer is herein referred to as an insulating material layer 635. The insulating material layer 635 includes a dielectric material such as undoped silicate glass, a doped silicate glass, organosilicate glass, or a porous dielectric material, and may be deposited by chemical vapor deposition. The thickness of the insulating material layer 635 may be in a range from 20 nm to 300 nm, although lesser and greater thicknesses may also be used.

Generally, interconnect-level dielectric layers (such as the lower-level dielectric layer (601, 610, 620)) containing therein the metal interconnect structures (such as the first metal interconnect structures (612, 618, 622, 628)) may be formed over semiconductor devices. The insulating material layer 635 may be formed over the interconnect-level dielectric layers.

In one embodiment, the substrate 8 may include a single crystalline silicon substrate, and lower-level dielectric layers (601, 610, 620) embedding lower-level metal interconnect structures (612, 618, 622, 628) may be located above the single crystalline silicon substrate. Field effect transistors 701 including a respective portion of the single crystalline silicon substrate as a channel may be embedded within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating material layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 2 nm to 40 nm, such as from 4 nm to 20 nm, although lesser and greater thicknesses may also be used.

Referring to FIGS. 2A-2C, a region of the first exemplary structure is illustrated, which corresponds to an area in which a thin film transistor may be subsequently formed. While the present disclosure is described using a single instance of a thin film transistor, it is understood that multiple instances of the thin film transistor may be simultaneously formed in any of the exemplary structures of the present disclosure.

An insulating layer 42 may be formed over the insulating material layer 635 and the optional etch stop dielectric layer 636. The insulating layer 42 includes a dielectric material such as undoped silicate glass, a doped silicate glass, organosilicate glass, or a porous dielectric material, and may be deposited by chemical vapor deposition. The thickness of the insulating layer 42 may be in a range from 20 nm to 300 nm, although lesser and greater thicknesses may also be used. Multiple thin film transistors may be subsequently formed over the insulating layer 42. In one embodiment, the multiple thin film transistors may be arranged along a first horizontal direction hd1 and a second horizontal direction hd2, which may be perpendicular to the first horizontal direction hd1.

Referring to FIGS. 3A-3C, a photoresist layer (not shown) may be applied over a top surface of the insulating layer 42, and may be lithographically patterned to form an opening within the illustrated area. In one embodiment, the opening may be a rectangular opening having a pair of widthwise sidewalls along the first horizontal direction and having a pair of lengthwise sidewalls along the second horizontal direction hd2. An anisotropic etch process may be performed to transfer the pattern of the openings in the photoresist layer into an upper portion of the insulating layer 42. A recess region 11 may be formed in an upper portion of the insulating layer 42. The recess region 11 is also referred to as a bottom gate trench.

In one embodiment, the width of the recess region 11 along the first horizontal direction hd1 may be in a range from 20 nm to 300 nm, although lesser and greater widths may also be used. In one embodiment, the length of the recess region 11 along the second horizontal direction hd2 may be in a range from 30 nm to 3,000 nm, although lesser and greater lengths may also be used. The depth of the recess region 11 may be the same as the thickness of the insulating layer 42. Thus, a top surface of the optional etch stop dielectric layer 636 or a top surface of the insulating material layer 635 (in embodiments in which the etch stop dielectric layer 636 is not used). The photoresist layer may be subsequently removed, for example, by ashing.

Referring to FIGS. 4A-4C, at least one conductive material may be deposited in the recess region 11. The at least one conductive material may include, for example, a metallic barrier liner material (such as TiN, TaN, and/or WN) and a metallic fill material (such as Cu, W, Mo, Co, Ru, etc.). Other suitable metallic barrier liner material and metallic fill materials within the contemplated scope of disclosure may also be used. Excess portions of the at least one conductive material may be removed from above the horizontal plane including the top surface of the insulating layer 42 by a planarization process, which may include a chemical mechanical polishing (CMP) process and/or a recess etch process. The planarization process may use a chemical mechanical polishing process or a recess etch process. A bottom gate electrode 15 may be formed in the recess region 11. The bottom gate electrode 15 may be the only electrode of a thin film transistor to be subsequently formed, or may be one of two gate electrodes of a thin film transistor in embodiments in which a top gate electrode may be subsequently formed. The top surface of the bottom gate electrode 15 may be located within a same horizontal plane as the top surface of the insulating layer 42.

Referring to FIGS. 5A-5D, a continuous bottom gate dielectric layer 10L and a continuous active layer 20L may be sequentially deposited over the insulating layer 42 and the bottom gate electrode 15 as continuous material layers. The continuous bottom gate dielectric layer 10L may be formed by deposition of at least one gate dielectric material. The gate dielectric material may include, but is not limited to, silicon oxide, silicon oxynitride, silicon nitride, a dielectric metal oxide (such as aluminum oxide, hafnium oxide, yttrium oxide, zirconium oxide, lanthanum oxide, etc.), or a stack thereof. Other suitable dielectric materials are within the contemplated scope of disclosure. The gate dielectric material may be deposited by atomic layer deposition (ALD) or chemical vapor deposition (CVD). The thickness of the continuous bottom gate dielectric layer 10L may be in a range from 1 nm to 12 nm, such as from 2 nm to 6 nm, although lesser and greater thicknesses may also be used.

According to an embodiment of the present disclosure, the continuous bottom gate dielectric layer 10L may include, and/or may consist of, a dielectric metal oxide material including a first metallic element, a second metallic element, and oxygen. In one embodiment, the continuous bottom gate dielectric layer 10L may be deposited by a chemical vapor deposition or an atomic layer deposition such that the continuous bottom gate dielectric layer 10L has a vertical compositional modulation in which an atomic percentage of the second metallic element has a minimum at a height that is vertically spaced both from a bottom surface of the continuous bottom gate dielectric layer 10L and from a top surface of the continuous bottom gate dielectric layer 10L. For example, the atomic percentage of the second metallic element may be at a minimum at a height of about 30% to 70% of the thickness of the continuous bottom gate dielectric layer 10L as measured from the bottom surface of the continuous bottom gate dielectric layer 10L. In one embodiment, the atomic percentage of the second metallic element may be less than the average atomic percentage of the second metallic element within an entire volume of the continuous bottom gate dielectric layer 10L within a height range from about 25% to about 75% of the thickness of the continuous bottom gate dielectric layer 10L as measured from the bottom surface of the continuous bottom gate dielectric layer 10L.

In one embodiment, the first metallic element may be zirconium, aluminum, silicon, or strontium, and the second metallic element may be selected from an outer transition metal element (having an incomplete d shell), an inner transition metal element (such as a Lanthanide or an Actinide and having an incomplete f shell), and aluminum. For example, the second metallic element may include hafnium, lanthanum, yttrium, titanium, and tantalum. In one embodiment, the second metallic element may include hafnium. Generally, the continuous bottom gate dielectric layer 10L may have a material composition of $G_\gamma D_\delta O$, in which $\gamma$ and $\delta$ are variables that change with a vertical distance from a horizontal plane including a bottom surface of the continuous bottom gate dielectric layer 10L, G is the first metallic element, and D is the second metallic element. The ratio of $\gamma$ to $\delta$ may be less than 1.0 at a lower portion 10W of the continuous bottom gate dielectric layer 10L, greater than 1.0 at a middle portion 10M of the continuous bottom gate dielectric layer 10L, and less than 1.0 at an upper portion 10U of the continuous bottom gate dielectric layer 10L. In one embodiment, the height at which the ratio of $\gamma$ to $\delta$ is 1.0, as measured from the horizontal plane including the bottom surface of the continuous bottom gate dielectric layer 10L, may be in a range from 15% to 40% of the thickness of the continuous bottom gate dielectric layer 10L for the interface between the lower portion 10W and the middle portion 10M, and may be in a range from 60% to 85% of the thickness of the continuous bottom gate dielectric layer 10L for the interface between the middle portion 10M and the upper portion 10U.

In an illustrative example, the first metallic element may be zirconium, aluminum, silicon, or strontium, and the second metallic element may be hafnium. In this embodiment, the continuous bottom gate dielectric layer 10L may have a general material composition selected from HfOx:ZrOy, HfOx:AlOy, HfOx:SiOy, or HfOx:SrO, in which each x and each y may be an independent variable that changes along the vertical direction. In one embodiment, the fraction of the oxide of the first metallic element (i.e., ZrOy, AlOy, SiOy, or SrO) within the middle portion 10M may be greater than 0.6 and less than 1.0, and the fraction of the oxide of the first metallic element within the lower portion 10W and the upper portion 10U may be less than 0.4 and greater than 0.0.

In embodiments in which the first metallic element is zirconium, aluminum, silicon, or strontium, a higher percentage of first metallic element tends to increase leakage current in the continuous bottom gate dielectric layer 10L. A compositionally graded structure in which the percentage of zirconium is lower in the middle portion 10M of the continuous bottom gate dielectric layer 10L than in the lower portion 10W and the upper portion 10U of the continuous bottom gate dielectric layer 10L reduces the leakage current in the surface portions of the continuous bottom gate dielectric layer 10L.

The continuous active layer 20L may be deposited over continuous bottom gate dielectric layer 10L. In one embodiment, the continuous active layer 20L includes a semiconducting metal oxide material providing electrical conductivity in a range from 1.0 S/m to $1.0 \times 10^5$ S/m upon suitable doping with electrical dopants (which may be p-type dopants or n-type dopants).

Exemplary semiconducting metal oxide materials that may be used for the continuous active layer include, but are not limited to, quaternary compounds such as indium gallium zinc oxide (IGZO), indium tungsten zinc oxide, tin gallium zinc oxide, and tin tungsten zinc oxide, and ternary compounds such as indium tin oxide, indium gallium oxide, indium zinc oxide, indium tungsten oxide, tin gallium oxide, and tin tungsten oxide, and quinary compounds such as indium gallium zinc tin oxide. In one embodiment, the semiconducting metal oxide material of the continuous active layer 20L may include an heavy-post-transition-metal-containing oxide material or a plurality of heavy-post-transition-metal-containing oxide materials.

As used herein, post-transition metal elements refer to metal elements that are not alkali metals, alkaline earth metals, outer transition metals, or inner transition metals (i.e., Lanthanides and Actinides). Thus, post-transition metal elements include aluminum, zinc, gallium, cadmium, indium tin, mercury, thallium, lead, bismuth, and polonium. Light post-transition metal elements include aluminum, zinc, and gallium. Heavy post-transition metal elements include cadmium, indium tin, mercury, thallium, lead, bismuth, and polonium.

In one embodiment, the continuous active layer 20L includes, from bottom to top, a front channel layer 20F, a bulk semiconductor layer 20K, and a back channel layer 20B. The front channel layer 20F includes a portion of the continuous active layer 20L that is proximal to the continuous bottom gate dielectric layer 10L. The back channel layer 20B includes a portion of the continuous active layer 20L that is distal from the continuous bottom gate dielectric layer 10L. The bulk semiconductor layer 20K includes a portion of the continuous active layer 20L located between the front channel layer 20F and the back channel layer 20B. Each of the front channel layer 20F, bulk semiconductor layer 20K, and the back channel layer 20B includes a respective heavy-post-transition-metal-containing metal oxide material. The front channel layer 20F and the bulk semiconductor layer 20K may independently include InO, SnO, a ternary heavy-post-transition-metal-containing metal oxide material, a quaternary heavy-post-transition-metal-containing metal oxide material, a quinary heavy-post-transition-metal-containing metal oxide material, etc. The back channel layer 20B may include a ternary heavy-post-transition-metal-containing metal oxide material, a quaternary heavy-post-transition-metal-containing metal oxide material, a quinary heavy-post-transition-metal-containing metal oxide material, etc.

The continuous active layer 20L may include an amorphous semiconducting metal oxide material. According to an aspect of the present disclosure, the continuous active layer 20L may be formed by depositing multiple iterations of a unit layer stack deposition process. Each unit layer stack deposition process includes an acceptor-type oxide deposition process that deposits an oxide of an acceptor-type element selected from Ga and W in the form of an acceptor-type oxide layer, a post-transition metal oxide deposition process that deposits an oxide of a heavy post-transition metal element selected from In and Sn in the form of a post-transition metal oxide layer, and optionally includes a zinc oxide deposition process that deposits zinc oxide in the form of a zinc oxide layer.

Each acceptor-type oxide deposition process may include an atomic layer deposition process. Each post-transition metal oxide deposition process may include an atomic layer deposition process. Each zinc oxide deposition process, if used, includes an atomic layer deposition process. The thickness of the continuous active layer 20L may be in a range from 3 nm to 100 nm, such as from 5 nm to 50 nm and/or from 10 nm to 30 nm, although lesser and greater thicknesses may also be used.

In one embodiment, the average material composition of the continuous active layer 20L may be $M_\alpha A_\beta Zn_\gamma O$, in which M is a heavy post-transition metal element such as indium or tin, A is an acceptor-type element such as gallium or tungsten, $\alpha$ is in a range from 0.25 to 0.50, $\beta$ is in a range from 0.12 to 0.25, and $\gamma$ is in a range from 0.25 to 0.50. Alternatively, the average material composition of the continuous active layer 20L may be $M_\epsilon A_\eta O$, in which M is a heavy post-transition metal element such as indium or tin, A is an acceptor-type element such as gallium or tungsten, c is in a range from 0.30 to 0.70, and $\eta$ is in a range from 0.15 to 0.40.

According to an aspect of the present disclosure, each of the acceptor-type oxide layers, the post-transition metal oxide layers, and the optional zinc oxide layers may be deposited by a respective atomic layer deposition process. Use of the atomic layer deposition process provides precise thickness control of each layer, and limits vertical diffusion of metallic elements within each of the acceptor-type oxide layers, the post-transition metal oxide layers, and the optional zinc oxide layers. As a consequence, vertical modulation of metallic elements within the continuous active layer 20L may be provided.

According to an aspect of the present disclosure, the continuous active layer 20L includes a compound semiconductor material (which may comprise an inhomogeneous compound semiconductor material including vertical compositional gradient therein) comprising oxygen, an acceptor-type element selected from Ga and W, and a heavy post-transition metal element selected from In and Sn. The atomic percentage of the at least one heavy post-transition metal element at the bottom surface portion (such as the front channel layer 20F) of the continuous active layer 20L that contacts the continuous bottom gate dielectric layer 10L is higher than the atomic percentage of the at least one heavy post-transition metal element at a top surface portion (such as the back channel layer 20B) of the continuous active layer 20L (which is located on an opposite side of the continuous bottom gate dielectric layer 10L). In one embodiment, the atomic percentage of the at least one heavy post-transition metal element at the bottom surface portion may be greater than 25%, and may be in a range from 25% to 40%. The atomic percentage of the at least one heavy post-transition metal element at the top surface portion may be less than 25%, and may be in a range from 0% to 20%, such as from 5% to 20%.

In one embodiment, the continuous active layer 20L may be formed by performing multiple instances of a unit set of atomic layer deposition (ALD) steps that includes a first ALD step that deposits an acceptor-type element oxide selected from GaO and WO, and a second ALD step that deposits a heavy post-transition metal element oxide selected from InO and SnO. The ratio of a duration of the first ALD step to a duration of the second ALD step in each instance of the unit set of ALD steps increases or decreases during performance of the multiple instances of the unit set of ALD steps. In one embodiment, the atomic percentage of the at least one acceptor-type element (such as Ga or W) in the front channel layer 20F (which may be located at the bottom surface portion of the continuous active layer 20L) is lower than the atomic percentage of the at least one acceptor-type element in the back channel layer 20B (which may be located at the top surface portion of the continuous active layer 20L). In one embodiment, the atomic percentage of the at least one acceptor-type element at the bottom surface of the continuous active layer 20L may be lower than the atomic percentage of the at least one acceptor-type element at the top surface of the continuous active layer 20L.

In one embodiment, the compound semiconductor material of the continuous active layer 20L includes zinc, and the atomic percentage of zinc at the bottom surface of the continuous active layer 20L may be lower than the atomic percentage of zinc at the top surface of the continuous active layer 20L.

FIGS. 6A-6E illustrate first, second, third, fourth, and fifth exemplary vertical atomic percentage profiles of various elements within the continuous active layer 20L within the first exemplary structure of FIGS. 5A-5C, respectively, according to the first embodiment of the present disclosure.

Referring to FIG. 6A, the atomic percentage of the at least one heavy post-transition metal element 21H may decrease throughout the entire thickness range of the continuous active layer 20L as a function of a vertical distance from the continuous bottom gate dielectric layer 10L. The atomic percentage of the at least one acceptor-type element 21A may increase throughout the entire thickness range of the continuous active layer 20L as a function of a vertical distance from the continuous bottom gate dielectric layer 10L. The atomic percentage of zinc 21Z may increase throughout the entire thickness range of the continuous active layer 20L as a function of a vertical distance from the continuous bottom gate dielectric layer 10L. The atomic percentage of oxygen 21O remains constant or substantially constant as illustrated in FIG. 6A.

Figure 6B:
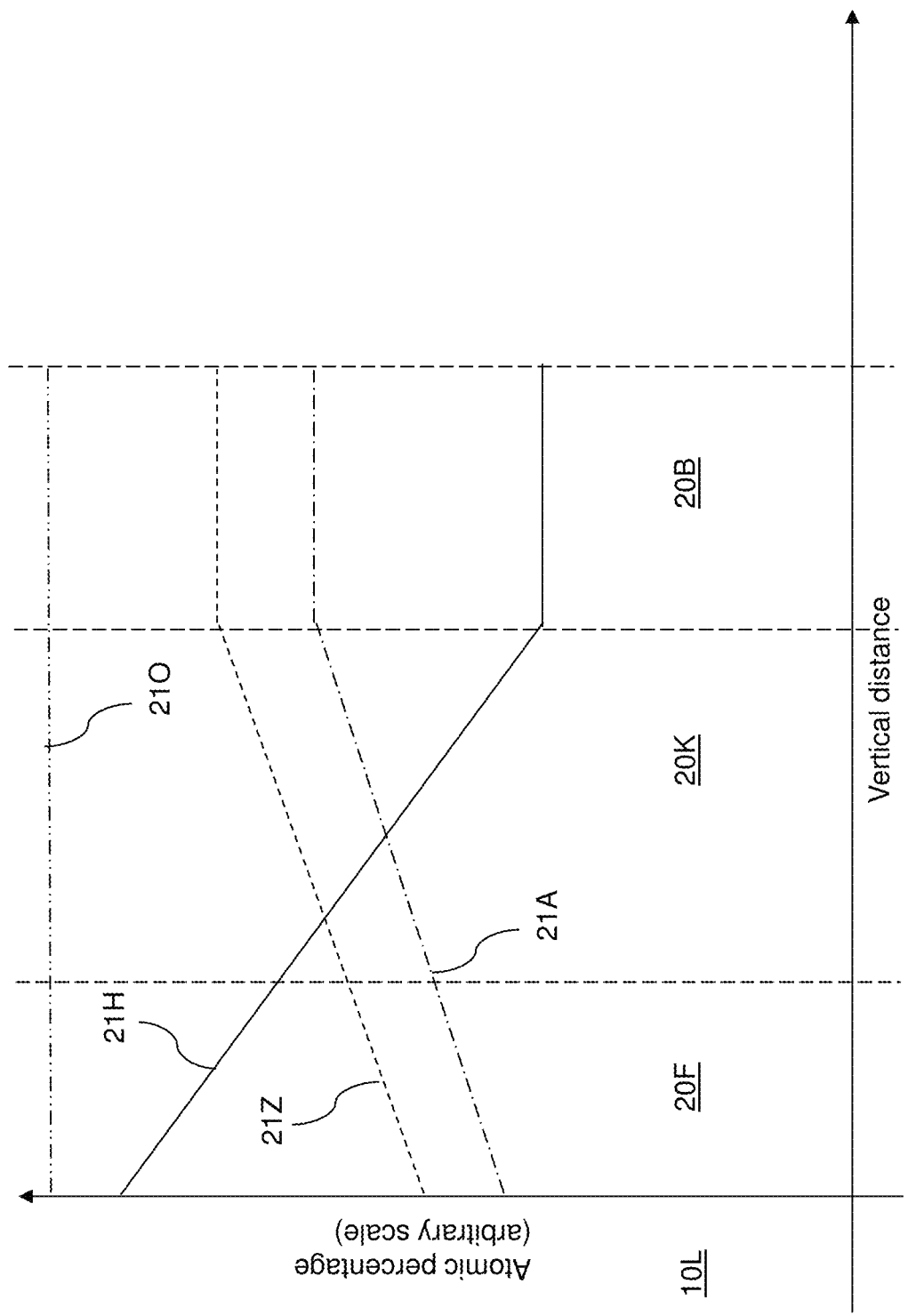
FIG. 6B is a second exemplary vertical atomic percentage profile of various elements within the continuous active layer within the first exemplary structure of FIGS. 5A-5C according to the first embodiment of the present disclosure.

Referring to FIG. 6B, the atomic percentage of the at least one heavy post-transition metal element 21H may decrease throughout the front channel layer 20F and the bulk semiconductor layer 20K as a function of a vertical distance from the continuous bottom gate dielectric layer 10L. The atomic percentage of the at least one acceptor-type element 21A may increase throughout the front channel layer 20F and the bulk semiconductor layer 20K as a function of a vertical distance from the continuous bottom gate dielectric layer 10L. The atomic percentage of zinc 21Z may increase throughout the front channel layer 20F and the bulk semiconductor layer 20K as a function of a vertical distance from the continuous bottom gate dielectric layer 10L. The atomic percentage of the at least one heavy post-transition metal element 21H may be uniform in the back channel layer 20B. The atomic percentage of the at least one acceptor-type element 21A may be uniform in the back channel layer 20B. The atomic percentage of zinc 21Z may be uniform in the back channel layer 20B. The atomic percentage of oxygen 21O remains constant or substantially constant as illustrated in FIG. 6B.

Referring to FIG. 6C, the atomic percentage of the at least one heavy post-transition metal element 21H may decrease throughout the front channel layer 20F as a function of a vertical distance from the continuous bottom gate dielectric layer 10L. The atomic percentage of the at least one acceptor-type element 21A may increase throughout the front channel layer 20F as a function of a vertical distance from the continuous bottom gate dielectric layer 10L. The atomic percentage of zinc 21Z may increase throughout the front channel layer 20F as a function of a vertical distance from the continuous bottom gate dielectric layer 10L. The atomic percentage of the at least one heavy post-transition metal element 21H may be uniform in the bulk semiconductor layer 20K and the back channel layer 20B. The atomic percentage of the at least one acceptor-type element 21A may be uniform in the bulk semiconductor layer 20K and the back channel layer 20B. The atomic percentage of zinc 21Z may be uniform in the bulk semiconductor layer 20K and the back channel layer 20B. The atomic percentage of oxygen 21O remains constant or substantially constant as illustrated in FIG. 6C.

Figure 6D:
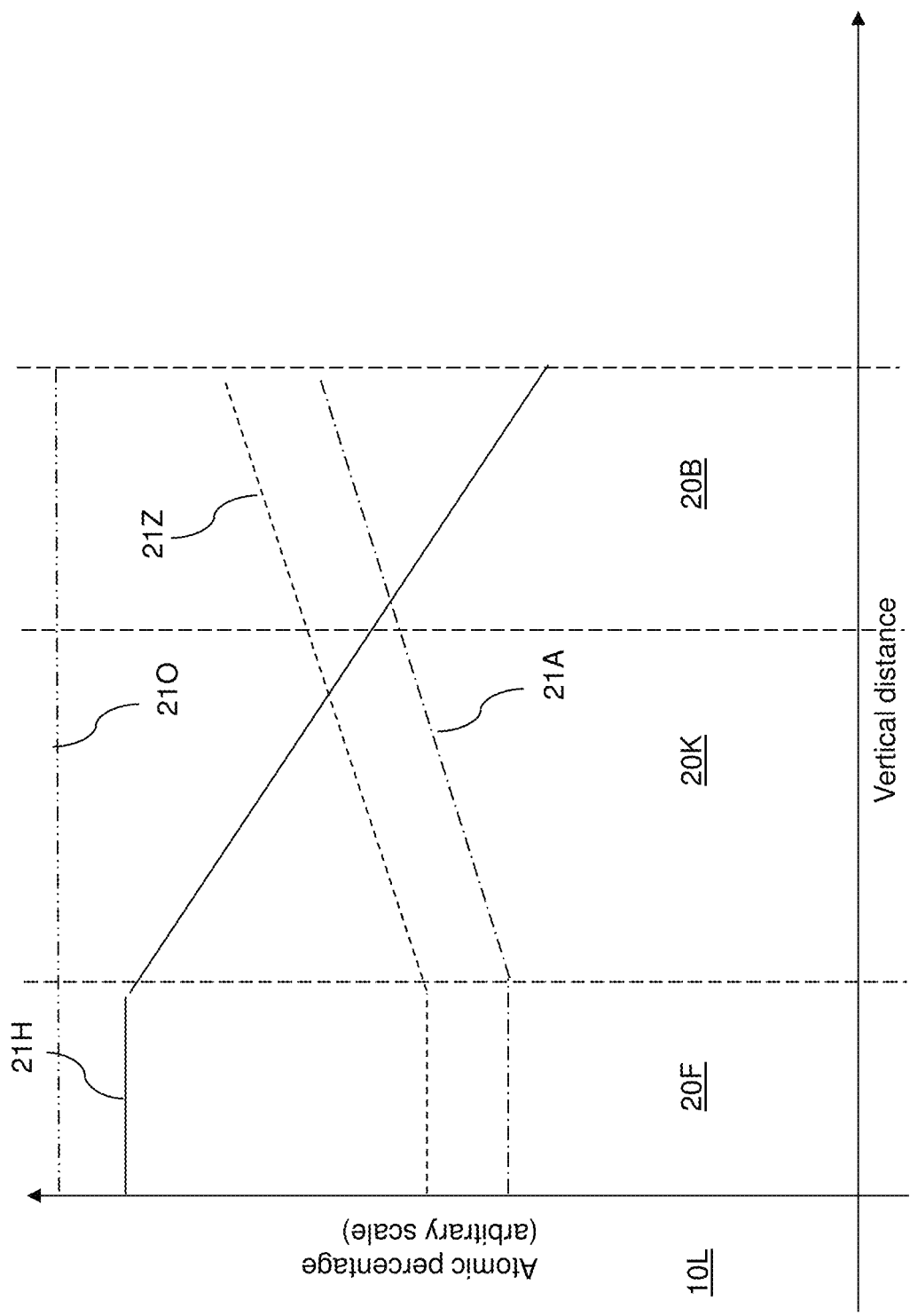
FIG. 6D is a fourth exemplary vertical atomic percentage profile of various elements within the continuous active layer within the first exemplary structure of FIGS. 5A-5C according to the first embodiment of the present disclosure.

Referring to FIG. 6D, the atomic percentage of the at least one heavy post-transition metal element 21H may decrease throughout the bulk semiconductor layer 20K and the back channel layer 20B as a function of a vertical distance from the continuous bottom gate dielectric layer 10L. The atomic percentage of the at least one acceptor-type element 21A may increase throughout the bulk semiconductor layer 20K and the back channel layer 20B as a function of a vertical distance from the continuous bottom gate dielectric layer 10L. The atomic percentage of zinc 21Z may increase throughout the bulk semiconductor layer 20K and the back channel layer 20B as a function of a vertical distance from the continuous bottom gate dielectric layer 10L. The atomic percentage of the at least one heavy post-transition metal element 21H may be uniform in the front channel layer 20F. The atomic percentage of the at least one acceptor-type element 21A may be uniform in the front channel layer 20F. The atomic percentage of zinc 21Z may be uniform the front channel layer 20F. The atomic percentage of oxygen 21O remains constant or substantially constant as illustrated in FIG. 6D.

Figure 6E:
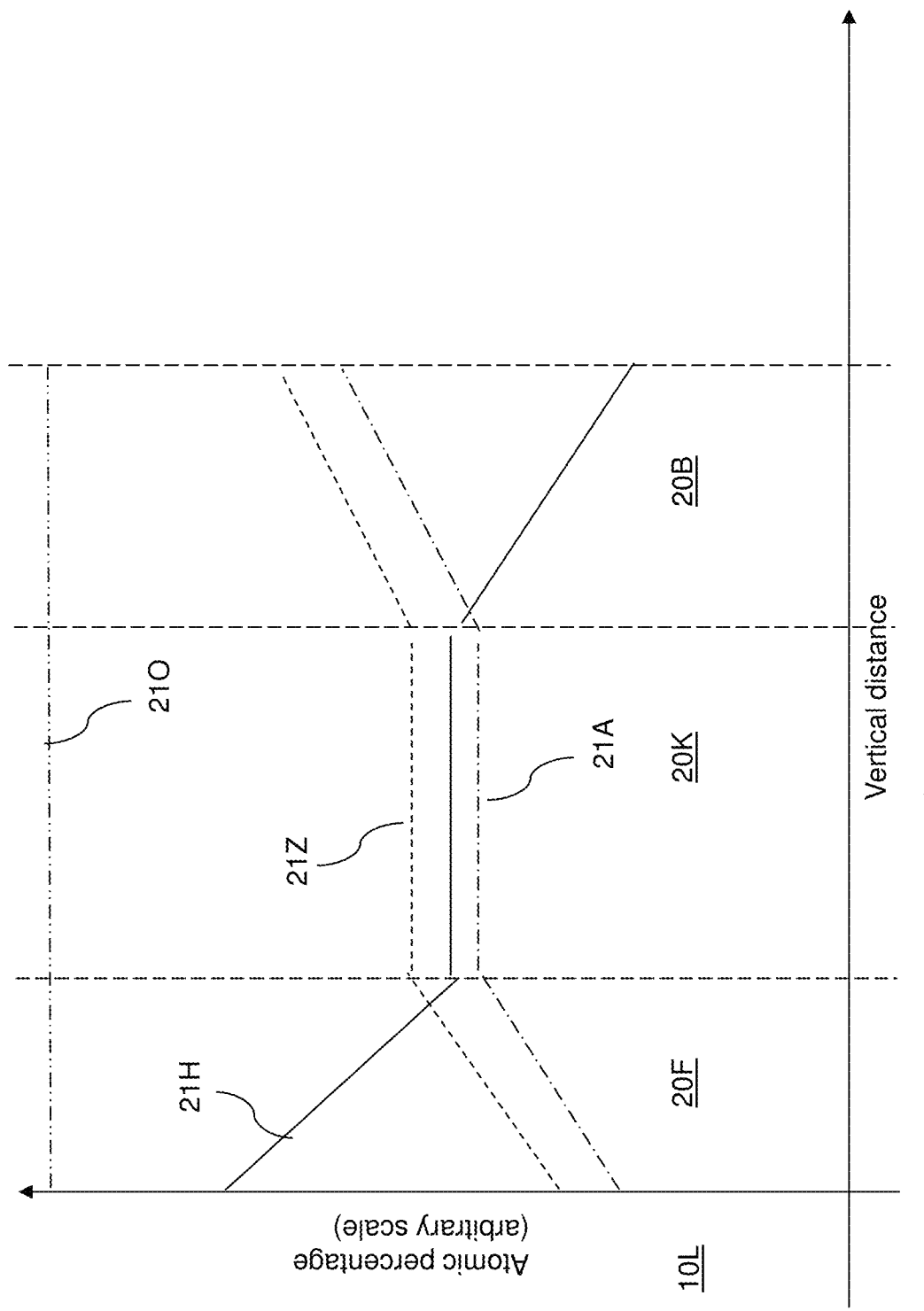
FIG. 6E is a fifth exemplary vertical atomic percentage profile of various elements within the continuous active layer within the first exemplary structure of FIGS. 5A-5C according to the first embodiment of the present disclosure.

Referring to FIG. 6E, the atomic percentage of the at least one heavy post-transition metal element 21H may decrease throughout the front channel layer 20F and the back channel layer 20B as a function of a vertical distance from the continuous bottom gate dielectric layer 10L. The atomic percentage of the at least one acceptor-type element 21A may increase throughout the front channel layer 20F and the back channel layer 20B as a function of a vertical distance from the continuous bottom gate dielectric layer 10L. The atomic percentage of zinc 21Z may increase throughout the front channel layer 20F and the back channel layer 20B as a function of a vertical distance from the continuous bottom gate dielectric layer 10L. The atomic percentage of the at least one heavy post-transition metal element 21H may be uniform in the bulk semiconductor layer 20K. The atomic percentage of the at least one acceptor-type element 21A may be uniform in the bulk semiconductor layer 20K. The atomic percentage of zinc 21Z may be uniform the bulk semiconductor layer 20K. The atomic percentage of oxygen 21O remains constant or substantially constant as illustrated in FIG. 6E.

Figure 7:
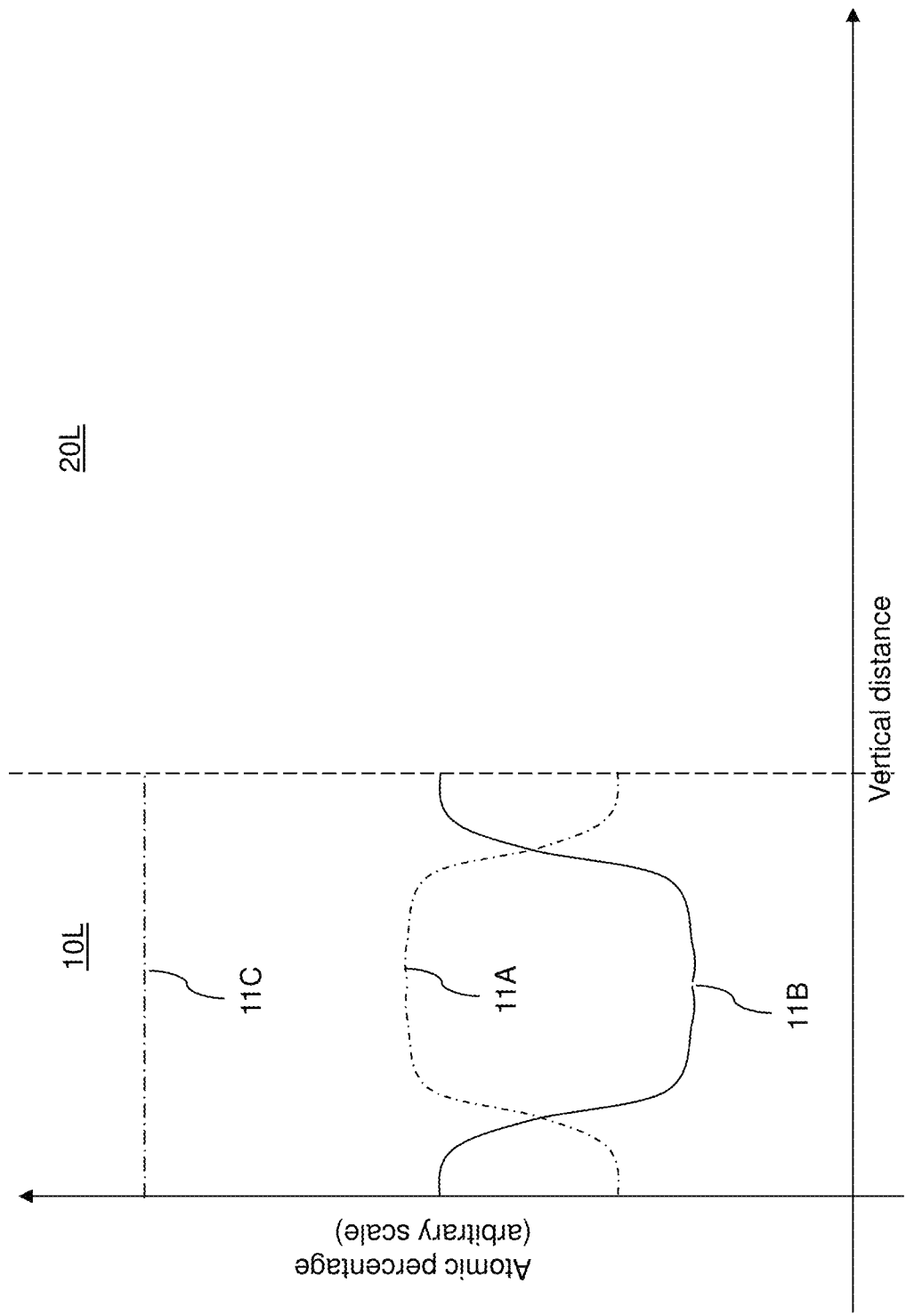
FIG. 7 is a vertical atomic percentage profile of the continuous bottom gate dielectric layer within the first exemplary structure of FIGS. 5A-5C according to the first embodiment of the present disclosure.

Referring to FIG. 7, a vertical compositional profile of various metallic elements within the continuous bottom gate dielectric layer 10L is illustrated for an embodiment in which the continuous bottom gate dielectric layer 10L includes a dielectric metal oxide material having a vertical compositional modulation. In this embodiment, the continuous bottom gate dielectric layer 10L may include a first metallic element (such as zirconium, aluminum, silicon, or strontium), a second metallic element (such as hafnium), and oxygen. Within the vertical compositional modulation of the continuous bottom gate dielectric layer 10L, an atomic percentage of the second metallic element has a minimum at a height that is vertically spaced from a bottom surface of the continuous bottom gate dielectric layer 10L and from a top surface of the continuous bottom gate dielectric layer 10L as illustrated by curve 11B. Within the vertical compositional modulation of the continuous bottom gate dielectric layer 10L, an atomic percentage of the first metallic element has a maximum at a height that is vertically spaced from a bottom surface of the bottom gate dielectric 10 and from a top surface of the continuous bottom gate dielectric layer 10L as illustrated by curve 11A. The atomic percentage of oxygen remains constant as illustrated by curve 11C.

Figure 8C:
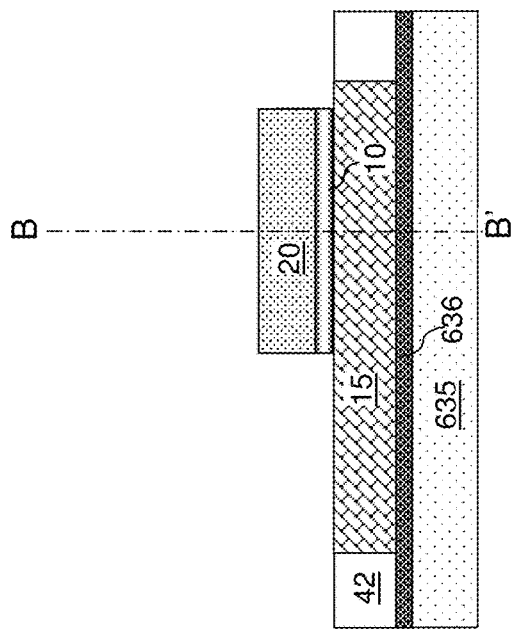
FIG. 8C is a vertical cross-sectional view of the first exemplary structure along the vertical plane C-C' of FIG. 8A.
Figure 8A:
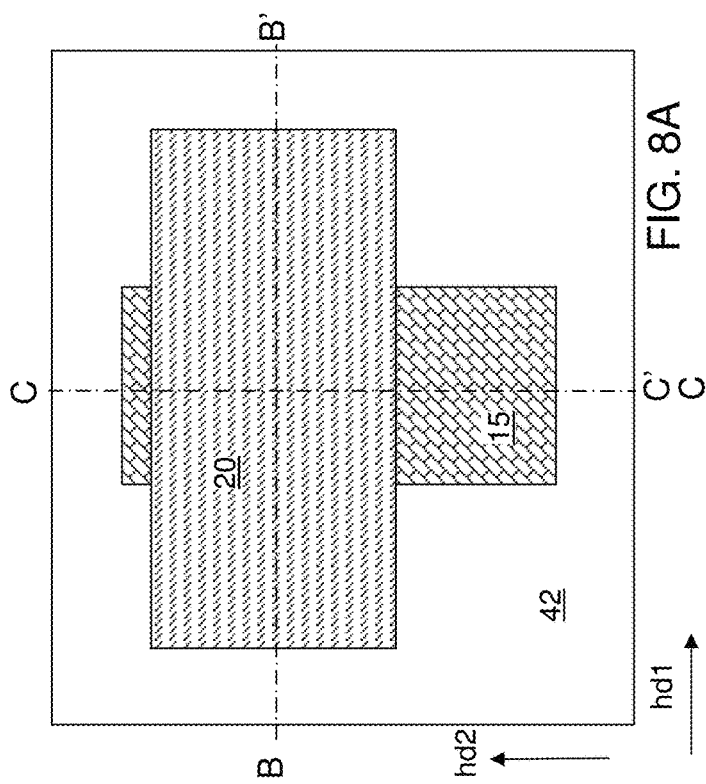
FIG. 8A is a top-down view of a region of the first exemplary structure after formation of a bottom gate dielectric and an active layer according to the first embodiment of the present disclosure.
Figure 8B:
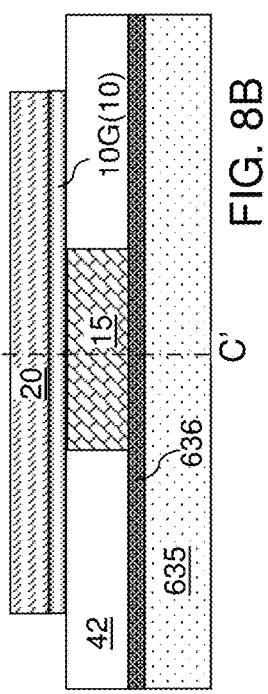
FIG. 8B is a vertical cross-sectional view of the first exemplary structure along the vertical plane B-B' of FIG. 8A.

Referring to FIGS. 8A-8C, a photoresist layer (not shown) may be applied over the continuous active layer 20L, and may be lithographically patterned to form discrete patterned photoresist material portions straddling a respective bottom gate electrode 15 along the first horizontal direction hd1. In one embodiment, each patterned portion of the photoresist layer may have a horizontal cross-sectional shape of a rectangle or a rounded rectangle. The pattern in the photoresist layer may be transferred through the continuous active layer 20L and the continuous bottom gate dielectric layer 10L by performing an anisotropic etch process. Each patterned portion of the continuous active layer 20L includes an active layer 20. Each patterned portion of the continuous bottom gate dielectric layer 10L includes a bottom gate dielectric 10.

In one embodiment, each active layer 20 may have a horizontal cross-sectional shape of a rectangle or a rounded rectangle, or may have a substantially rectangular horizontal cross-sectional shape. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

Generally, a vertical stack of a bottom gate electrode 15, a bottom gate dielectric 10, and an active layer 20 may be formed over lower-level dielectric layers (601, 610, 620) that overlies a substrate 8. The sidewalls of the bottom gate dielectric 10 and the active layer 20 may be vertically coincident, i.e., may be located within same vertical planes. The photoresist layer may be subsequently removed, for example, by ashing. In embodiments in which the bottom gate dielectric 10 includes a compositionally graded dielectric material having a vertical compositional gradient, the bottom gate dielectric 10 is herein referred to as a graded bottom gate dielectric 10G.

Referring to FIGS. 9A-9C, a dielectric layer 48 may be deposited over the active layer 20. The dielectric layer 48 is also referred to as an electrode-level dielectric layer. The dielectric layer 48 includes a dielectric material such as undoped silicate glass, a doped silicate glass, organosilicate glass, or a stack thereof. Optionally, the dielectric layer 48 may be planarized to provide a flat top surface. The set of the insulating layer 42 and the dielectric layer 48 is herein referred to as a thin-film-transistor-level (TFT-level) dielectric layer 40, i.e., a dielectric layer that is located at the level of thin film transistors. The dielectric layer 48 may be formed from the same or different dielectric material as forms insulating layer 42.

Referring to FIGS. 10A-10C, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a source cavity 51, a drain cavity 59, and a bottom gate contact via cavity 19. The anisotropic etch process may be selective to the materials of the active layer 20 and the bottom gate electrode 15.

Referring to FIGS. 11A-11C, at least one conductive material may be deposited in the cavities (51, 19, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. In one embodiment, the at least one conductive material may comprise a combination of the metallic liner material and the metallic fill material described above. Each remaining portion of the at least one conductive material filling a drain cavity 59 constitutes a drain electrode 56. Each remaining portion of the at least one conductive material filling a backside electrode contact via cavity 19 constitutes a backside electrode contact via structure 18, which contacts a top surface of the bottom gate electrode 15.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a bottom gate contact metallic liner 16 that is a remaining portion of the metallic liner material, and a bottom gate contact metallic fill material portion 17 that is a remaining portion of the metallic fill material.

Referring to FIGS. 12A-12C, a second exemplary structure according to a second embodiment of the present disclosure may be derived from the first exemplary structure by using a bottom gate dielectric 10 having a homogeneous material composition throughout. In this embodiment, the bottom gate dielectric 10 is herein referred to as a homogeneous bottom gate dielectric 10H.

Referring to FIGS. 13A-13D, a third exemplary structure according to a third embodiment of the present disclosure may be provided by forming an active layer 20 over a buffer layer 110. In one embodiment, the buffer layer 110 may include an insulating material layer that may be formed over the insulating material layer 635 of the first exemplary structure illustrated in FIG. 1. In this embodiment, the buffer layer 110 may include a silicon oxide layer, a silicon nitride layer, and/or a porous or non-porous organosilicate glass layer. Alternatively, the buffer layer 110 may include a semiconducting metal oxide substrate (having a thickness in a range from 60 microns to 1 mm) or a semiconducting metal oxide layer having a higher electrical resistivity than the active layer 20, for example, by a factor of at least 10, such as by a factor in a range from 10 to $10^6$. Yet alternatively, the buffer layer 110 may include an insulating substrate such as a glass substrate or a sapphire substrate (i.e., an aluminum oxide substrate) having a thickness in a range from 60 microns to 1 mm.

In one embodiment, the buffer layer 110 may be located between the substrate 8 and the active layer 20, and may include a semiconductor material having a higher electrical resistivity than any portion of the active layer 20. The active layer 20 may be located on a top surface of the buffer layer 110.

According to an aspect of the present disclosure, the active layer 20 may be formed by deposition of a continuous active layer having a vertical compositional profile that is flipped upside down from the vertical composition profile of the continuous active layer 20L of the first exemplary structure. In this embodiment, the entire set of atomic layer deposition steps used to form the continuous active layer 20L of the first exemplary structure may be performed in a reverse order to form the continuous active layer of the third exemplary structure. Subsequently, the continuous active layer may be patterned into the active layer 20.

According to an aspect of the present disclosure, the continuous active layer may be formed by depositing multiple iterations of a unit layer stack deposition process. Each unit layer stack deposition process includes an acceptor-type oxide deposition process that deposits an oxide of an acceptor-type element selected from Ga and W in the form of an acceptor-type oxide layer, a post-transition metal oxide deposition process that deposits an oxide of a heavy post-transition metal element selected from In and Sn in the form of a post-transition metal oxide layer, and optionally includes a zinc oxide deposition process that deposits zinc oxide in the form of a zinc oxide layer.

Each acceptor-type oxide deposition process may include an atomic layer deposition process. Each post-transition metal oxide deposition process may include an atomic layer deposition process. Each zinc oxide deposition process, if used, includes an atomic layer deposition process. The thickness of the continuous active layer may be in a range from 3 nm to 100 nm, such as from 5 nm to 50 nm and/or from 10 nm to 30 nm, although lesser and greater thicknesses may also be used.

In one embodiment, the average material composition of the continuous active layer may be $M_\alpha A_\beta Zn_\gamma O$, in which M is a heavy post-transition metal element such as indium or tin, A is an acceptor-type element such as gallium or tungsten, $\alpha$ is in a range from 0.25 to 0.50, $\beta$ is in a range from 0.12 to 0.25, and $\gamma$ is in a range from 0.25 to 0.50. Alternatively, the average material composition of the continuous active layer may be $M_\epsilon A_\eta O$, in which M is a heavy post-transition metal element such as indium or tin, A is an acceptor-type element such as gallium or tungsten, $\epsilon$ is in a range from 0.30 to 0.70, and $\eta$ is in a range from 0.15 to 0.40.

According to an aspect of the present disclosure, each of the acceptor-type oxide layers, the post-transition metal oxide layers, and the optional zinc oxide layers may be deposited by a respective atomic layer deposition process. Use of the atomic layer deposition process provides precise thickness control of each layer, and limits vertical diffusion of metallic elements within each of the acceptor-type oxide layers, the post-transition metal oxide layers, and the optional zinc oxide layers. As a consequence, vertical modulation of metallic elements within the continuous active layer may be provided.

As a patterned portion of the continuous active layer, the active layer 20 of the third exemplary structure includes, from bottom to top, a back channel layer 20B, a bulk semiconductor layer 20K, and a front channel layer 20F. The front channel layer 20F includes a portion of the active layer 20 that is distal from the buffer layer 110. The back channel layer 20B includes a portion of the active layer 20 that is proximal to the buffer layer 110. The bulk semiconductor layer 20K includes a portion of the active layer 20 located between the front channel layer 20F and the back channel layer 20B. Each of the front channel layer 20F, bulk semiconductor layer 20K, and the back channel layer 20B includes a respective heavy-post-transition-metal-containing metal oxide material, which may be a semiconducting metal oxide material including oxygen and at least one of In and Sn. The front channel layer 20F and the bulk semiconductor layer 20K may independently include InO, SnO, a ternary heavy-post-transition-metal-containing metal oxide material, a quaternary heavy-post-transition-metal-containing metal oxide material, a quinary heavy-post-transition-metal-containing metal oxide material, etc. The back channel layer 20B may include a ternary heavy-post-transition-metal-containing metal oxide material, a quaternary heavy-post-transition-metal-containing metal oxide material, a quinary heavy-post-transition-metal-containing metal oxide material, etc. The active layer 20 may include an amorphous semiconducting metal oxide material.

According to an aspect of the present disclosure, the active layer 20 includes a compound semiconductor material (which may be an inhomogeneous compound semiconductor material having a vertical compositional gradient therein) comprising oxygen, an acceptor-type element selected from Ga and W, and a heavy post-transition metal element selected from In and Sn. The atomic percentage of the at least one heavy post-transition metal element at the top surface portion (such as the front channel layer 20F) of the active layer 20 is higher than the atomic percentage of the at least one heavy post-transition metal element at a bottom surface portion (such as the back channel layer 20B) of the active layer 20. In one embodiment, the atomic percentage of the at least one heavy post-transition metal element at the top surface portion may be greater than 25%, and may be in a range from 25% to 40%. The atomic percentage of the at least one heavy post-transition metal element at the bottom surface portion may be less than 25%, and may be in a range from 0% to 20%, such as from 5% to 20%.

In one embodiment, the continuous active layer may be formed by performing multiple instances of a unit set of atomic layer deposition (ALD) steps that includes a first ALD step that deposits an acceptor-type element oxide selected from GaO and WO, and a second ALD step that deposits a heavy post-transition metal element oxide selected from InO and SnO. The ratio of a duration of the first ALD step to a duration of the second ALD step in each instance of the unit set of ALD steps increases or decreases during performance of the multiple instances of the unit set of ALD steps. In one embodiment, the atomic percentage of the at least one acceptor-type element (such as Ga or W) in the front channel layer 20F (which may be located at the top surface portion of the active layer 20) is lower than the atomic percentage of the at least one acceptor-type element in the back channel layer 20B (which may be located at the bottom surface portion of the active layer 20). In one embodiment, the atomic percentage of the at least one acceptor-type element at the top surface of the active layer 20 may be lower than the atomic percentage of the at least one acceptor-type element at the bottom surface of the active layer 20.

In one embodiment, the inhomogeneous compound semiconductor material of the active layer 20 includes zinc, and the atomic percentage of zinc at the top surface of the active layer 20 may be lower than the atomic percentage of zinc at the bottom surface of the active layer 20.

FIGS. 14A-14E illustrate first, second, third, fourth, and fifth exemplary vertical atomic percentage profiles of various elements within the active layer 20 within the third exemplary structure of FIGS. 13A-13D, respectively, according to the third embodiment of the present disclosure.

Figure 14A:
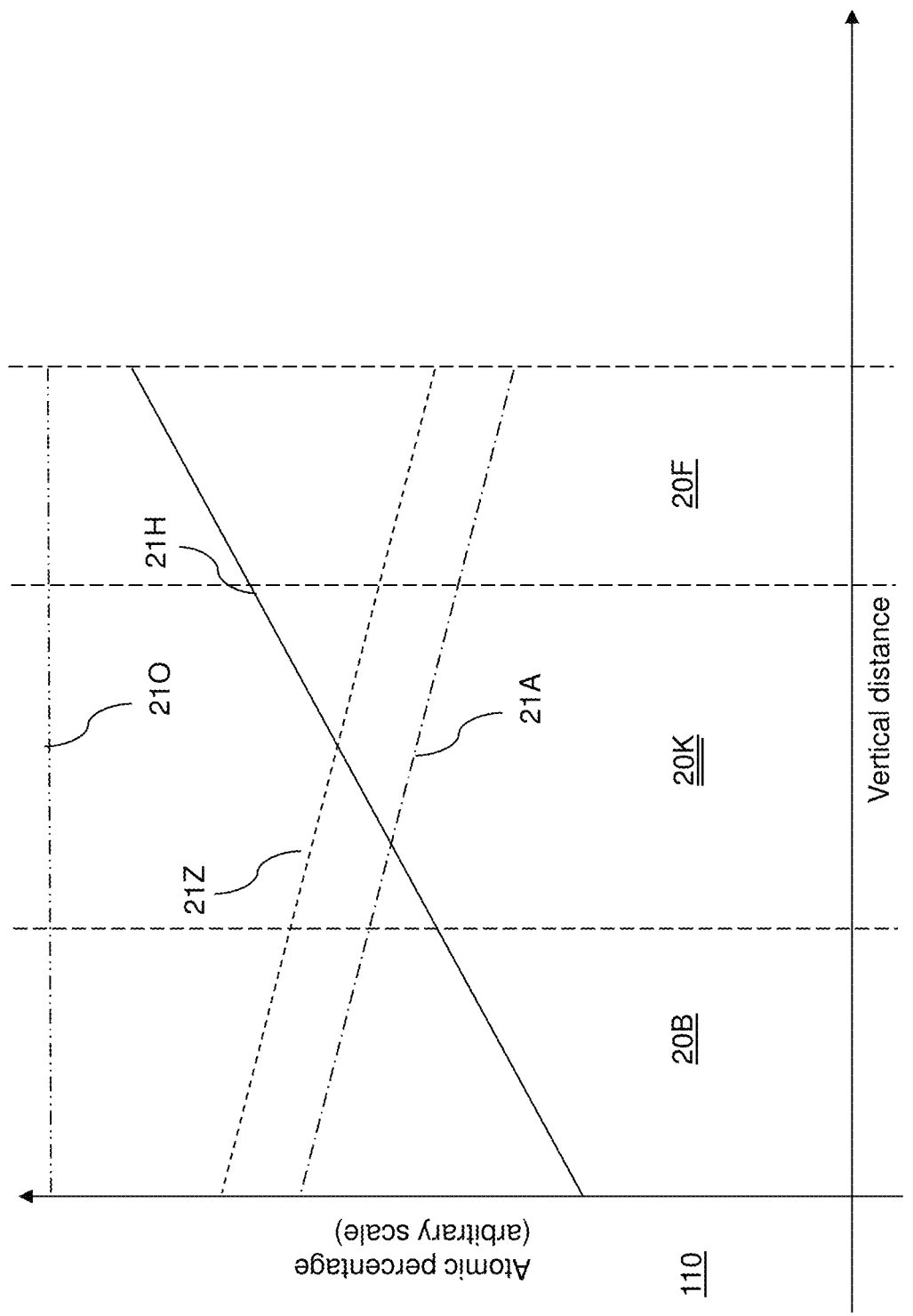
FIG. 14A is a first exemplary vertical atomic percentage profile of various elements within the continuous active layer within the third exemplary structure of FIGS. 13A-13C according to the third embodiment of the present disclosure.

Referring to FIG. 14A, the atomic percentage of the at least one heavy post-transition metal element 21H may increase throughout the entire thickness range of the active layer 20 as a function of a vertical distance from the buffer layer 110. The atomic percentage of the at least one acceptor-type element 21A may decrease throughout the entire thickness range of the active layer 20 as a function of a vertical distance from the buffer layer 110. The atomic percentage of zinc 21Z may decrease throughout the entire thickness range of the active layer 20 as a function of a vertical distance from the buffer layer 110. The atomic percentage of oxygen 21O remains constant or substantially constant as illustrated in FIG. 14A.

Figure 14B:
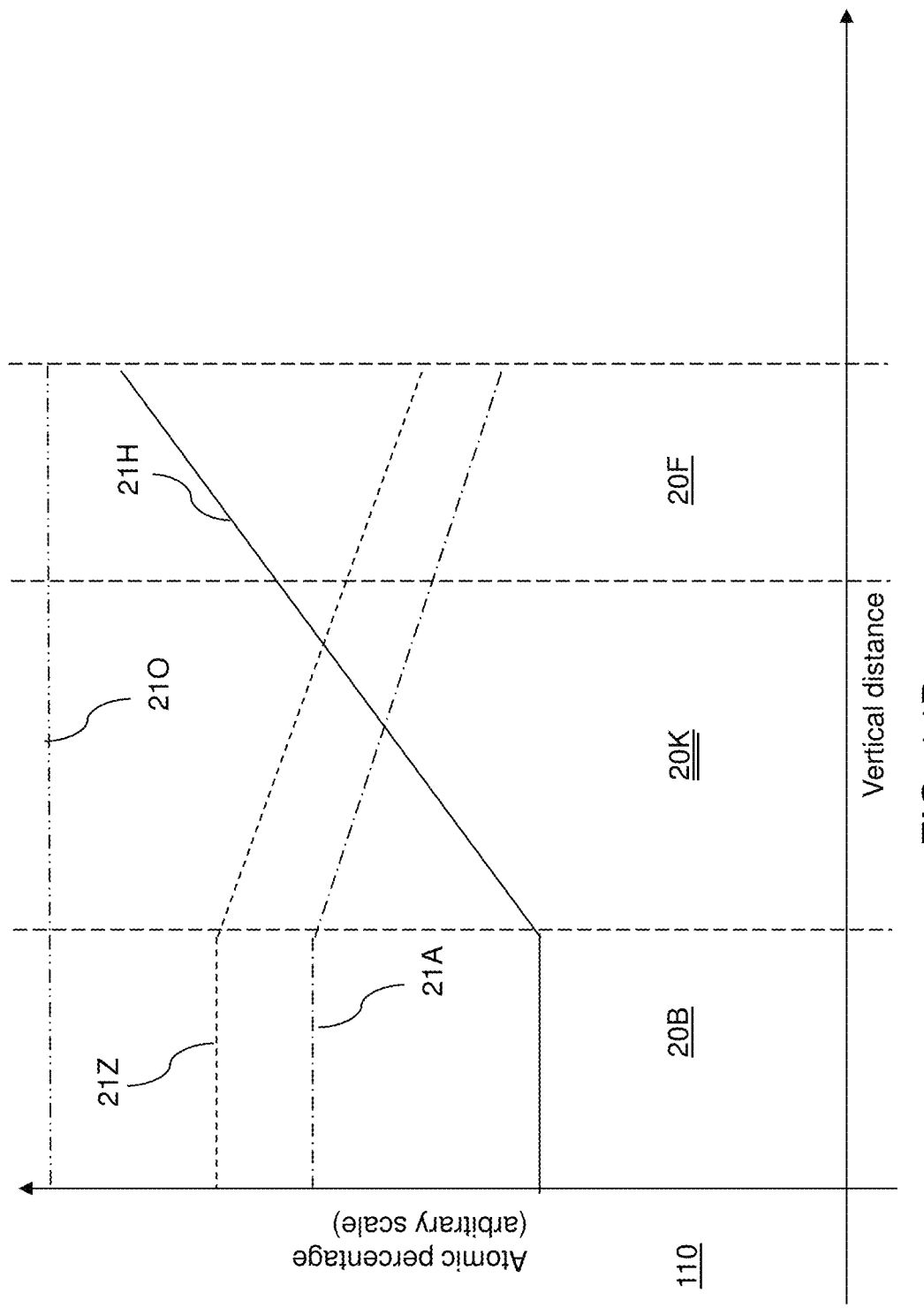
FIG. 14B is a second exemplary vertical atomic percentage profile of various elements within the continuous active layer within the third exemplary structure of FIGS. 13A-13C according to the third embodiment of the present disclosure.

Referring to FIG. 14B, the atomic percentage of the at least one heavy post-transition metal element 21H may increase throughout the front channel layer 20F and the bulk semiconductor layer 20K as a function of a vertical distance from the buffer layer 110. The atomic percentage of the at least one acceptor-type element 21A may decrease throughout the front channel layer 20F and the bulk semiconductor layer 20K as a function of a vertical distance from the buffer layer 110. The atomic percentage of zinc 21Z may decrease throughout the front channel layer 20F and the bulk semiconductor layer 20K as a function of a vertical distance from the buffer layer 110. The atomic percentage of the at least one heavy post-transition metal element 21H may be uniform in the back channel layer 20B. The atomic percentage of the at least one acceptor-type element 21A may be uniform in the back channel layer 20B. The atomic percentage of zinc 21Z may be uniform in the back channel layer 20B. The atomic percentage of oxygen 21O remains constant or substantially constant as illustrated in FIG. 14B.

Figure 14C:
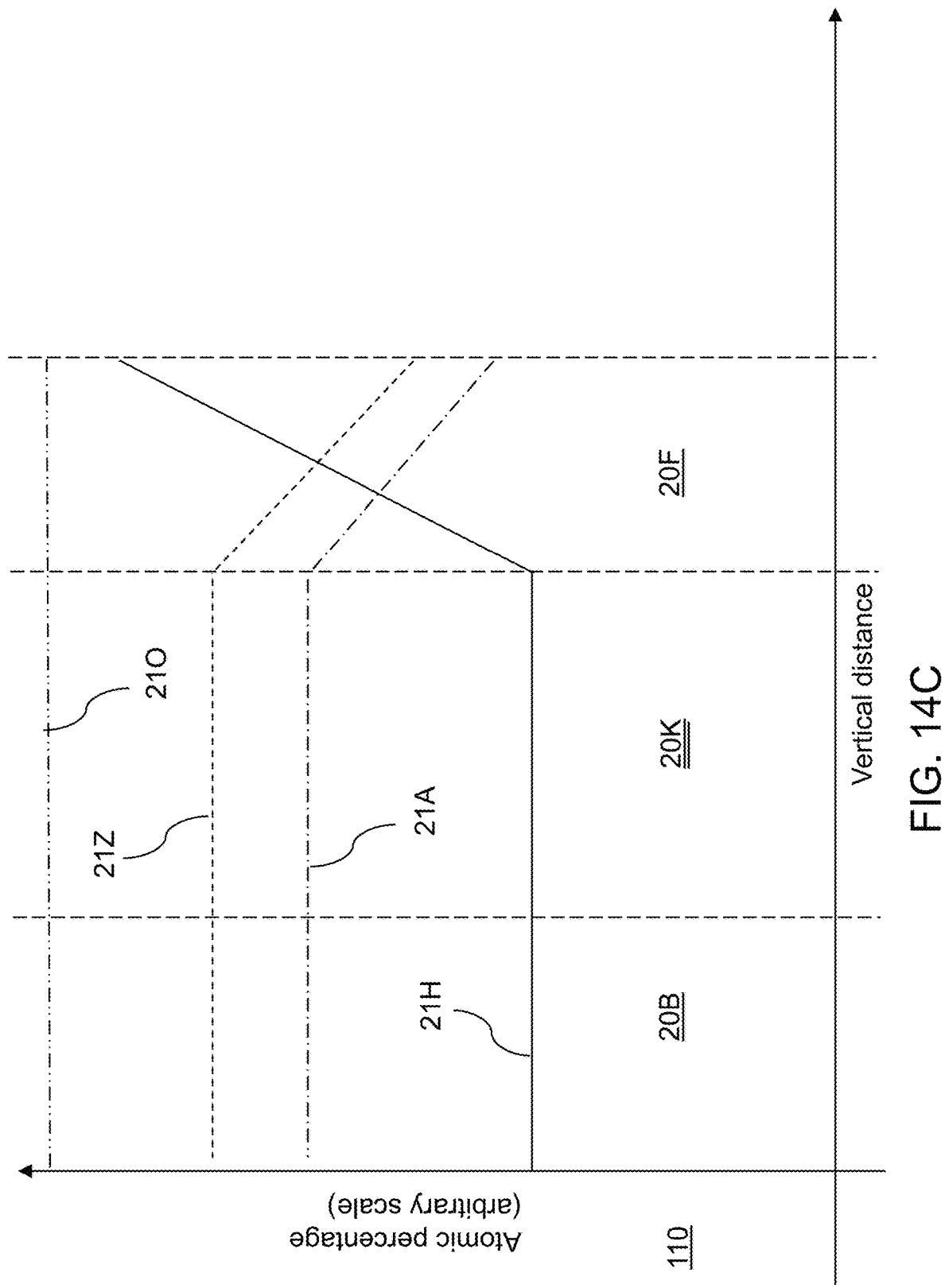
FIG. 14C is a third exemplary vertical atomic percentage profile of various elements within the continuous active layer within the third exemplary structure of FIGS. 13A-13C according to the third embodiment of the present disclosure.
Figure 14D:
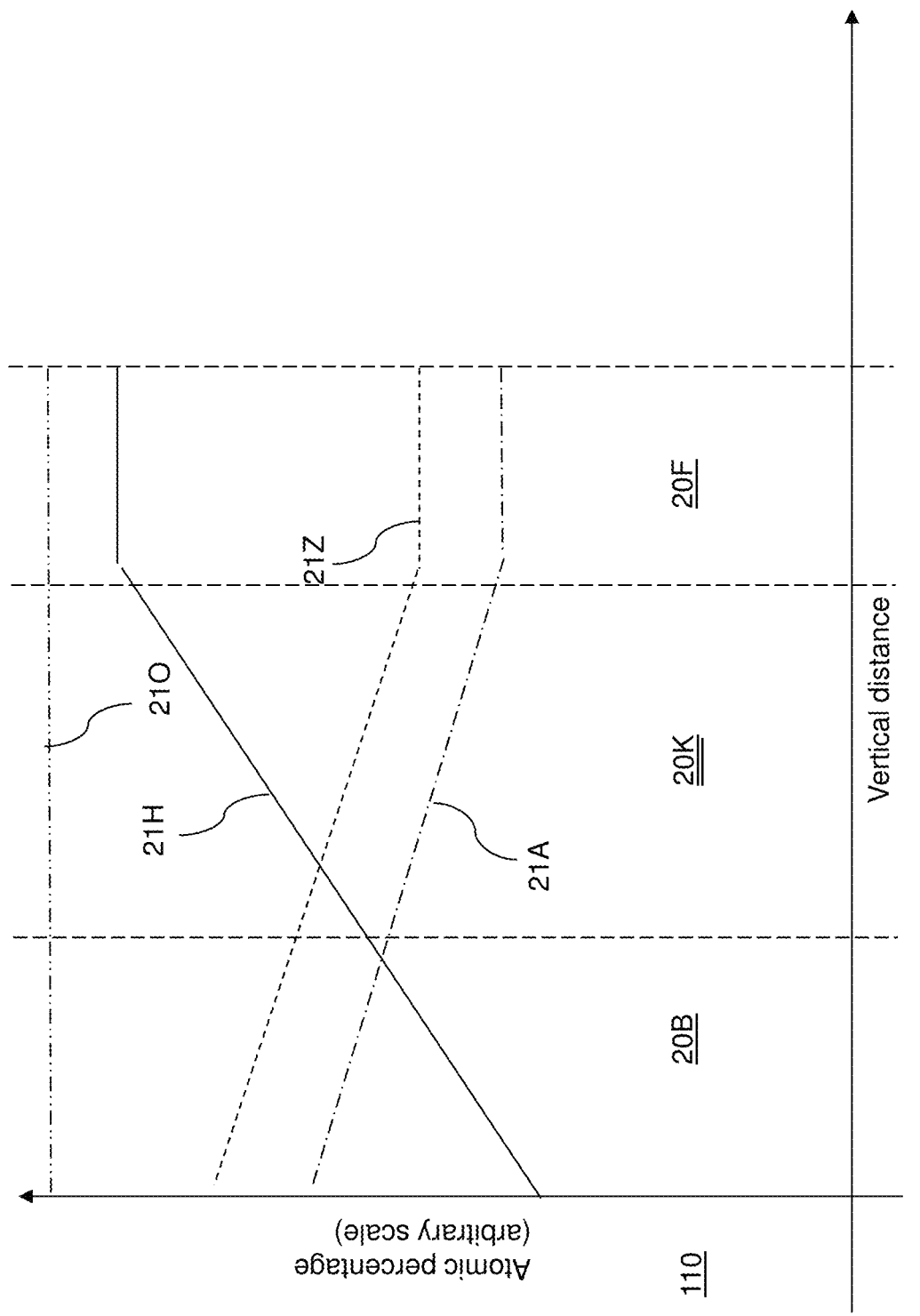
FIG. 14D is a fourth exemplary vertical atomic percentage profile of various elements within the continuous active layer within the third exemplary structure of FIGS. 13A-13C according to the third embodiment of the present disclosure.

Referring to FIG. 14C, the atomic percentage of the at least one heavy post-transition metal element 21H may increase throughout the front channel layer 20F as a function of a vertical distance from the buffer layer 110. The atomic percentage of the at least one acceptor-type element 21A may decrease throughout the front channel layer 20F as a function of a vertical distance from the buffer layer 110. The atomic percentage of zinc 21Z may decrease throughout the front channel layer 20F as a function of a vertical distance from the buffer layer 110. The atomic percentage of the at least one heavy post-transition metal element 21H may be uniform in the bulk semiconductor layer 20K and the back channel layer 20B. The atomic percentage of the at least one acceptor-type element 21A may be uniform in the bulk semiconductor layer 20K and the back channel layer 20B. The atomic percentage of zinc 21Z may be uniform in the bulk semiconductor layer 20K and the back channel layer 20B. The atomic percentage of oxygen 21O remains constant or substantially constant as illustrated in FIG. 14C Referring to FIG. 14D, the atomic percentage of the at least one heavy post-transition metal element 21H may increase throughout the bulk semiconductor layer 20K and the back channel layer 20B as a function of a vertical distance from the buffer layer 110. The atomic percentage of the at least one acceptor-type element 21A may decrease throughout the bulk semiconductor layer 20K and the back channel layer 20B as a function of a vertical distance from the buffer layer 110. The atomic percentage of zinc 21Z may decrease throughout the bulk semiconductor layer 20K and the back channel layer 20B as a function of a vertical distance from the buffer layer 110. The atomic percentage of the at least one heavy post-transition metal element 21H may be uniform in the front channel layer 20F. The atomic percentage of the at least one acceptor-type element 21A may be uniform in the front channel layer 20F. The atomic percentage of zinc 21Z may be uniform the front channel layer 20F. The atomic percentage of oxygen 21O remains constant or substantially constant as illustrated in FIG. 14D.

Figure 14E:
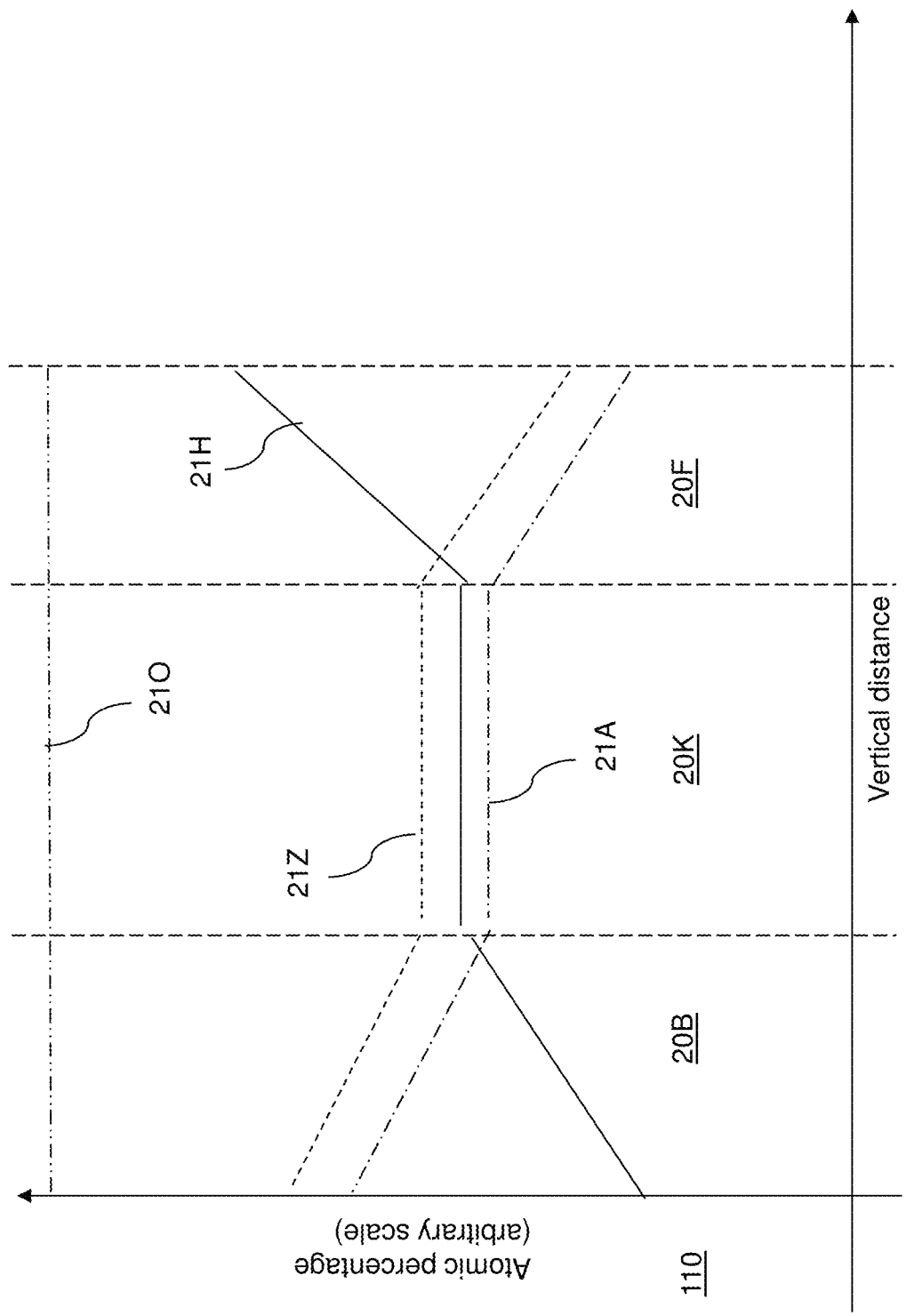
FIG. 14E is a fifth exemplary vertical atomic percentage profile of various elements within the continuous active layer within the third exemplary structure of FIGS. 13A-13C according to the third embodiment of the present disclosure.
Figure 15C:
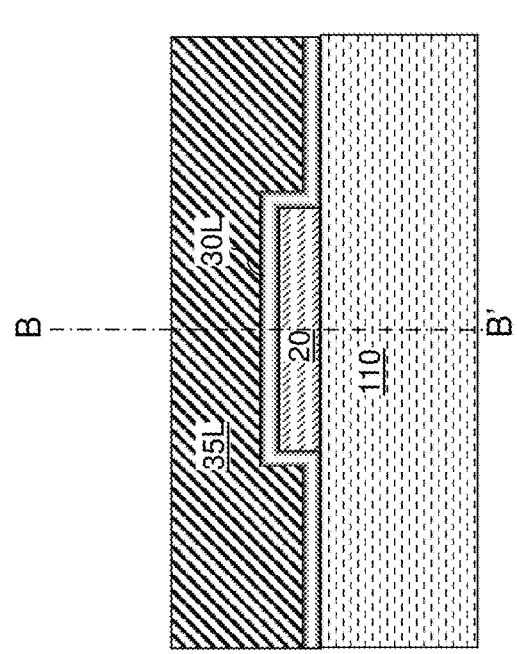
FIG. 15C is a vertical cross-sectional view of the third exemplary structure along the vertical plane C-C' of FIG. 15A.
Figure 15D:
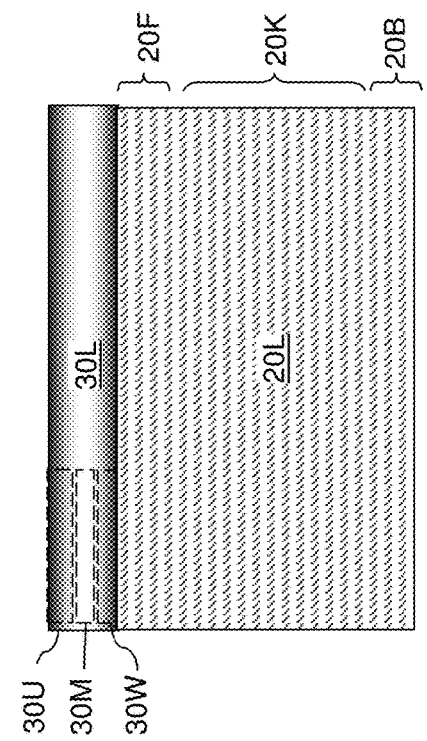
FIG. 15D is a magnified view of region D of FIG. 15B.
Figure 15A:
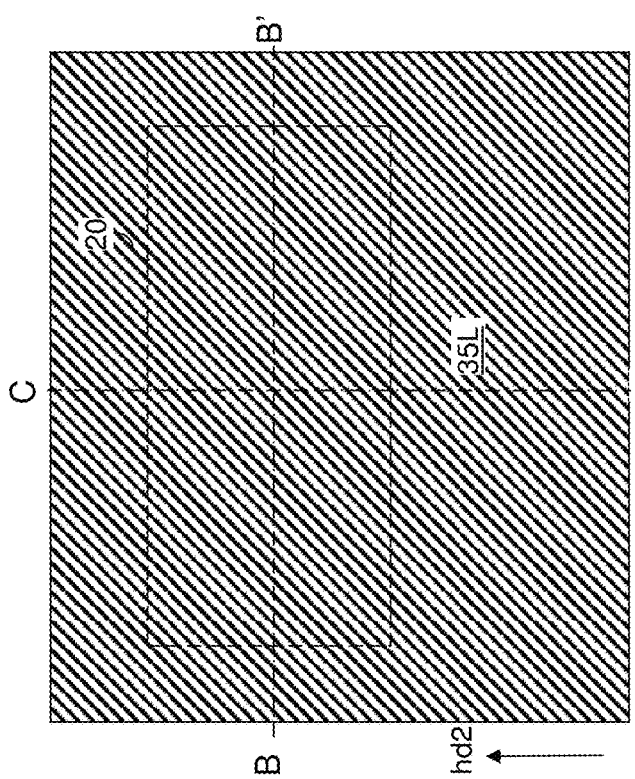
FIG. 15A is a top-down view of a region of the third exemplary structure after formation of a continuous top gate dielectric layer and a continuous top gate electrode layer according to the third embodiment of the present disclosure.
Figure 15B:
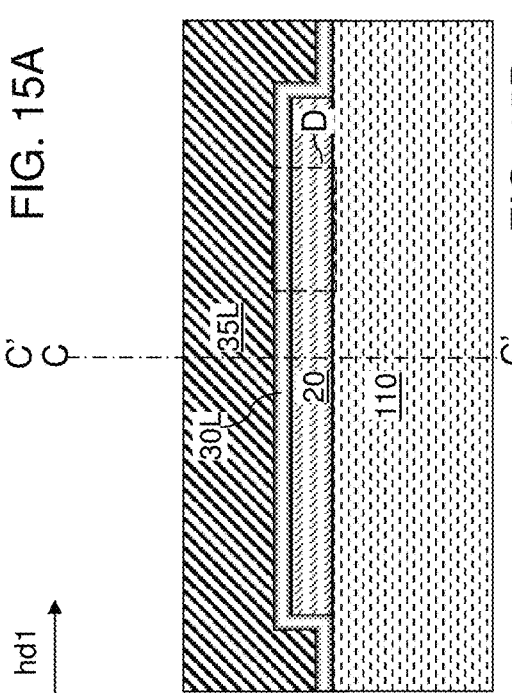
FIG. 15B is a vertical cross-sectional view of the third exemplary structure along the vertical plane B-B' of FIG. 15A.

Referring to FIG. 14E, the atomic percentage of the at least one heavy post-transition metal element 21H may increase throughout the front channel layer 20F and the back channel layer 20B as a function of a vertical distance from the buffer layer 110. The atomic percentage of the at least one acceptor-type element 21A may decrease throughout the front channel layer 20F and the back channel layer 20B as a function of a vertical distance from the buffer layer 110. The atomic percentage of zinc 21Z may decrease throughout the front channel layer 20F and the back channel layer 20B as a function of a vertical distance from the buffer layer 110. The atomic percentage of the at least one heavy post-transition metal element 21H may be uniform in the bulk semiconductor layer 20K. The atomic percentage of the at least one acceptor-type element 21A may be uniform in the bulk semiconductor layer 20K. The atomic percentage of zinc 21Z may be uniform the bulk semiconductor layer 20K. The atomic percentage of oxygen 21O remains constant or substantially constant as illustrated in FIG. 14E.

Referring to FIGS. 15A-15D, a continuous top gate dielectric layer 30L may be deposited over the active layer 20. The continuous top gate dielectric layer 30L may be formed by deposition of at least one gate dielectric material. The gate dielectric material may include, but is not limited to, silicon oxide, silicon oxynitride, a dielectric metal oxide (such as aluminum oxide, hafnium oxide, yttrium oxide, zirconium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the continuous top gate dielectric layer 30L may be in a range from 1 nm to 12 nm, such as from 2 nm to 6 nm, although lesser and greater thicknesses may also be used.

According to an embodiment of the present disclosure, the continuous top gate dielectric layer 30L may include, and/or may consist of, a dielectric metal oxide material including a first metallic element, a second metallic element, and oxygen. In one embodiment, the continuous top gate dielectric layer 30L may be deposited by a chemical vapor deposition or an atomic layer deposition such that the continuous top gate dielectric layer 30L has a vertical compositional modulation in which an atomic percentage of the second metallic element has a minimum at a height that is vertically spaced both from a top surface of the continuous top gate dielectric layer 30L and from a top surface of the continuous top gate dielectric layer 30L. For example, the atomic percentage of the second metallic element may be at a minimum at a height of about 30% to 70% of the thickness of the continuous top gate dielectric layer 30L as measured from a bottom surface of the continuous top gate dielectric layer 30L. In one embodiment, the atomic percentage of the second metallic element may be less than the average atomic percentage of the second metallic element within an entire volume of the continuous top gate dielectric layer 30L within a height range from about 25% to about 75% of the thickness of the continuous top gate dielectric layer 30L as measured from the top surface of the continuous top gate dielectric layer 30L.

In one embodiment, the first metallic element may be zirconium, and the second metallic element may be selected from an outer transition metal element, an inner transition metal element, and aluminum. For example, the second metallic element may include hafnium, lanthanum, yttrium, titanium, tantalum, and aluminum. In one embodiment, the second metallic element may include hafnium. Generally, the continuous top gate dielectric layer 30L may have a material composition of $T_\tau U_\upsilon O$, in which $\tau$ and $\upsilon$ are variables that change with a vertical distance from a horizontal plane including a bottom surface of the continuous top gate dielectric layer 30L, T is the first metallic element, and U is the second metallic element. The ratio of $\tau$ to $\upsilon$ may be less than 1.0 at a lower portion 30W of the continuous top gate dielectric layer 30L, greater than 1.0 at a middle portion 30M of the continuous top gate dielectric layer 30L, and less than 1.0 at an upper portion 30U of the continuous top gate dielectric layer 30L. In one embodiment, the height at which the ratio of $\tau$ to $\upsilon$ is 1.0, as measured from the horizontal plane including the bottom surface of the continuous top gate dielectric layer 30L, may be in a range from 15% to 40% of the thickness of the continuous top gate dielectric layer 30L for the interface between the lower portion 30W and the middle portion 30M, and may be in a range from 60% to 85% of the thickness of the continuous top gate dielectric layer 30L for the interface between the middle portion 30M and the upper portion 30U.

In embodiments in which the first metallic element is zirconium, a higher percentage of zirconium tends to increase leakage current in the continuous top gate dielectric layer 30L. A compositionally graded structure in which the percentage of zirconium is lower in the middle portion 30M of the continuous top gate dielectric layer 30L than in the lower portion 30W and the upper portion 30U of the continuous top gate dielectric layer 30L reduces the leakage current in the surface portions of the continuous top gate dielectric layer 30L.

At least one conductive material layer may be deposited over the continuous top gate dielectric layer 30L to form a continuous top gate electrode layer 35L. The at least one conductive material layer may include, for example, a combination of a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. The thickness of the continuous top gate electrode layer 35L, as measured above the active layer 20, may be in a range from 30 nm to 300 nm, such as from 60 nm to 150 nm, although lesser and greater thicknesses may also be used.

Figure 16:
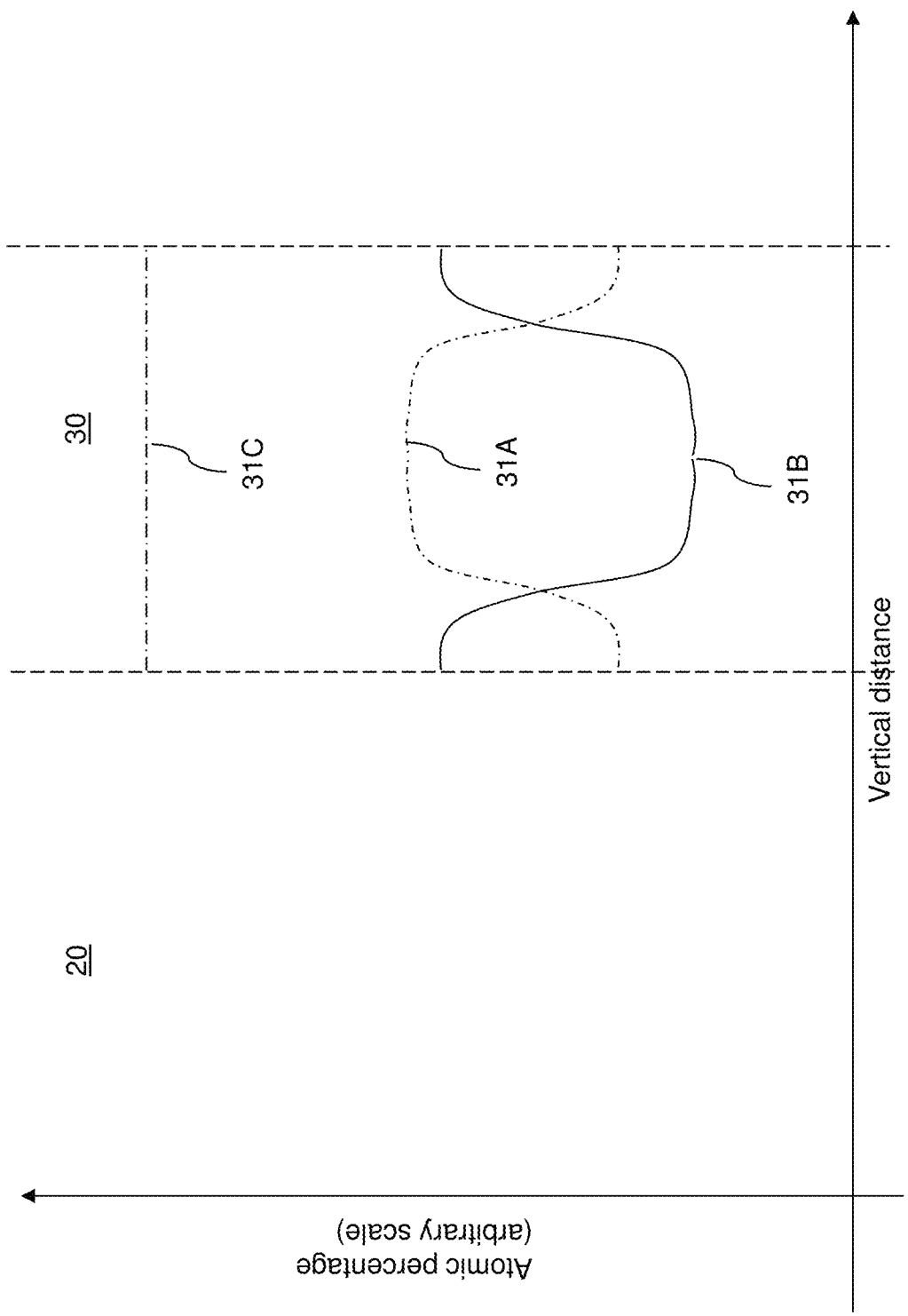
FIG. 16 is a vertical atomic percentage profile of the continuous top gate dielectric layer within the third exemplary structure of FIGS. 15A-15C according to the third embodiment of the present disclosure.

Referring to FIG. 16, a vertical compositional profile of various metallic elements within the top gate dielectric 30 is illustrated for an embodiment in which the top gate dielectric 30 includes a dielectric metal oxide material having a vertical compositional modulation. In this embodiment, the top gate dielectric may include a first metallic element, a second metallic element, and oxygen. Within the vertical compositional modulation of the top gate dielectric 30, an atomic percentage of the second metallic element has a minimum at a height that is vertically spaced from a top surface of the top gate dielectric 30 and from a top surface of the top gate dielectric 30 as illustrated by curve 31B. Within the vertical compositional modulation of the top gate dielectric 30, an atomic percentage of the first metallic element has a maximum at a height that is vertically spaced from a bottom surface of the top gate dielectric 30 and from a top surface of the top gate dielectric 30 as illustrated by curve 31A. The atomic percentage of oxygen remains constant as illustrated by curve 31C. Generally, the material composition of the top gate dielectric 30 is independent of the material composition of the bottom gate dielectric 10.

Referring to FIGS. 17A-17C, a photoresist layer (not shown) may be applied over the continuous top gate electrode layer 35L, and may be lithographically patterned to form discrete photoresist material portions. The pattern in the photoresist material portions may be transferred through the continuous top gate electrode layer 35L by performing an anisotropic etch process. In one embodiment, the anisotropic etch process may be selective to the material of the continuous top gate dielectric layer 30L. Each patterned portion of the continuous top gate electrode layer 35L constitutes a top gate electrode 35.

Optionally, unmasked portions of the continuous top gate dielectric layer 30L may be subsequently removed by an etch process, which may include an anisotropic etch process (such as a reactive ion etch process) or an isotropic etch process (such as a wet etch process). Each patterned portion of the continuous top gate dielectric layer 30L constitutes a top gate dielectric 30. The photoresist layer may be subsequently removed, for example, by ashing.

The top gate electrode 35 straddles the active layer 20 along the second horizontal direction hd2. The height of the top gate electrode 35, as measured in a region overlying the active layer 20 between a bottom surface and a top surface of the top gate electrode 35, may be in a range from 30 nm to 300 nm, such as from 60 nm to 150 nm, although lesser and greater heights may also be used. In embodiments in which the top gate dielectric 30 includes a compositionally graded dielectric material having a vertical compositional gradient, the top gate dielectric 30 is herein referred to as a graded top gate dielectric 30G.

In one embodiment, the top gate dielectric 30 includes a dielectric metal oxide material including a first metallic element (such as zirconium, aluminum, silicon, or strontium), a second metallic element (such as hafnium), and oxygen, and the top gate dielectric 30 has a vertical compositional modulation in which an atomic percentage of the second metallic element has a minimum at a height that is vertically spaced from a bottom surface of the top gate dielectric 30 and from a top surface of the top gate dielectric 30.

Referring to FIGS. 18A-18C, a dielectric layer 48 may be deposited over the top gate electrode 35 and the top gate dielectric 30. The dielectric layer 48 is also referred to as an electrode-level dielectric layer. The dielectric layer 48 includes a dielectric material such as undoped silicate glass, a doped silicate glass, organosilicate glass, or a stack thereof. Optionally, the dielectric layer 48 may be planarized to provide a flat top surface. The dielectric material of the dielectric layer 48 may be planarized so that a planarized horizontal top surface of the dielectric layer 48 is formed within the horizontal plane including the top surface of the top gate electrode 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 19A-19C, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a source cavity 51 and a drain cavity 59. The anisotropic etch process may be selective to the materials of the active layer 20 and the bottom gate electrode 15.

Referring to FIGS. 20A-20C, at least one conductive material may be deposited in the cavities (51, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material.

Referring to FIGS. 21A-21C, a fourth exemplary structure according to a fourth embodiment of the present disclosure may be derived from the third exemplary structure by using a top gate dielectric 30 having a homogeneous material composition throughout. In this embodiment, the top gate dielectric 30 is herein referred to as a homogenous top gate dielectric 30H.

Referring to FIGS. 22A-22C, a fifth exemplary structure according to a fifth embodiment of the present disclosure may be derived from the third exemplary structure by forming a plurality of top gate stacks (30, 35) over the active layer 20, such as two or more top gate stacks (30, 35). Two or more top gate stacks (30, 35) may be used as a NAND logic device or a NAND-type access transistor. In such an embodiment, the pattern of the photoresist layer using at the processing steps of FIGS. 17A-17C may be modified to form the plurality of top gate stacks (30, 35) in lieu of a single top gate stack (30, 35). Each top gate dielectric 30 may be a graded top gate dielectric 30G.

Referring to FIGS. 23A-23C, a sixth exemplary structure according to a sixth embodiment of the present disclosure may be derived from the fourth exemplary structure by forming a plurality of top gate stacks (30, 35) over the active layer 20, such as two or more top gate stacks (30, 35). In this embodiment, the pattern of the photoresist layer using at the processing steps of FIGS. 17A-17C may be modified to form the plurality of top gate stacks (30, 35) in lieu of a single top gate stack (30, 35). Each top gate dielectric 30 may be a homogeneous top gate dielectric 30H.

Referring to FIGS. 24A-24D, a seventh exemplary structure according to a seventh embodiment of the present disclosure may be derived from the first exemplary structure of FIGS. 5A-5D by inverting the vertical compositional profile of the continuous active layer 20L of the first exemplary structure. Thus, the continuous active layer 20L of the seventh exemplary structure may have the same vertical compositional profile as the active layer 20 illustrated in FIGS. 13A-13D. In other words, the seventh exemplary structure illustrated in FIGS. 24A-24D may be the same as the first exemplary structure illustrated in FIGS. 5A-5D except that the vertical compositional profile of the continuous active layer 20L of the seventh exemplary structure is the same as the vertical compositional profile of the active layer 20 of the third exemplary structure in FIGS. 13A-13D. The methods for forming the continuous active layer of the third exemplary structure may be used to form the continuous active layer 20L of the seventh exemplary structure.

Figure 25:
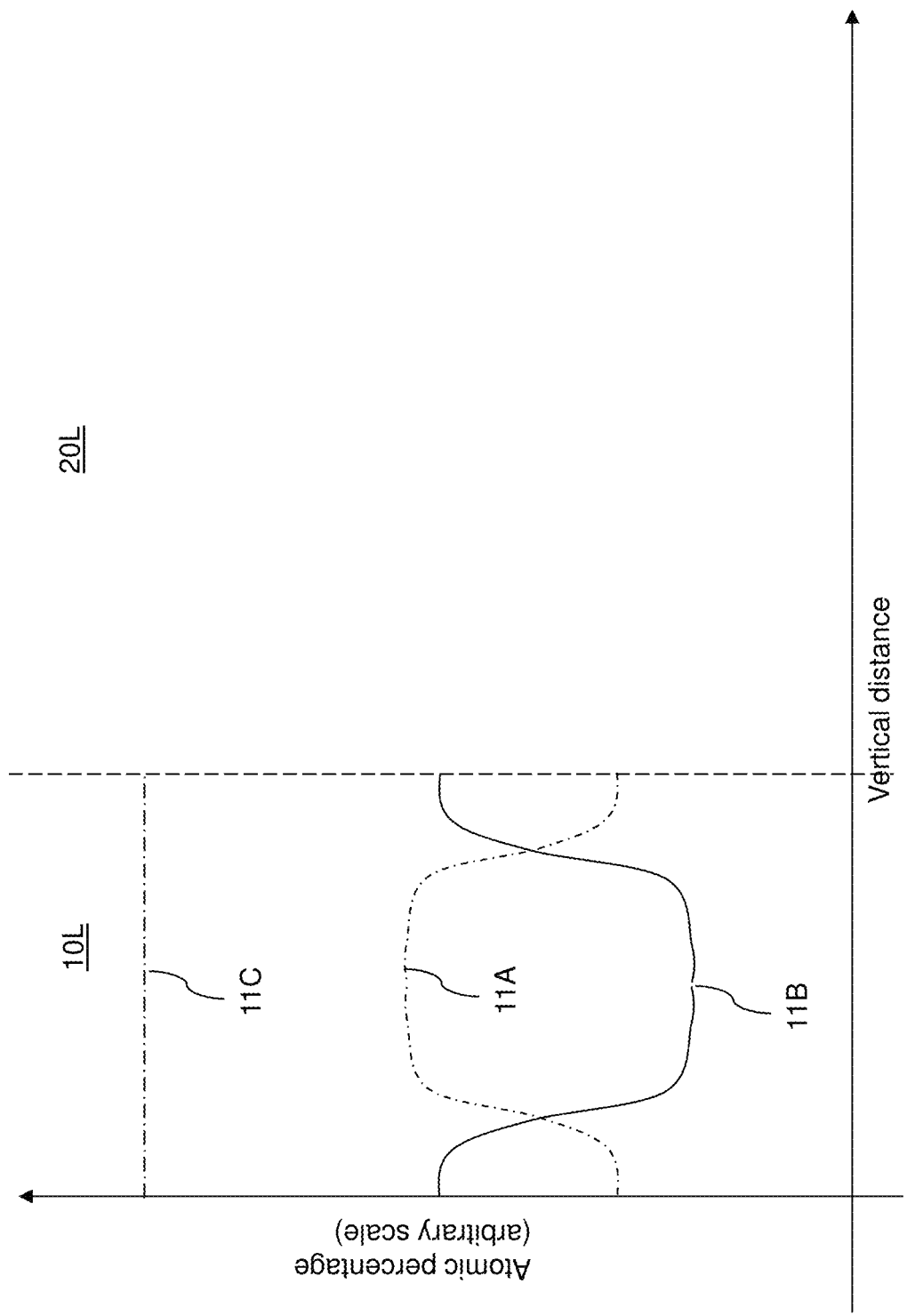
FIG. 25 is a vertical atomic percentage profile of the continuous bottom gate dielectric layer within the seventh exemplary structure of FIGS. 24A-24C according to the first embodiment of the present disclosure.

Referring to FIG. 25, a vertical compositional profile of various metallic elements within the bottom gate dielectric 10 is illustrated for an embodiment in which the bottom gate dielectric 10 includes a dielectric metal oxide material having a vertical compositional modulation. In this embodiment, the bottom gate dielectric may include a first metallic element, a second metallic element, and oxygen. Within the vertical compositional modulation of the bottom gate dielectric 10, an atomic percentage of the second metallic element (such as hafnium) has a minimum at a height that is vertically spaced from a bottom surface of the bottom gate dielectric 10 and from a top surface of the bottom gate dielectric 10 as illustrated by curve 11B. Within the vertical compositional modulation of the bottom gate dielectric 10, an atomic percentage of the first metallic element (such as zirconium, aluminum, silicon, or strontium) has a maximum at a height that is vertically spaced from a bottom surface of the bottom gate dielectric 10 and from a top surface of the bottom gate dielectric 10 as illustrated by curve 11A. The atomic percentage of oxygen remains constant as illustrated by curve 11C.

Referring to FIGS. 26A-26C, the processing steps of FIGS. 15A-15D may be performed to form a continuous top gate dielectric layer 30L and a continuous top gate electrode layer 35L. The continuous top gate dielectric layer 30L may have a graded composition as described above, or may have a homogeneous material composition throughout.

Referring to FIGS. 27A-27C, the processing steps of FIGS. 17A-17C may be performed to pattern the continuous top gate electrode layer 35L and the continuous top gate dielectric layer 30L into at least one top gate stack (30, 35), each including a respective top gate dielectric 30 and a top gate electrode 35.

Referring to FIGS. 28A-28C, the processing steps of FIGS. 18A-18C may be performed to form a dielectric layer 48 over the active layer 20 and around each top gate stack (30, 35). The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 29A-29C, the processing steps of FIGS. 10A-10C may be performed to form 19 a source cavity 51, a drain cavity 59, and a bottom gate contact via cavity 19. The anisotropic etch process may be selective to the materials of the active layer 20 and the bottom gate electrode 15.

Referring to FIGS. 30A-30C, the processing steps of FIGS. 11A-11C may be performed to form a source electrode 52, a drain electrode 56, and a backside electrode contact via structure 18.

Figure 31A:
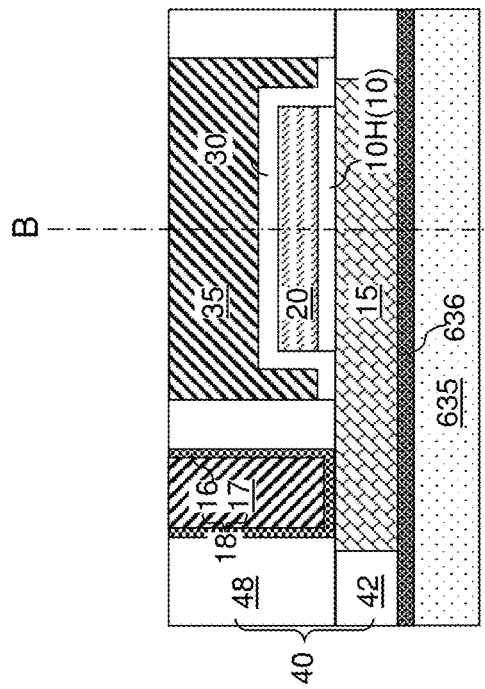
FIG. 31A is a top-down view of a region of an eighth exemplary structure according to an eighth embodiment of the present disclosure.
Figure 31B:
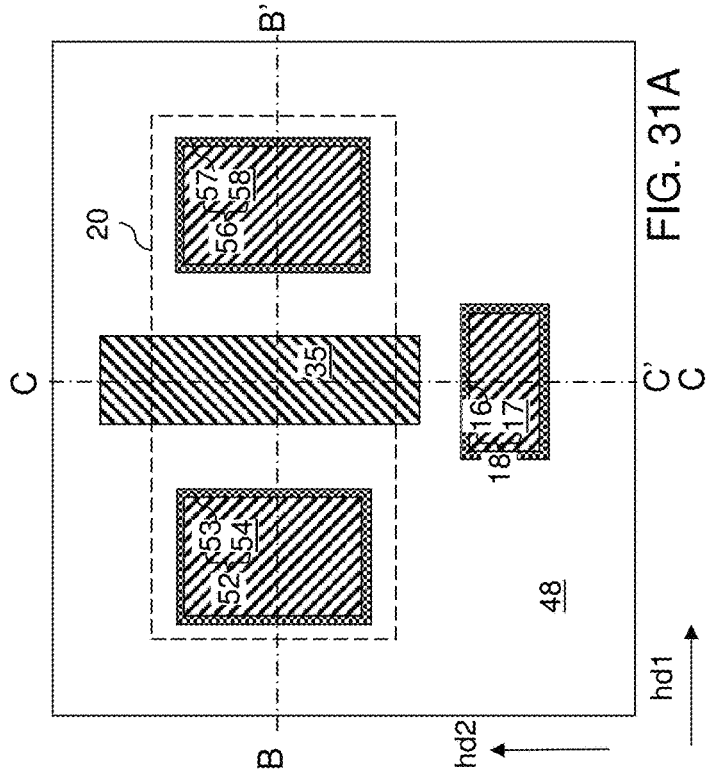
FIG. 31B is a vertical cross-sectional view of the eighth exemplary structure along the vertical plane B-B' of FIG. 31A.
Figure 31C:
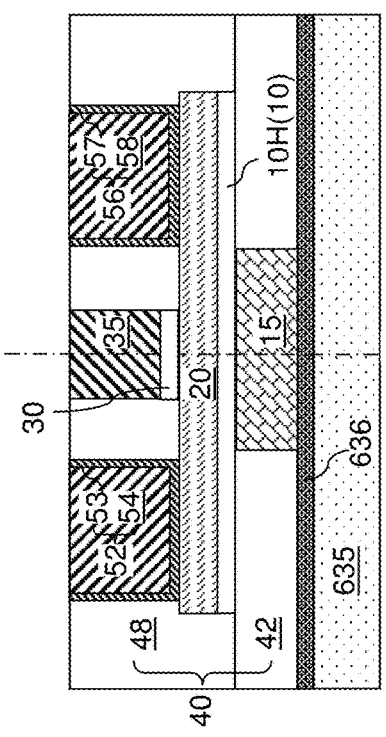
FIG. 31C is a vertical cross-sectional view of the eighth exemplary structure along the vertical plane C-C' of FIG. 31A.

Referring to FIGS. 31A-21C, an eighth exemplary structure according to an eighth embodiment of the present disclosure may be derived from the seventh exemplary structure by using a bottom gate dielectric 10 having a homogeneous material composition throughout. In this embodiment, the bottom gate dielectric 10 is herein referred to as a homogenous bottom gate dielectric 10H.

Figure 32:
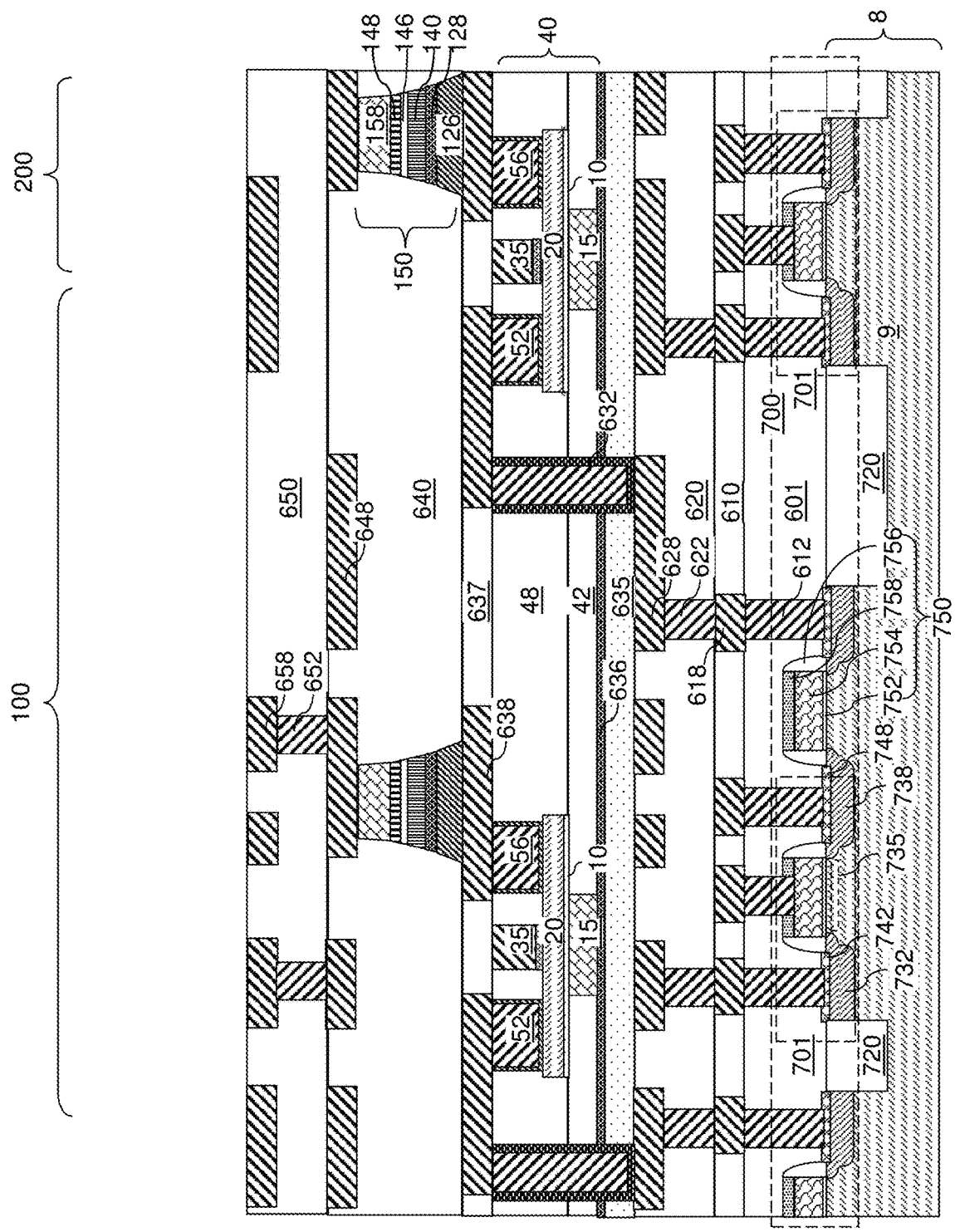
FIG. 32 is a vertical cross-sectional view of an exemplary structure after formation of memory cells according to an embodiment of the present disclosure.

Referring to FIG. 32, an exemplary structure is illustrated, which may be derived from any of the previously described exemplary structures by subsequently forming additional structures thereupon. In some embodiments, structures located underneath the bottom surface of the dielectric layer 48 may be replaced with a buffer layer 110. For example, second metal via structures 632 may be formed may be formed through the TFT-level dielectric layer 40 and the insulating material layer 635 on a respective one of the second metal line structures 628 concurrent with, before, or after, formation of the source electrodes 52, the drain electrodes 56, the optional top gate electrodes 35, and the backside electrode contact via structures 18.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (52, 56, 35, 18) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may include a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., the bottom electrode) and the second electrode 158 (i.e., the top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 may include a single crystalline silicon substrate. Lower-level dielectric layers (601, 610, 620) embedding lower-level metal interconnect structures (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes (15, 35), the source electrodes 52, and the drain electrodes 56.

Figure 33:
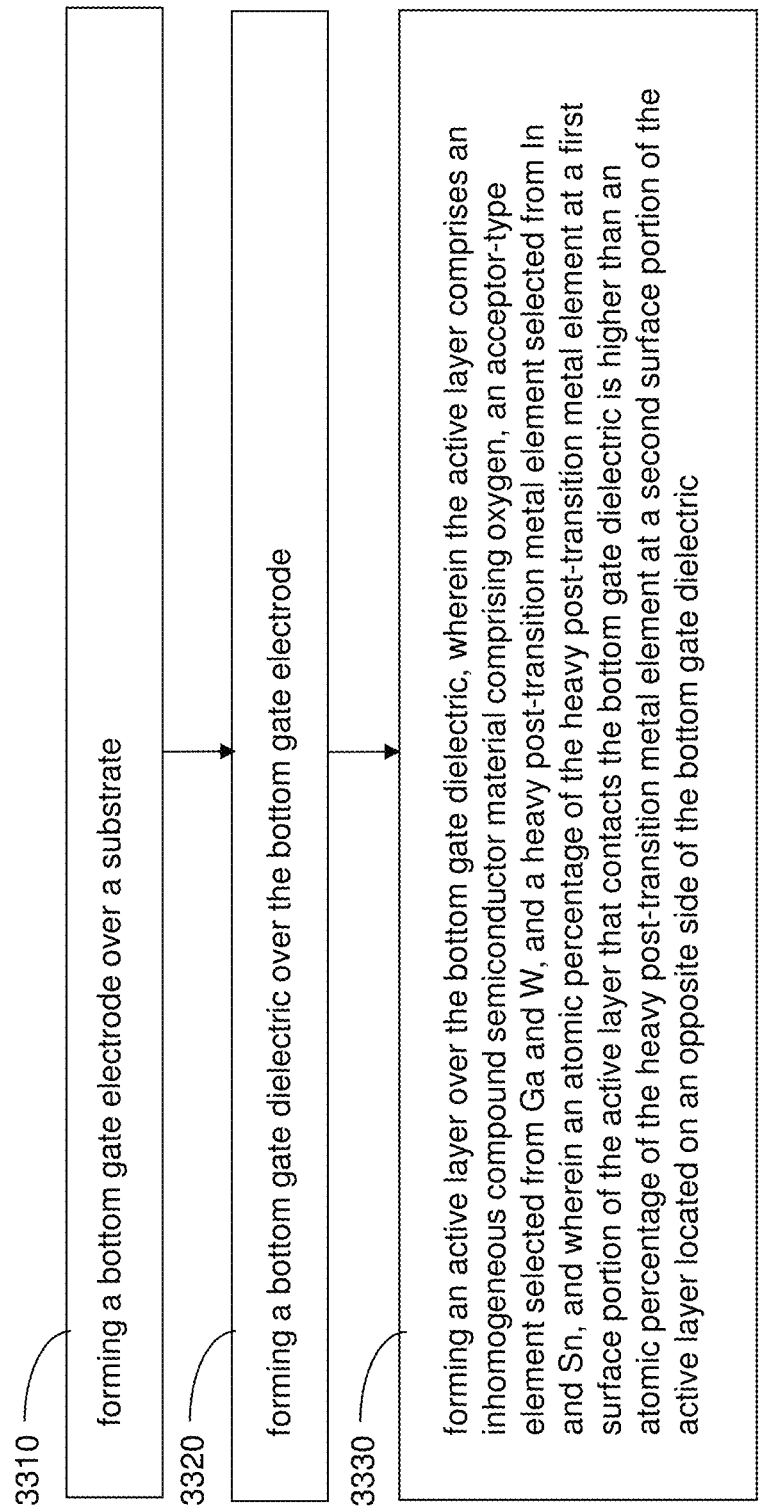
FIG. 33 is a first flowchart that illustrates the general processing steps for manufacturing the semiconductor device of the present disclosure.

Referring to FIG. 33, a first flowchart illustrates a first set of general processing steps for manufacturing the semiconductor device of the present disclosure, such as the first exemplary structure and the second exemplary structure.

Referring to step 3310, a bottom gate electrode 15 may be formed over a substrate 8. Referring to step 3320, a bottom gate dielectric 10 may be formed over the bottom gate electrode 15. Referring to step 3330, an active layer 20 may be formed over the bottom gate dielectric 10. The active layer 20 includes an inhomogeneous compound semiconductor material comprising oxygen, an acceptor-type element selected from Ga and W, and a heavy post-transition metal element selected from In and Sn. An atomic percentage of the at least one heavy post-transition metal element at a first surface portion (such as a front channel layer 20F) of the active layer 20 that contacts the bottom gate dielectric 10 is higher than an atomic percentage of the at least one heavy post-transition metal element at a second surface portion (such as a back channel layer 20B) of the active layer located on an opposite side of the bottom gate dielectric 10.

Figure 34:
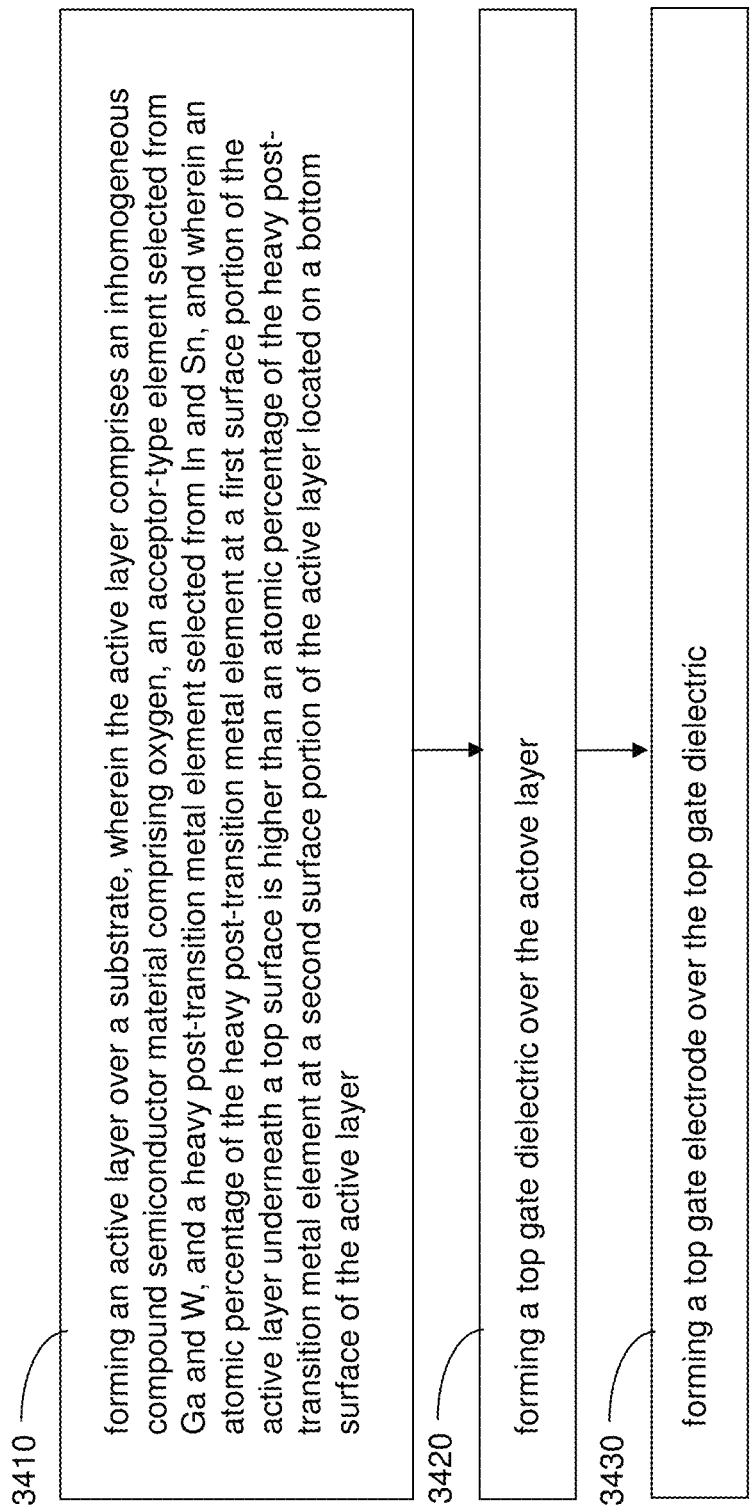
FIG. 34 is a second flowchart that illustrates the general processing steps for manufacturing the semiconductor device of the present disclosure.

Referring to FIG. 34, a second flowchart illustrates a second set of general processing steps for manufacturing the semiconductor device of the present disclosure, such as the third, fourth, fifth, sixth, seventh, and eighth exemplary structure.

Referring to step 3410, an active layer 20 is formed over a substrate 8. The active layer 20 includes an inhomogeneous compound semiconductor material comprising oxygen, an acceptor-type element selected from Ga and W, and a heavy post-transition metal element selected from In and Sn. An atomic percentage of the at least one heavy post-transition metal element at a first surface portion (such as a front channel layer 20F) of the active layer 20 underneath a top surface is higher than an atomic percentage of the at least one heavy post-transition metal element at a second surface portion (such as a back channel layer 20B) of the active layer 20 located on a bottom surface of the active layer 20. Referring to step 3420, a top gate dielectric 30 may be formed over the active layer 20. Referring to step 3430, a top gate electrode 35 may be formed over the top gate dielectric 30.

Figure 35:
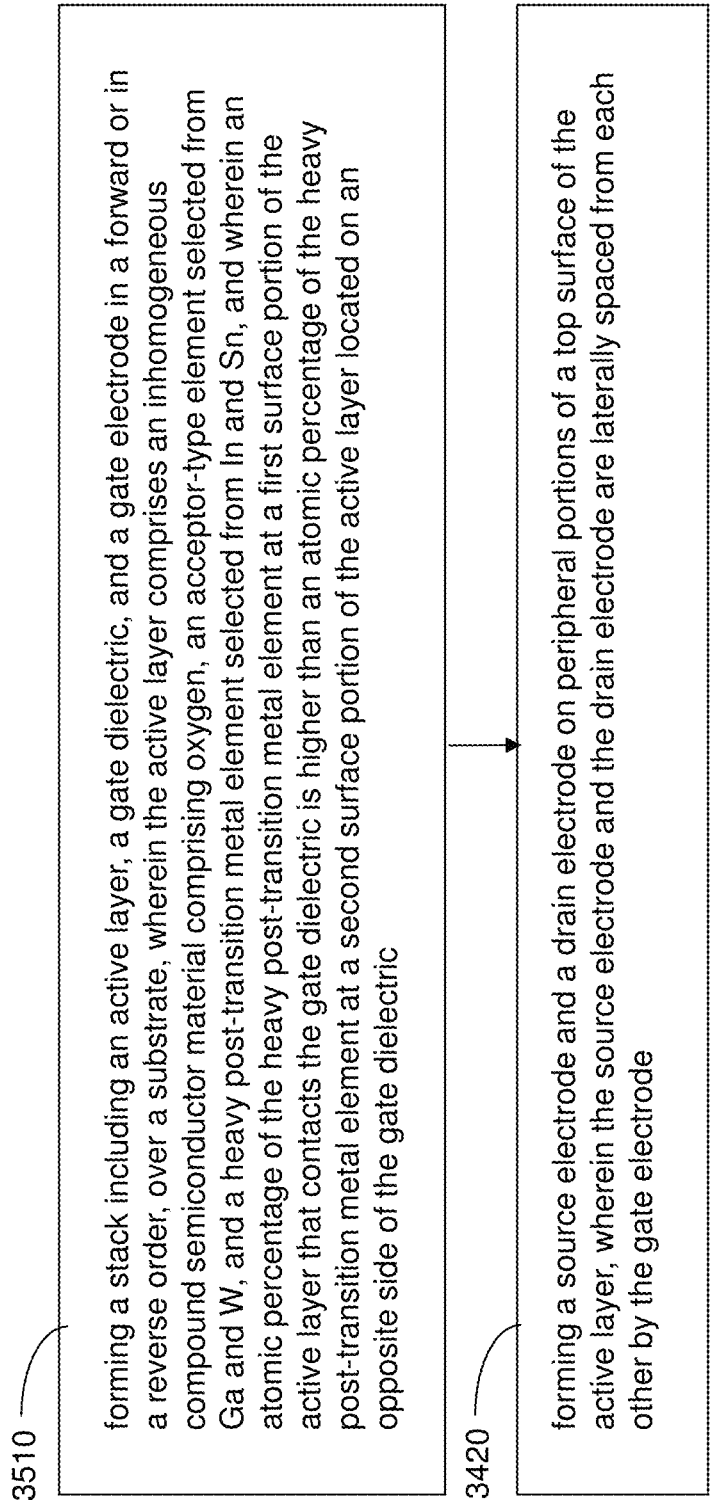
FIG. 35 is a third flowchart that illustrates the general processing steps for manufacturing the semiconductor device of the present disclosure.

Referring to FIG. 35, a third flowchart illustrates a third set of general processing steps for manufacturing the semiconductor device of the present disclosure.

Referring to step 3510, a stack including an active layer 20, a gate dielectric (10 or 30), and a gate electrode (15 or 35) may be formed in a forward or in a reverse order, over a substrate 8. The active layer 20 includes an inhomogeneous compound semiconductor material comprising oxygen, an acceptor-type element selected from Ga and W, and a heavy post-transition metal element selected from In and Sn. An atomic percentage of the at least one heavy post-transition metal element at a first surface portion (such as a front channel layer 20F) of the active layer 20 that contacts the gate dielectric (10 or 30) is higher than an atomic percentage of the at least one heavy post-transition metal element at a second surface portion (such as a back channel layer 20B) of the active layer 20 located on an opposite side of the gate dielectric (10 or 30). Referring to step 3420, a source electrode 52 and a drain electrode 56 may be formed on peripheral portions of a top surface of the active layer 20. The source electrode 52 and the drain electrode 56 are laterally spaced from each other by the gate electrode (15 or 35).

Referring to all drawings and according to various embodiments of the present disclosure, a thin film transistor is provided, which may include: an active layer 20 located over a substrate 8 and including an inhomogeneous compound semiconductor material that may include oxygen, an acceptor-type element selected from Ga and W, and a heavy post-transition metal element selected from In and Sn, wherein an atomic percentage of the at least one heavy post-transition metal element at a top surface of the active layer 20 is higher than an atomic percentage of the at least one heavy post-transition metal element at a bottom surface of the active layer 20 (as in the embodiment of the third, fourth, fifth, sixth, seventh, and eighth exemplary structures); and a top gate stack (30, 35) comprising a top gate dielectric 30 straddling the active layer 20 and a top gate electrode 35 located on a top surface of the top gate dielectric 30.

In one embodiment, an atomic percentage of the at least one acceptor-type element at the top surface of the active layer 20 is lower than an atomic percentage of the at least one acceptor-type element at the bottom surface of the active layer 20.

In one embodiment, the inhomogeneous compound semiconductor material includes zinc; and an atomic percentage of zinc at the top surface of the active layer 20 is lower than an atomic percentage of zinc at the bottom surface of the active layer 20.

In one embodiment, the atomic percentage of the at least one heavy post-transition metal element at the top surface of the active layer 20 is greater than 25%; and the atomic percentage of the at least one heavy post-transition metal element at the bottom surface of the active layer 20 is less than 25%.

In one embodiment, the inhomogeneous compound semiconductor includes a vertically compositionally graded semiconductor region having a variable atomic percentage for the at least one heavy post-transition metal element that decreases with a vertical distance from the substrate 8.

In one embodiment, the thin film transistor includes: a source electrode 52 contacting a top surface of a first portion of the active layer 20; and a drain electrode 56 contacting a top surface of a second portion of the active layer 20 and laterally spaced from the source electrode 52 by the top gate electrode 35.

In one embodiment, the thin film transistor includes an additional top gate stack (30, 35) (as in the embodiment of the fifth and sixth exemplary structures) located between the source electrode 52 and the drain electrode 56 and comprising an additional top gate dielectric 30 straddling the active layer 20 and an additional top gate electrode 35 located on a top surface of the additional top gate dielectric 30.

In one embodiment, the thin film transistor includes a buffer layer 110 located between the substrate 8 and the active layer 20 and comprising a semiconductor material having a higher electrical resistivity than any portion of the active layer 20, wherein the active layer 20 is located on a top surface of the buffer layer 110 (as in the embodiment of the third, fourth, fifth, and sixth exemplary structures).

In one embodiment, the top gate dielectric 30 includes a dielectric metal oxide material including a first metallic element, a second metallic element, and oxygen; and the top gate dielectric 30 has a vertical compositional modulation in which an atomic percentage of the second metallic element has a minimum at a height that is vertically spaced from a bottom surface of the top gate dielectric 30 and from a top surface of the top gate dielectric 30.

In one embodiment, the thin film transistor includes: a bottom gate dielectric 10 contacting a bottom surface of the active layer 20; and a bottom gate electrode 15 underlying the bottom gate dielectric 10 and laterally surrounded by an insulating layer 42 located between the substrate 8 and the active layer 20 (as in the embodiment of the seventh and eighth exemplary structures).

According to an aspect of the present disclosure, a thin film transistor is provided, which includes: a bottom gate electrode 15 embedded within an insulating layer 42 and overlying a substrate 8; a bottom gate dielectric 10 overlying the bottom gate electrode 15; and an active layer 20 located over the bottom gate dielectric 10 and including an inhomogeneous compound semiconductor material comprising oxygen, an acceptor-type element selected from Ga and W, and a heavy post-transition metal element selected from In and Sn, wherein an atomic percentage of the at least one heavy post-transition metal element at a bottom surface of the active layer 20 is higher than an atomic percentage of the at least one heavy post-transition metal element at a top surface of the active layer 20 (as in the first and second exemplary structures).

In one embodiment, an atomic percentage of the at least one acceptor-type element at the bottom surface of the active layer 20 is lower than an atomic percentage of the at least one acceptor-type element at the top surface of the active layer 20.

In one embodiment, the inhomogeneous compound semiconductor material includes zinc; and an atomic percentage of zinc at the bottom surface of the active layer 20 is lower than an atomic percentage of zinc at the top surface of the active layer 20.

In one embodiment, the atomic percentage of the at least one heavy post-transition metal element at the bottom surface of the active layer 20 is greater than 25%; and the atomic percentage of the at least one heavy post-transition metal element at the top surface of the active layer 20 is less than 25%.

In one embodiment, the bottom gate dielectric 10 includes a dielectric metal oxide material including a first metallic element, a second metallic element, and oxygen; and the bottom gate dielectric has a vertical compositional modulation in which an atomic percentage of the second metallic element has a minimum at a height that is vertically spaced from a bottom surface of the bottom gate dielectric 10 and from a top surface of the bottom gate dielectric 10.

The various embodiments of the present disclosure may be advantageously used to provide a field effect transistor that includes a front channel layer 20F having a higher atomic concentration of a heavy post-transition metal element and a lower atomic concentration of an acceptor-type element than the bulk semiconductor layer 20K and/or the back channel layer 20B, and thus, providing higher charge carrier concentration and higher electrical conductivity than the bulk semiconductor layer 20K and/or the back channel layer 20B. Further, the back channel layer 20B may have a lower atomic concentration of a heavy post-transition metal element and a higher atomic concentration of an acceptor-type element than the bulk semiconductor layer 20K and/or the back channel layer 20B, and thus, providing lower charge carrier concentration and lower electrical conductivity than the bulk semiconductor layer 20K and/or the back channel layer 20B. A higher on-current and a lower off-current may be provided by the field effect transistor of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
an active layer located over a substrate and including a compound semiconductor material comprising oxygen, at least one acceptor-type element, and at least one heavy post-transition metal element, wherein each of the at least one acceptor-type element is selected from a group consisting of gallium (Ga) and tungsten (W), wherein each of the at least one heavy post-transition metal element is selected from a group consisting of indium (In) and tin (Sn), and wherein an atomic percentage of the at least one heavy post-transition metal element at a top surface of the active layer is higher than an atomic percentage of the at least one heavy post-transition metal element at a bottom surface of the active layer; and
a top gate stack comprising a top gate dielectric straddling the active layer and a top gate electrode located on a top surface of the top gate dielectric,
wherein the active layer comprises a vertical stack of a front channel layer in contact with the top gate dielectric, a back channel layer comprising a bottom surface of the active layer, and a bulk semiconductor layer located between the front channel layer and the back channel layer;
wherein one of the front channel layer, the back channel layer, and the bulk semiconductor layer comprises an inhomogeneous compound semiconductor material having a vertical composition gradient such that an atomic concentration of the at least one acceptor-type element decreases continuously throughout said one of the front channel layer, the back channel layer, and the bulk semiconductor layer with a vertical distance from the substrate, and an atomic concentration of the at least one heavy post-transition metal element increases continuously throughout said one of the front channel layer, the back channel layer, and the bulk semiconductor layer with the vertical distance from the substrate; and
wherein another of the front channel layer, the back channel layer, and the bulk semiconductor layer comprises a homogeneous compound semiconductor material having a uniform material composition throughout.

2. The transistor of claim 1, wherein an atomic percentage of the at least one acceptor-type element at the top surface of the active layer is lower than an atomic percentage of the at least one acceptor-type element at the bottom surface of the active layer.

3. The transistor of claim 2, wherein:
the compound semiconductor material comprises zinc; and
an atomic percentage of zinc at the top surface of the active layer is lower than an atomic percentage of zinc at the bottom surface of the active layer.

4. The transistor of claim 1, wherein the compound semiconductor material comprises a vertically compositionally graded semiconductor region having a variable atomic percentage for the at least one heavy post-transition metal element that increases with a vertical distance from the substrate, wherein the vertically compositionally graded semiconductor region comprises said one of the front channel layer, the back channel layer, and the bulk semiconductor layer.

5. The transistor of claim 1, further comprising:
a source electrode contacting a top surface of a first portion of the active layer; and
a drain electrode contacting a top surface of a second portion of the active layer and laterally spaced from the source electrode by the top gate electrode.

6. The transistor of claim 5, further comprising an additional top gate stack located between the source electrode and the drain electrode and comprising an additional top gate dielectric straddling the active layer and an additional top gate electrode located on a top surface of the additional top gate dielectric.

7. The transistor of claim 1, further comprising a buffer layer located between the substrate and the active layer and comprising a semiconductor material having a higher electrical resistivity than any portion of the active layer, wherein the active layer is located on a top surface of the buffer layer.

8. The transistor of claim 1, wherein:
the top gate dielectric comprises a dielectric metal oxide material including a first metallic element, a second metallic element, and oxygen; and
the top gate dielectric has a vertical compositional modulation in which an atomic percentage of the second metallic element has a minimum in a region that is vertically spaced from a bottom surface of the top gate dielectric and from a top surface of the top gate dielectric.

9. The transistor of claim 1, further comprising:
a bottom gate dielectric contacting a bottom surface of the active layer; and
a bottom gate electrode underlying the bottom gate dielectric and laterally surrounded by an insulating layer located between the substrate and the active layer.

10. A semiconductor structure comprising a thin film transistor overlying a substrate, wherein the thin film transistor comprises:
an active layer including a compound semiconductor material comprising oxygen, at least one acceptor-type element, and at least one heavy post-transition metal element, wherein each of the at least one acceptor-type element is selected from a group consisting of gallium (Ga) and tungsten (W), wherein each of the at least one heavy post-transition metal element is selected from a group consisting of indium (In) and tin (Sn), and wherein an atomic percentage of the at least one heavy post-transition metal element at a top surface of the active layer is higher than an atomic percentage of the at least one heavy post-transition metal element at a bottom surface of the active layer; and
a top gate stack comprising a top gate dielectric straddling the active layer and a top gate electrode located on a top surface of the top gate dielectric,
wherein the active layer comprises a vertical stack of a front channel layer in contact with the top gate dielectric, a back channel layer comprising a bottom surface of the active layer, and a bulk semiconductor layer located between the front channel layer and the back channel layer;
wherein one of the front channel layer, the back channel layer, and the bulk semiconductor layer comprises an inhomogeneous compound semiconductor material having a vertical composition gradient such that an atomic concentration of the at least one acceptor-type element decreases continuously throughout said one of the front channel layer, the back channel layer, and the bulk semiconductor layer with a vertical distance from the substrate, and an atomic concentration of the at least one heavy post-transition metal element increases continuously throughout said one of the front channel layer, the back channel layer, and the bulk semiconductor layer with the vertical distance from the substrate; and
wherein another of the front channel layer, the back channel layer, and the bulk semiconductor layer comprises a homogeneous compound semiconductor material having a uniform material composition throughout.

11. The semiconductor structure of claim 10, wherein:
the substrate comprises a semiconductor material layer;
a field effect transistor comprising a portion of the semiconductor material layer as a semiconductor channel is located on the substrate; and
lower-level dielectric layers embedding lower-level metal interconnect structures are located between the field effect transistor and the thin film transistor.

12. The semiconductor structure of claim 10, wherein an atomic percentage of the at least one acceptor-type element at the top surface of the active layer is lower than an atomic percentage of the at least one acceptor-type element at the bottom surface of the active layer.

13. The semiconductor structure of claim 12, wherein:
the compound semiconductor material comprises zinc; and
an atomic percentage of zinc at the top surface of the active layer is lower than an atomic percentage of zinc at the bottom surface of the active layer.

14. The semiconductor structure of claim 10, wherein:
the atomic percentage of the at least one heavy post-transition metal element at the top surface of the active layer is greater than 25%; and
the atomic percentage of the at least one heavy post-transition metal element at the bottom surface of the active layer is less than 25%.

15. The semiconductor structure of claim 10, further comprising:
a source electrode contacting a top surface of a first portion of the active layer; and
a drain electrode contacting a top surface of a second portion of the active layer and laterally spaced from the source electrode by the top gate electrode.

16. The semiconductor structure of claim 15, further comprising an additional top gate stack located between the source electrode and the drain electrode and comprising an additional top gate dielectric straddling the active layer and an additional top gate electrode located on a top surface of the additional top gate dielectric.

17. The semiconductor structure of claim 10, wherein:
the top gate dielectric comprises a dielectric metal oxide material including a first metallic element, a second metallic element, and oxygen; and
the top gate dielectric has a vertical compositional modulation in which an atomic percentage of the second metallic element has a minimum in a region that is vertically spaced from a bottom surface of the top gate dielectric and from a top surface of the top gate dielectric.

18. A transistor comprising:
an active layer located over a substrate and including a compound semiconductor material comprising oxygen, at least one acceptor-type element, and at least one heavy post-transition metal element, wherein each of the at least one acceptor-type element is selected from a group consisting of gallium (Ga) and tungsten (W), wherein each of the at least one heavy post-transition metal element is selected from a group consisting of indium (In) and tin (Sn); and
a gate stack comprising a gate dielectric and a gate electrode, wherein the gate dielectric contacts a middle portion of a first horizontal surface of the active layer, and the active layer comprises a second horizontal surface located at an opposite side of the first horizontal surface, and wherein an atomic percentage of the at least one heavy post-transition metal element at the first horizontal surface of the active layer is higher than an atomic percentage of the at least one heavy post-transition metal element at the second horizontal surface of the active layer,
wherein the active layer comprises a vertical stack of a front channel layer in contact with the top gate dielectric, a back channel layer comprising a bottom surface of the active layer, and a bulk semiconductor layer located between the front channel layer and the back channel layer;
wherein one of the front channel layer, the back channel layer, and the bulk semiconductor layer comprises an inhomogeneous compound semiconductor material having a vertical composition gradient such that an atomic concentration of the at least one acceptor-type element decreases continuously throughout said one of the front channel layer, the back channel layer, and the bulk semiconductor layer with a vertical distance from the substrate, and an atomic concentration of the at least one heavy post-transition metal element increases continuously throughout said one of the front channel layer, the back channel layer, and the bulk semiconductor layer with the vertical distance from the substrate; and wherein another of the front channel layer, the back channel layer, and the bulk semiconductor layer comprises a homogeneous compound semiconductor material having a uniform material composition throughout.

19. The transistor of claim 18, wherein
a yet additional one of the front channel layer, the back channel layer, and the bulk semiconductor layer comprises an additional inhomogeneous compound semiconductor material having an additional vertical composition gradient such that another atomic concentration of the at least one acceptor-type element decreases continuously throughout said yet additional one of the front channel layer, the back channel layer, and the bulk semiconductor layer with the vertical distance from the substrate, and another atomic concentration of the at least one heavy post-transition metal element increases continuously throughout said yet additional one of the front channel layer, the back channel layer, and the bulk semiconductor layer with the vertical distance from the substrate.

20. The transistor of claim 1, wherein:
the compound semiconductor material comprises zinc; and
an atomic concentration of zinc decreases continuously throughout said one of the front channel layer, the back channel layer, and the bulk semiconductor layer with the vertical distance from the substrate.

* * * * *